(12) United States Patent
Yamazaki et al.

(10) Patent No.: US 11,545,578 B2
(45) Date of Patent: Jan. 3, 2023

(54) SEMICONDUCTOR DEVICE AND METHOD FOR MANUFACTURING SEMICONDUCTOR DEVICE

(71) Applicant: Semiconductor Energy Laboratory Co., Ltd., Atsugi (JP)

(72) Inventors: Shunpei Yamazaki, Setagaya (JP); Yasumasa Yamane, Atsugi (JP); Takashi Hirose, Yokohama (JP); Teruyuki Fujii, Atsugi (JP); Hajime Kimura, Atsugi (JP); Daigo Shimada, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 86 days.

(21) Appl. No.: 17/047,710

(22) PCT Filed: Apr. 18, 2019

(86) PCT No.: PCT/IB2019/053205
§ 371 (c)(1),
(2) Date: Oct. 15, 2020

(87) PCT Pub. No.: WO2019/207429
PCT Pub. Date: Oct. 31, 2019

(65) Prior Publication Data
US 2021/0167211 A1    Jun. 3, 2021

(30) Foreign Application Priority Data

Apr. 27, 2018 (JP) .............................. JP2018-086719
Apr. 27, 2018 (JP) .............................. JP2018-086722
(Continued)

(51) Int. Cl.
*H01L 27/00* (2006.01)
*H01L 29/00* (2006.01)
(Continued)

(52) U.S. Cl.
CPC .......... *H01L 29/7869* (2013.01); *H01L 29/24* (2013.01); *H01L 29/517* (2013.01)

(58) Field of Classification Search
CPC ... H01L 29/7869; H01L 29/24; H01L 29/517; H01L 29/66969; H01L 29/788;
(Continued)

(56) References Cited

U.S. PATENT DOCUMENTS 6,333,229 B1   12/2001   Furukawa et al.
6,673,683 B1   1/2004    Sheu et al.
(Continued)

FOREIGN PATENT DOCUMENTS

CN    107507841 A    12/2017
JP    2014-112659 A   6/2014
(Continued)

OTHER PUBLICATIONS

International Search Report (Application No. PCT/IB2019/053205) dated Aug. 13, 2019.
(Continued)

*Primary Examiner* — Nikolay K Yushin
(74) *Attorney, Agent, or Firm* — Robinson Intellectual Property Law Office; Eric J. Robinson

(57) ABSTRACT

A semiconductor device with high reliability is provided. The semiconductor device includes a first insulator, a second insulator, and a transistor; the transistor includes an oxide in a channel formation region; the oxide is surrounded by the first insulator; and the first insulator is surrounded by the second insulator. The first insulator includes a region with a lower hydrogen concentration than the second insulator. Alternatively, the first insulator includes a region with a lower hydrogen concentration than the second insulator and with a lower nitrogen concentration than the second insulator.

17 Claims, 35 Drawing Sheets

(30) Foreign Application Priority Data

Aug. 6, 2018 (JP) .............................. JP2018-147766
Aug. 9, 2018 (JP) .............................. JP2018-150514

(51) Int. Cl.
| | | |
|---|---|---|
| H01L 29/786 | (2006.01) | |
| H01L 29/24 | (2006.01) | |
| H01L 29/51 | (2006.01) | |
| H01L 21/00 | (2006.01) | |

(58) Field of Classification Search
CPC ............. H01L 29/78696; H01L 29/792; H01L 29/78648; H01L 27/108; H01L 27/06; H01L 27/088; H01L 27/1156; H01L 27/1225; H01L 21/8234; H01L 21/3065; H01L 21/477; H01L 21/40; H01L 21/02565

See application file for complete search history.

(56) References Cited

U.S. PATENT DOCUMENTS

| | | | |
|---|---|---|---|
| 6,841,831 | B2 | 1/2005 | Hanafi et al. |
| 6,958,500 | B2 | 10/2005 | Saito |
| 8,547,771 | B2 | 10/2013 | Koyama |
| 8,809,854 | B2 | 8/2014 | Isobe et al. |
| 9,318,618 | B2 * | 4/2016 | Endo ................. H01L 29/78696 |
| 9,768,318 | B2 | 9/2017 | Yamazaki et al. |
| 9,865,743 | B2 | 1/2018 | Yamazaki |
| 9,933,806 | B2 | 4/2018 | Onoya |
| 10,147,681 | B2 | 12/2018 | Yamazaki et al. |
| 10,181,531 | B2 | 1/2019 | Sasagawa et al. |
| 10,748,938 | B2 | 8/2020 | Zhou et al. |
| 2012/0223304 | A1 | 9/2012 | Yoneda |
| 2013/0334533 | A1 | 12/2013 | Yamazaki |
| 2014/0110703 | A1 | 4/2014 | Yamazaki |
| 2015/0187951 | A1 * | 7/2015 | Endo ................. H01L 29/78696 257/43 |
| 2016/0284859 | A1 | 9/2016 | Asami |
| 2017/0062192 | A1 | 3/2017 | Oota et al. |
| 2017/0110453 | A1 | 4/2017 | Ikeda |
| 2017/0235325 | A1 | 8/2017 | Onoya |
| 2019/0096920 | A1 | 3/2019 | Zhou et al. |
| 2020/0357923 | A1 | 11/2020 | Yamazaki et al. |
| 2020/0373430 | A1 | 11/2020 | Shima et al. |

FOREIGN PATENT DOCUMENTS

| | | |
|---|---|---|
| JP | 2017-120904 A | 7/2017 |
| JP | 2017-146968 A | 8/2017 |
| KR | 2015-0073966 A | 7/2015 |
| KR | 2017-0095128 A | 8/2017 |
| TW | 201431075 | 8/2014 |
| TW | 201802632 | 1/2018 |
| WO | WO-2014/065301 | 5/2014 |

OTHER PUBLICATIONS

Written Opinion (Application No. PCT/IB2019/053205) dated Aug. 13, 2019.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.

Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.

Yamazaki.S et al., "In—Ga—Zn-Oxide Semiconductor and Its Transistor Characteristics", ECS Journal of Solid State Science and Technology, Jul. 1, 2014, vol. 3, No. 9, pp. Q3012-Q3022.

Yamazaki.S, "Crystalline Oxide Semiconductor Using CAAC-IGZO and its Application", ECS Transactions, Oct. 1, 2014, vol. 64, No. 10, pp. 155-164, The Electrochemical Society.

Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics) , 2012, vol. 51, pp. 021201-1-021201-7.

Matsuda.S et al., "30-nm-Channel-Length C-Axis Aligned Crystalline In—Ga—Zn—O Transistors with Low Off-State Leakage Current and Steep Subthreshold Characteristics", 2015 Symposium on VLSI Technology : Digest of Technical Papers, 2015, pp. T216-T217.

Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.

* cited by examiner

FIG. 4A
FIG. 4C
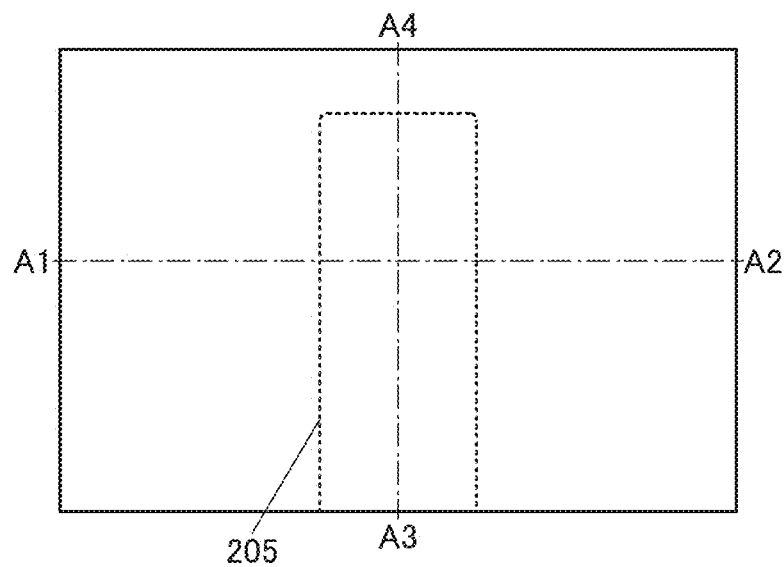
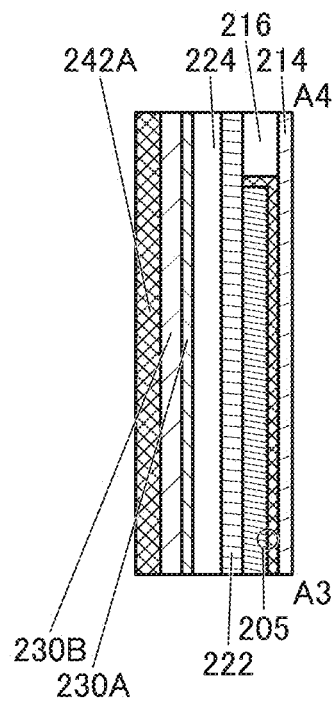
FIG. 4B
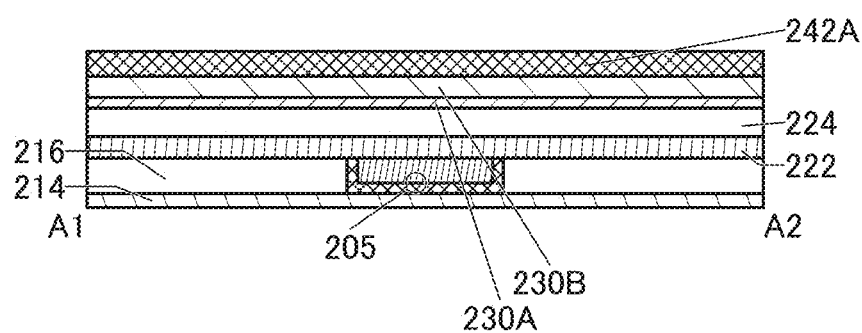

FIG. 12A
FIG. 12C
FIG. 12B
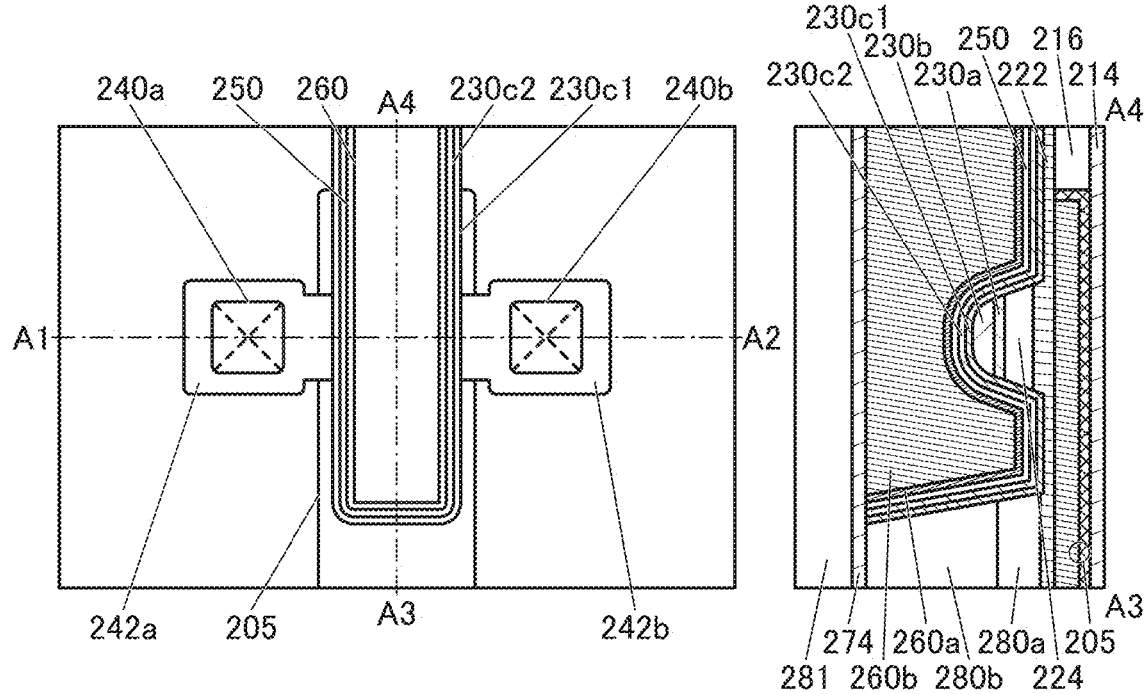
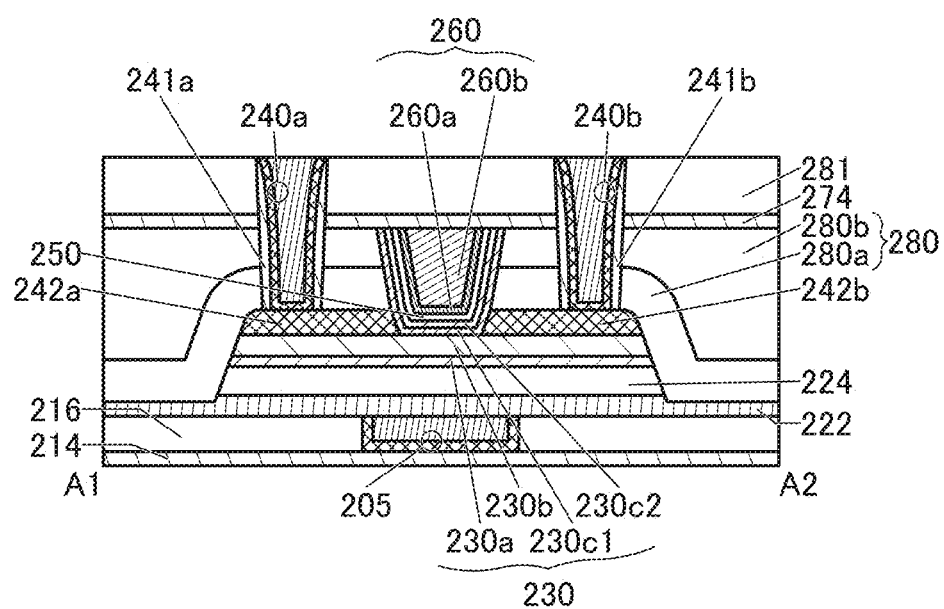

1471

1472

1473

1474

1475

1476

1477

1478

230a,230b 230a,230b 230a,230b 230a,230b 230a,230b   290

290   230a,230b 230a,230b   290

290   230a,230b

SEMICONDUCTOR DEVICE AND METHOD FOR MANUFACTURING SEMICONDUCTOR DEVICE

TECHNICAL FIELD

One embodiment of the present invention relates to a semiconductor device and a method for manufacturing the semiconductor device. Another embodiment of the present invention relates to a semiconductor wafer, a module, and an electronic device.

Note that in this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. It can be sometimes said that a display device (a liquid crystal display device, a light-emitting display device, and the like), a projection device, a lighting device, an electro-optical device, a power storage device, a memory device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. Another embodiment of the present invention relates to a process, a machine, manufacture, or a composition of matter.

BACKGROUND ART

A silicon-based semiconductor material is widely known as a semiconductor thin film that can be used in a transistor, and as another material, an oxide semiconductor has attracted attention. As the oxide semiconductor, not only single-component metal oxides, such as indium oxide and zinc oxide, but also multi-component metal oxides are known, for example. Among the multi-component metal oxides, in particular, an In—Ga—Zn oxide (hereinafter, also referred to as IGZO) has been actively studied.

From the studies on IGZO, a CAAC (c-axis aligned crystalline) structure and an nc (nanocrystalline) structure, which are neither single crystal nor amorphous, have been found in an oxide semiconductor (see Non-Patent Document 1 to Non-Patent Document 3). In Non-Patent Document 1 and Non-Patent Document 2, a technique for manufacturing a transistor using an oxide semiconductor having a CAAC structure is also disclosed. Moreover, Non-Patent Document 4 and Non-Patent Document 5 show that a fine crystal is included even in an oxide semiconductor that has lower crystallinity than an oxide semiconductor having the CAAC structure or the nc structure.

In addition, a transistor that uses IGZO for an active layer has an extremely low off-state current (see Non-Patent Document 6), and an LSI and a display utilizing the characteristics have been reported (see Non-Patent Document 7 and Non-Patent Document 8).

REFERENCES

Non-Patent Documents

[Non-Patent Document 1] S. Yamazaki et al., "SID Symposium Digest of Technical Papers", 2012, volume 43, issue 1, pp. 183-186.

[Non-Patent Document 2] S. Yamazaki et al., "Japanese Journal of Applied Physics", 2014, volume 53, Number 4S, pp. 04ED18-1-04ED18-10.

[Non-Patent Document 3] S. Ito et al., "The Proceedings of AM-FPD'13 Digest of Technical Papers", 2013, pp. 151-154.

[Non-Patent Document 4] S. Yamazaki et al., "ECS Journal of Solid State Science and Technology", 2014, volume 3, issue 9, pp. Q3012-Q3022.

[Non-Patent Document 5] S. Yamazaki, "ECS Transactions", 2014, volume 64, issue 10, pp. 155-164.

[Non-Patent Document 6] K. Kato et al., "Japanese Journal of Applied Physics", 2012, volume 51, pp. 021201-1-021201-7.

[Non-Patent Document 7] S. Matsuda et al., "2015 Symposium on VLSI Technology Digest of Technical Papers", 2015, pp. T216-T217.

[Non-Patent Document 8] S. Amano et al., "SID Symposium Digest of Technical Papers", 2010, volume 41, issue 1, pp. 626-629.

SUMMARY OF THE INVENTION

Problems to be Solved by the Invention

An object of one embodiment of the present invention is to provide a semiconductor device having a high on-state current. Alternatively, an object of one embodiment of the present invention is to provide a semiconductor device having excellent frequency characteristics. Alternatively, an object of one embodiment of the present invention is to provide a semiconductor device having high reliability. Alternatively, an object of one embodiment of the present invention is to provide a semiconductor device that can be miniaturized or highly integrated. Alternatively, an object of one embodiment of the present invention is to provide a semiconductor device having excellent electrical characteristics. Alternatively, an object of one embodiment of the present invention is to provide a semiconductor device having high productivity.

An object of one embodiment of the present invention is to provide a semiconductor device capable of retaining data for a long time. An object of one embodiment of the present invention is to provide a semiconductor device capable of high-speed data writing. An object of one embodiment of the present invention is to provide a semiconductor device having high design flexibility. An object of one embodiment of the present invention is to provide a semiconductor device in which power consumption can be reduced. An object of one embodiment of the present invention is to provide a novel semiconductor device.

Note that the description of these objects does not preclude the existence of other objects. Note that one embodiment of the present invention does not necessarily achieve all of these objects. Other objects will be apparent from the description of the specification, the drawings, the claims, and the like, and other objects can be derived from the description of the specification, the drawings, the claims, and the like.

Means for Solving the Problems

One embodiment of the present invention is a semiconductor device including a first insulator, a second insulator, and a transistor; the transistor includes an oxide in a channel formation region; the oxide is surrounded by the first insulator; the first insulator is surrounded by the second insulator; and the first insulator includes a region with a lower hydrogen concentration than the second insulator.

Another embodiment of the present invention is a semiconductor device including a first insulator, a second insulator, and a transistor; the transistor includes an oxide in a channel formation region; the oxide is surrounded by the first insulator; the first insulator is surrounded by the second insulator; the first insulator includes a region whose hydrogen concentration is lower than $1.0 \times 10^{20}$ atoms/cm$^3$; and the second insulator includes a region whose hydrogen concentration is lower than $5.0 \times 10^{20}$ atoms/cm$^3$.

Another embodiment of the present invention is a semiconductor device including a first insulator, a second insulator, and a transistor; the transistor includes an oxide in a channel formation region; the oxide is surrounded by the first insulator; the first insulator is surrounded by the second insulator; and the first insulator includes a region with a lower hydrogen concentration than the second insulator and with a lower nitrogen concentration than the second insulator.

In the above semiconductor device, the amount of oxygen that is released from the first insulator by heating and is converted into oxygen molecules is preferably greater than or equal to $2.0 \times 10^{14}$ molecules/cm$^2$.

In the above semiconductor device, it is preferable that the first insulator contain oxygen and silicon and the second insulator contain nitrogen and silicon.

In the above semiconductor device, the oxide preferably contains indium, an element M (M is aluminum, gallium, yttrium, or tin), and zinc.

Another embodiment of the present invention is a semiconductor device including a first insulator to a fourth insulator and a transistor; the first insulator and the transistor are provided over the second insulator; the transistor includes a fifth insulator, a sixth insulator over the fifth insulator, a first oxide over the sixth insulator, a second oxide over the first oxide, a first conductor and a second conductor over the second oxide, a third oxide over the second oxide, a seventh insulator over the third oxide, and a third conductor that is positioned over the seventh insulator and overlaps with the second oxide; the third insulator is provided over the first insulator, the first conductor, and the second conductor; the fourth insulator is in contact with top surfaces of the third insulator, the third oxide, the seventh insulator, and the third conductor; the third insulator includes a region whose hydrogen concentration is lower than $1.0 \times 10^{20}$ atoms/cm$^3$; the third insulator contains oxygen and silicon; and the fourth insulator includes a region whose hydrogen concentration is lower than $5.0 \times 10^{20}$ atoms/cm$^3$.

In the above semiconductor device, it is preferable that a composition of the first insulator be substantially the same as that of the third insulator and a composition of the second insulator be substantially the same as that of the fourth insulator.

In the above semiconductor device, the fourth insulator preferably contains oxygen and aluminum. Alternatively, the fourth insulator preferably contains nitrogen and silicon. Alternatively, it is preferable that the fourth insulator have a stacked-layer structure, a first layer of the fourth insulator that is in contact with a top surface of the third insulator contain oxygen and aluminum, and a second layer over the first layer contain nitrogen and silicon.

In the above semiconductor device, the second insulator preferably contains nitrogen and silicon.

In the above semiconductor device, the second oxide preferably contains indium, an element M (M is aluminum, gallium, yttrium, or tin), and zinc.

In the above semiconductor device, it is preferable that a composition of the sixth insulator be substantially the same as that of the third insulator.

In the above semiconductor device, the amount of oxygen that is released from the third insulator by heating and is converted into oxygen molecules is preferably greater than or equal to $2.0 \times 10^{14}$ molecules/cm$^2$.

Another embodiment of the present invention is a method for manufacturing a semiconductor device including a first insulator to a fourth insulator and a transistor; the second insulator is formed; the first insulator is formed over the second insulator; the transistor is formed over the first insulator; the third insulator is formed over the transistor; the fourth insulator is formed over the third insulator; and the first to fourth insulators are each formed by a sputtering method.

In the method for manufacturing a semiconductor device, the third insulator is preferably formed using a target containing oxygen and silicon in an oxygen-containing atmosphere.

In the method for manufacturing a semiconductor device, the fourth insulator is preferably formed using a target containing oxygen and aluminum. Alternatively, the fourth insulator is preferably formed using a target containing silicon in an atmosphere containing nitrogen and argon. Alternatively, in a step of forming the fourth insulator, it is preferable that a first layer be formed using a target containing oxygen and aluminum, and over the first layer, a second layer be formed using a target containing silicon in an atmosphere containing nitrogen and argon.

In the method for manufacturing a semiconductor device, it is preferable that the first insulator be formed to have the same composition as the third insulator, and the second insulator be formed to have the same composition as the fourth insulator.

In the method for manufacturing a semiconductor device, the transistor and the third insulator are preferably formed through steps of forming a fifth insulator and a sixth insulator in this order; forming a first oxide, a second oxide, and a conductive film to be a first conductor and a second conductor in this order over the sixth insulator; processing the first oxide, the second oxide, and the conductive film into island shapes; forming the third insulator over the sixth insulator and the conductive film; forming an opening, which exposes part of the second oxide, in the conductive film and the third insulator to form the first conductor and the second conductor; forming a third oxide over part of the second oxide and the sixth insulator; forming a seventh insulator over the third oxide; forming a third conductor over the seventh insulator; and partly removing the third oxide, the seventh insulator, and the third conductor until part of the third insulator is exposed.

In the method for manufacturing a semiconductor device, the second oxide is preferably formed by a sputtering method using a target containing indium, an element M (M is aluminum, gallium, yttrium, or tin), and zinc.

The method for manufacturing a semiconductor device preferably further includes, between the step of partly removing the third oxide, the seventh insulator, and the third conductor and the step of forming the fourth insulator, steps of forming an eighth insulator by a sputtering method using a target containing oxygen and aluminum; performing heat treatment; and removing the eighth insulator by CMP (Chemical Mechanical Polishing) treatment.

In the method for manufacturing a semiconductor device, the sixth insulator is preferably formed to have the same composition as the third insulator.

Effect of the Invention

According to one embodiment of the present invention, a semiconductor device having a high on-state current can be provided. Alternatively, according to one embodiment of the present invention, a semiconductor device having excellent frequency characteristics can be provided. Alternatively, according to one embodiment of the present invention, a semiconductor device having high reliability can be provided. Alternatively, according to one embodiment of the present invention, a semiconductor device that can be miniaturized or highly integrated can be provided. Alternatively, according to one embodiment of the present invention, a semiconductor device having excellent electrical characteristics can be provided. Alternatively, according to one embodiment of the present invention, a semiconductor device having high productivity can be provided.

Alternatively, a semiconductor device capable of retaining data for a long time can be provided. Alternatively, a semiconductor device capable of high-speed data writing can be provided. Alternatively, a semiconductor device with high design flexibility can be provided. Alternatively, a semiconductor device in which power consumption can be reduced can be provided. Alternatively, a novel semiconductor device can be provided.

Note that the description of these effects does not preclude the existence of other effects. Note that one embodiment of the present invention does not necessarily have all of these effects. Other effects will be apparent from the description of the specification, the drawings, the claims, and the like, and other effects can be derived from the description of the specification, the drawings, the claims, and the like.

BRIEF DESCRIPTION OF THE DRAWINGS

FIG. 4(A) A top view illustrating a method for manufacturing a semiconductor device of one embodiment of the present invention. (B), (C) Cross-sectional views illustrating a method for manufacturing a semiconductor device of one embodiment of the present invention.

FIG. 12(A) A top view of a semiconductor device of one embodiment of the present invention. (B), (C) Cross-sectional views of a semiconductor device of one embodiment of the present invention.

MODE FOR CARRYING OUT THE INVENTION

Figure 1A:
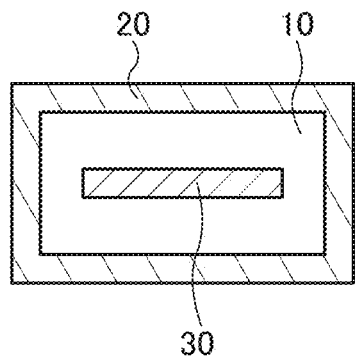
FIG. 1(A) to (E) Diagrams illustrating concepts of a semiconductor device of one embodiment of the present invention.

Hereinafter, embodiments will be described with reference to the drawings. Note that the embodiments can be implemented with many different modes, and it will be readily appreciated by those skilled in the art that modes and details thereof can be changed in various ways without departing from the spirit and scope thereof. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings schematically illustrate ideal examples, and embodiments of the present invention are not limited to shapes, values, or the like shown in the drawings. For example, in the actual manufacturing process, a layer, a resist mask, or the like might be unintentionally reduced in size by treatment such as etching, which is not reflected in the drawings in some cases for easy understanding. Note that in the drawings, the same reference numerals are used, in different drawings, for the same portions or portions having similar functions, and repeated description thereof is omitted in some cases. Furthermore, the same hatch pattern is used for the portions having similar functions, and the portions are not especially denoted by reference numerals in some cases.

Furthermore, especially in a top view (also referred to as a "plan view"), a perspective view, or the like, the description of some components might be omitted for easy understanding of the invention. Furthermore, the description of some hidden lines and the like might be omitted.

In this specification and the like, the ordinal numbers such as first and second are used for convenience and do not denote the order of steps or the stacking order of layers. Therefore, for example, description can be made when "first" is replaced with "second", "third", or the like, as appropriate. In addition, the ordinal numbers in this specification and the like do not correspond to the ordinal numbers which are used to specify one embodiment of the present invention in some cases.

In this specification and the like, terms for describing arrangement, such as "over" and "under", are used for convenience in describing a positional relationship between components with reference to drawings. Furthermore, the positional relationship between components is changed as appropriate in accordance with a direction in which each component is described. Thus, without limitation to terms described in this specification, the description can be changed appropriately depending on the situation.

In the case where there is an explicit description, X and Y are connected, in this specification and the like, for example, the case where X and Y are electrically connected, the case where X and Y are functionally connected, and the case where X and Y are directly connected are disclosed in this specification and the like. Accordingly, without being limited to a predetermined connection relationship, for example, a connection relationship shown in drawings or texts, a connection relationship other than one shown in drawings or texts is disclosed in the drawings or the texts.

Here, X and Y denote an object (e.g., a device, an element, a circuit, a wiring, an electrode, a terminal, a conductive film, or a layer).

In this specification and the like, a transistor is an element having at least three terminals of a gate, a drain, and a source. In addition, the transistor includes a region where a channel is formed (hereinafter, also referred to as a channel formation region) between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which current mainly flows.

Functions of a source and a drain might be switched when a transistor of opposite polarity is employed or a direction of current is changed in circuit operation. Therefore, the terms "source" and "drain" can be interchanged with each other in this specification and the like in some cases.

Note that a channel length refers to, for example, a distance between a source (a source region or a source electrode) and a drain (a drain region or a drain electrode) in a region where a semiconductor (or a portion where current flows in a semiconductor when a transistor is in an on state) and a gate electrode overlap with each other or a channel formation region in a top view of the transistor. Note that in one transistor, channel lengths in all regions are not necessarily the same. In other words, the channel length of one transistor is not fixed to one value in some cases. Thus, in this specification and the like, the channel length is any one of the values, the maximum value, the minimum value, or the average value in a channel formation region.

A channel width refers to, for example, a length of a channel formation region in a direction perpendicular to a channel length direction in a region where a semiconductor (or a portion where current flows in a semiconductor when a transistor is in an on state) and a gate electrode overlap with each other, or a channel formation region in a top view of the transistor. Note that in one transistor, channel widths in all regions do not necessarily have the same value. In other words, the channel width of one transistor is not fixed to one value in some cases. Thus, in this specification and the like, the channel width is any one of the values, the maximum value, the minimum value, or the average value in a channel formation region.

Note that in this specification and the like, depending on transistor structures, a channel width in a region where a channel is actually formed (hereinafter, also referred to as an "effective channel width") is different from a channel width shown in a top view of a transistor (hereinafter, also referred to as an "apparent channel width") in some cases. For example, when a gate electrode covers a side surface of a semiconductor, an effective channel width is greater than an apparent channel width, and its influence cannot be ignored in some cases. For example, in a miniaturized transistor having a gate electrode covering a side surface of a semiconductor, the proportion of a channel formation region formed in the side surface of the semiconductor is increased in some cases. In that case, an effective channel width is greater than an apparent channel width.

In such a case, an effective channel width is difficult to estimate by actual measurement in some cases. For example, estimation of an effective channel width from a design value requires an assumption that the shape of a semiconductor is known. Accordingly, in the case where the shape of a semiconductor is not known accurately, it is difficult to measure an effective channel width accurately.

In this specification and the like, the simple term "channel width" refers to an apparent channel width in some cases. Alternatively, in this specification and the like, the simple term "channel width" refers to an effective channel width in some cases. Note that values of a channel length, a channel width, an effective channel width, an apparent channel width, and the like can be determined, for example, by analyzing a cross-sectional TEM image and the like.

Note that an impurity in a semiconductor refers to, for example, elements other than the main components of the semiconductor. For example, an element with a concentration lower than 0.1 atomic % can be regarded as an impurity. When an impurity is contained, for example, the density of defect states in a semiconductor increases and the crystallinity decreases in some cases. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. In the case of an oxide semiconductor, water also serves as an impurity in some cases. Also in the case of an oxide semiconductor, oxygen vacancies are formed in some cases by entry of impurities, for example. Furthermore, when the semiconductor is silicon, examples of an impurity that changes characteristics of the semiconductor include oxygen, Group 1 elements except hydrogen, Group 2 elements, Group 13 elements, and Group 15 elements.

Note that in this specification and the like, silicon oxynitride is a material that contains more oxygen than nitrogen in its composition. Moreover, silicon nitride oxide is a material that contains more nitrogen than oxygen in its composition.

In addition, in this specification and the like, the term "insulator" can be replaced with an insulating film or an insulating layer. Moreover, the term "conductor" can be replaced with a conductive film or a conductive layer. Furthermore, the term "semiconductor" can be replaced with a semiconductor film or a semiconductor layer.

In this specification and the like, "parallel" indicates a state where two straight lines are placed such that the angle formed therebetween is greater than or equal to −10° and less than or equal to 10°. Thus, the case where the angle is greater than or equal to −5° and less than or equal to 5° is also included. Furthermore, "substantially parallel" indicates a state where two straight lines are placed such that the angle formed therebetween is greater than or equal to −30° and less than or equal to 30°. Moreover, "perpendicular" indicates a state where two straight lines are placed such that the angle formed therebetween is greater than or equal to 80° and less than or equal to 100°. Thus, the case where the angle is greater than or equal to 85° and less than or equal to 95° is also included. In addition, "substantially perpendicular" indicates a state where two straight lines are placed such that the angle formed therebetween is greater than or equal to 60° and less than or equal to 120°.

Note that in this specification and the like, a barrier film means a film having a function of inhibiting the passage of oxygen and impurities such as water and hydrogen, and the barrier film having conductivity is referred to as a conductive barrier film in some cases.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, an OS transistor can also be referred to as a transistor including a metal oxide or an oxide semiconductor.

In this specification and the like, "normally off" means that current per micrometer of channel width flowing through a transistor when no potential is applied to a gate or the gate is supplied with a ground potential is $1\times10^{-20}$ A or lower at room temperature, $1\times10^{-18}$ A or lower at 85° C., or $1\times10^{-16}$ A or lower at 125° C.

Embodiment 1

In this embodiment, an example of a semiconductor device of one embodiment of the present invention is described.

<Concept of Semiconductor Device>

Concepts of the semiconductor device of one embodiment of the present invention are described below with reference to FIG. 1(A) to FIG. 1(E).

The semiconductor device of one embodiment of the present invention includes an oxide 30, an insulator 10, and an insulator 20. As illustrated in FIG. 1(A), the semiconductor device has a structure in which the oxide 30 is surrounded by the insulator 10 and the insulator 10 is surrounded by the insulator 20. Note that the oxide 30 includes a region functioning as a channel formation region of a transistor included in the semiconductor device.

A structure in which the insulator 10 surrounds the oxide 30 refers to a structure in which the insulator 10 is positioned on at least part of a top surface of the oxide 30, at least part of a side surface thereof, and at least part of a bottom surface thereof. In particular, the insulators 10 are further preferably provided to sandwich the oxide 30. For example, it is preferable that the insulators 10 be placed over and under the oxide 30 at the center, or that the insulators 10 be placed on the right and left of the oxide 30 at the center. Although FIG. 1(A) exemplifies the structure in which the insulator 10 surrounds the outer surface of the oxide 30 entirely, the structure is not limited thereto. The insulator 10 may include a region not overlapping with part of the oxide 30. In addition, another component may be positioned between the insulator 10 and the oxide 30. Examples of another component include a conductor connected to the oxide 30 and an insulator protecting the oxide 30.

In a transistor, a metal oxide functioning as a semiconductor (hereinafter, also referred to as an oxide semiconductor) is preferably used in a channel formation region. When an oxide semiconductor is used in a channel formation region of a transistor, a transistor having high field-effect mobility can be achieved. In addition, a transistor having high reliability can be achieved.

The transistor using an oxide semiconductor in a channel formation region has an extremely low leakage current (off-state current) in a non-conduction state; thus, a semiconductor device with low power consumption can be provided. An oxide semiconductor can be deposited by a sputtering method or the like, and thus can be used for a transistor included in a highly integrated semiconductor device.

Note that a metal oxide with a low carrier density is preferably used for the transistor. In the case where the carrier density of the metal oxide is reduced, the impurity concentration in the metal oxide is reduced to reduce the density of defect states. In this specification and the like, a state with a low impurity concentration and a low density of defect states is referred to as a highly purified intrinsic or substantially highly purified intrinsic state. For example, a metal oxide has a carrier density lower than $8 \times 10^{11}$ cm$^{-3}$, preferably lower than $1 \times 10^{11}$ cm$^{-3}$, further preferably lower than $1 \times 10^{10}$ cm$^{-3}$, and higher than or equal to $1 \times 10^{-9}$ cm$^{-3}$.

A highly purified intrinsic or substantially highly purified intrinsic metal oxide has a low density of defect states and accordingly has a low density of trap states in some cases.

Charges trapped by the trap states in the metal oxide take a long time to be released and may behave like fixed charges. Thus, a transistor whose channel formation region includes a metal oxide having a high density of trap states has unstable electrical characteristics in some cases.

Accordingly, a reduction in the impurity concentration in the metal oxide is effective in stabilizing electrical characteristics of the transistor. In addition, in order to reduce the impurity concentration in the metal oxide, the impurity concentration in an adjacent film is also preferably reduced. Examples of impurities include hydrogen, nitrogen, an alkali metal, an alkaline earth metal, iron, nickel, and silicon.

In particular, hydrogen contained in a metal oxide reacts with oxygen bonded to a metal atom to be water, and thus forms oxygen vacancies in some cases. When the channel formation region of the metal oxide includes oxygen vacancies, the transistor is likely to have normally-on characteristics. Moreover, entry of hydrogen into the oxygen vacancies generates electrons serving as carriers in some cases. Furthermore, bonding of part of hydrogen to oxygen bonded to a metal atom causes generation of an electron serving as a carrier in some cases. Thus, a transistor using a metal oxide containing hydrogen is likely to have normally-on characteristics.

In view of the above, the impurities (in particular, hydrogen) and oxygen vacancies in the channel formation region of the metal oxide are preferably reduced as much as possible.

Thus, the metal oxide used in the channel formation region is preferably surrounded by a first insulator having a low hydrogen concentration. Furthermore, it is preferable that the first insulator include a region containing oxygen in excess of that in the stoichiometric composition (hereinafter, also referred to as an excess-oxygen region) or release oxygen by heating. In this specification, oxygen that is released by heating is referred to as excess oxygen in some cases.

The first insulator is used as the insulator 10 illustrated in FIG. 1(A). The hydrogen concentration in the insulator 10 that is in contact with the oxide 30 or provided in the vicinity of the oxide 30 is low; thus, entry of hydrogen into the oxide 30 can be inhibited. In addition, supplying excess oxygen contained in the insulator 10 to the oxide 30 can reduce the oxygen vacancies in the oxide 30. Accordingly, a transistor that has stable electrical characteristics with a small variation in electrical characteristics and improved reliability can be provided.

Hydrogen contained in a component provided outside the insulator 10 and the oxide 30 reacts with excess oxygen contained in the insulator 10 to be water in some cases. This can reduce the amount of hydrogen entering the oxide 30. Accordingly, a transistor that has stable electrical characteristics with a small variation in electrical characteristics and improved reliability can be provided.

Specifically, the hydrogen concentration in the first insulator, which is measured by secondary ion mass spectrometry (SIMS), is lower than $5 \times 10^{20}$ atoms/cm$^3$, preferably lower than $1 \times 10^{20}$ atoms/cm$^3$, further preferably lower than $5 \times 10^{19}$ atoms/cm$^3$. Note that the first insulator may include a region with a lower hydrogen concentration than a second insulator described later.

As the first insulator, specifically, an oxide from which part of oxygen is released by heating is preferably used. An oxide that releases oxygen by heating is an oxide in which the amount of released oxygen molecules is greater than or equal to $2.0 \times 10^{14}$ molecules/cm$^2$, preferably greater than or equal to $1.0 \times 10^{15}$ molecules/cm$^2$ in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C.

For example, silicon oxide, silicon oxynitride, or the like is preferably used for the first insulator. Moreover, the first insulator is preferably formed by a sputtering method. When the first insulator is formed by a sputtering method in an oxygen-containing atmosphere, oxygen can be added to the first insulator. Accordingly, oxygen can be supplied from the first insulator to the metal oxide. The film formation by this method can reduce the hydrogen concentration in the first insulator. In the case where the first insulator is formed by a sputtering method, a target containing oxygen and silicon is preferably used.

Although the insulator 10 illustrated in FIG. 1(A) is a single layer, the insulator 10 may have a stacked-layer structure; a stack including an insulating material having a function of inhibiting diffusion of hydrogen (e.g., at least one of hydrogen atoms, hydrogen molecules, and the like) and an insulating material that can be used for the first insulator may be used. As the insulating material having a function of inhibiting diffusion of hydrogen, aluminum oxide or the like can be used, for example. Specifically, silicon oxide is formed by a sputtering method to surround the oxide 30, and aluminum oxide is formed by a sputtering method to surround the silicon oxide.

Furthermore, the first insulator is preferably surrounded by the second insulator that has a low hydrogen concentration and a function of inhibiting diffusion of hydrogen (e.g., at least one of hydrogen atoms, hydrogen molecules, and the like). For example, the second insulator preferably has a lower hydrogen-transmitting property than the first insulator.

The second insulator is used as the insulator 20 illustrated in FIG. 1(A). This can inhibit hydrogen contained in a component provided outside the insulator 20, the insulator 10, and the oxide 30 from entering the oxide 30 through the insulator 20 and the insulator 10. Accordingly, a transistor that has stable electrical characteristics with a small variation in electrical characteristics and improved reliability can be provided.

Specifically, the hydrogen concentration in the second insulator measured by SIMS is lower than $5 \times 10^{21}$ atoms/cm$^3$, preferably lower than $5 \times 10^{20}$ atoms/cm$^3$, further preferably lower than $1 \times 10^{20}$ atoms/cm$^3$.

For example, silicon nitride or the like is preferably used for the second insulator. Silicon nitride is preferable because of its function of inhibiting hydrogen diffusion. In addition, the second insulator is preferably formed by a sputtering method. Specifically, in the formation of the second insulator, a silicon target is used and a mixed gas of argon and nitrogen is used as a sputtering gas. Since hydrogen is not used for forming the second insulator, the hydrogen concentration in the second insulator can be reduced.

Although the insulator 20 illustrated in FIG. 1(A) is a single layer, the insulator 20 may have a stacked-layer structure; a stack including an insulating material capable of forming an excess-oxygen region in the insulator 10 and an insulating material that can be used for the second insulator may be used. As the insulating material capable of forming an excess-oxygen region in the insulator 10, aluminum oxide formed by a sputtering method can be used, for example. Specifically, aluminum oxide is formed by a sputtering method to surround the insulator 10, and silicon nitride is formed by a sputtering method to surround the aluminum oxide.

Figure 1B:
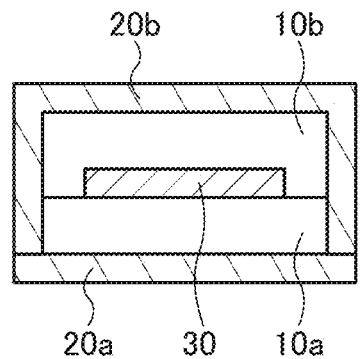

Although the insulator 10 and the insulator 20 illustrated in FIG. 1(A) are each a single layer, one embodiment of the present invention is not limited thereto. The insulator 10 and the insulator 20 may each be formed of a plurality of insulators having substantially the same compositions. For example, as illustrated in FIG. 1(B), the insulator 10 may be formed of an insulator 10a and an insulator 10b, and the insulator 20 may be formed of an insulator 20a and an insulator 20b. In that case, the composition of the insulator 10a is substantially the same as that of the insulator 10b, and the composition of the insulator 20a is substantially the same as that of the insulator 20b. Note that the composition of the insulator 10a being substantially the same as that of the insulator 10b means that the atomic ratio of main constituent elements contained in the insulator 10a varies from the atomic ratio of main constituent elements contained in the insulator 10b within a range of approximately ±10%, for example.

As a method for manufacturing a semiconductor device illustrated in FIG. 1(B), it is preferable that the insulator 20a be formed, the insulator 10a be formed over the insulator 20a, a transistor including the oxide 30 be formed over the insulator 10a, the insulator 10b be formed over the transistor, and the insulator 20b be formed over the insulator 10b.

Next, a structure example of a transistor included in the semiconductor device illustrated in FIG. 1(A) is described with reference to FIG. 1(C) and FIG. 1(D).

Figure 1C:
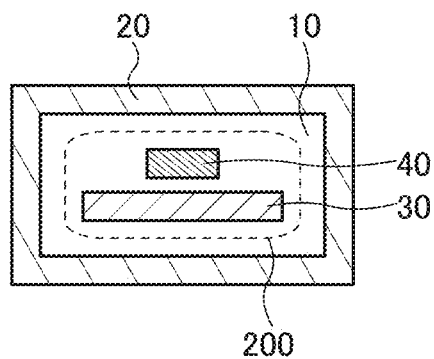

A semiconductor device illustrated in FIG. 1(C) includes a transistor 200 and the insulator 10 and the insulator 20 functioning as interlayer films. The transistor 200 includes the oxide 30 and a conductor 40. The oxide 30 includes a region functioning as a channel formation region of the transistor 200. The conductor 40 functions as a gate electrode of the transistor 200.

As illustrated in FIG. 1(C), the oxide 30 and the conductor 40 are surrounded by the insulator 10. The insulator 10 is surrounded by the insulator 20. The conductor 40 includes a region overlapping with the oxide 30 with the insulator 10 therebetween. In that case, a region of the insulator 10 that is sandwiched between the conductor 40 and the oxide 30 functions as a gate insulating film of the transistor 200.

Although a single layer of the insulator 10 is used as the insulator functioning as the gate insulating film in FIG. 1(C), one embodiment of the present invention is not limited thereto. A single layer of an insulator formed using an insulating material different from that for the insulator 10 may be used, a single layer of an insulator formed by a method different from that for the insulator 10 may be used, or a multilayer structure combining these insulators may be used.

Although FIG. 1(C) illustrates a structure in which the insulator 10 is provided between the conductor 40 and the insulator 20, the structure is not limited thereto, and a top surface of the conductor 40 may be in contact with the insulator 20.

In addition, although FIG. 1(C) illustrates a structure in which the conductor 40 is provided above the oxide 30, the structure is not limited thereto, and the conductor 40 may be provided below the oxide 30. In that case, a bottom surface of the conductor 40 may be in contact with the insulator 20.

Figure 1D:
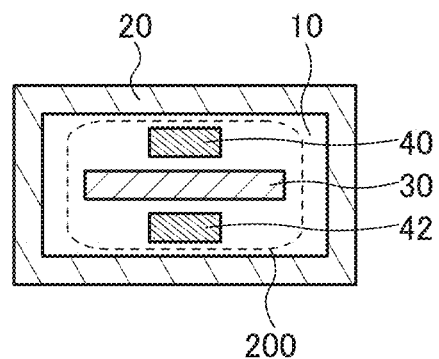

As illustrated in FIG. 1(D), the transistor 200 may include a conductor 42 in addition to the oxide 30 and the conductor 40. The oxide 30 includes a region functioning as the channel formation region of the transistor 200. The conductor 40 functions as a first gate electrode of the transistor 200, and the conductor 42 functions as a second gate electrode of the transistor 200.

As illustrated in FIG. 1(D), the oxide 30, the conductor 40, and the conductor 42 are surrounded by the insulator 10. The insulator 10 is surrounded by the insulator 20. The conductor 40 includes a region overlapping with the oxide 30 with the insulator 10 therebetween. In that case, a region of the insulator 10 that is sandwiched between the conductor 40 and the oxide 30 functions as a first gate insulating film of the transistor 200. The conductor 42 includes a region overlapping with the oxide 30 with the insulator 10 therebetween. In that case, a region of the insulator 10 that is sandwiched between the conductor 42 and the oxide 30 functions as a second gate insulating film.

Although a single layer of the insulator 10 is used as the insulator functioning as the first gate insulating film and the insulator functioning as the second gate insulating film in FIG. 1(D), one embodiment of the present invention is not limited thereto. A single layer of an insulator formed using an insulating material different from that for the insulator 10 may be used, a single layer of an insulator formed by a method different from that for the insulator 10 may be used, or a multilayer structure combining these insulators may be used.

Although FIG. 1(D) illustrates a structure in which the insulator 10 is provided between the conductor 40 and the insulator 20 and the insulator 10 is provided between the conductor 42 and the insulator 20, the structure is not limited thereto. One or both of the top surface of the conductor 40 and the bottom surface of the conductor 42 may be in contact with the insulator 20.

Figure 1E:
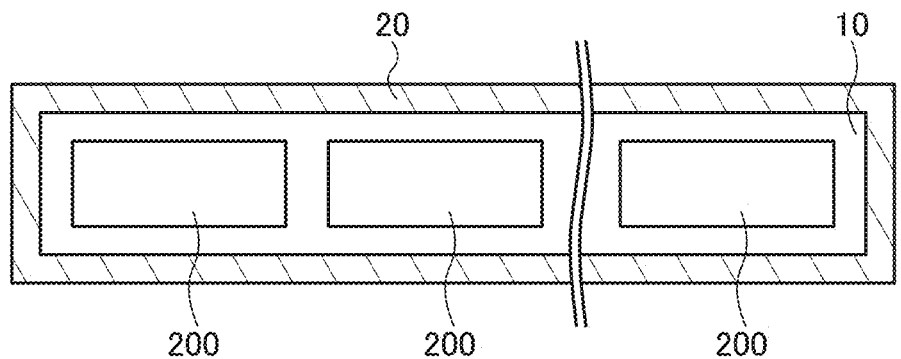

Although FIG. 1(C) and FIG. 1(D) illustrate a structure in which the insulator 20 surrounds the insulator 10 and one transistor 200, the structure is not limited thereto. As illustrated in FIG. 1(E), a structure may be employed in which the insulator 20 surrounds the insulator 10 and a plurality of transistors 200.

Accordingly, a semiconductor device with low power consumption can be provided. A highly integrated semiconductor device can be provided. A semiconductor device that has stable electrical characteristics with a small variation in electrical characteristics and improved reliability can be provided. A semiconductor device including a transistor having a low off-state current can be provided.

<Structure Example 1 of Semiconductor Device>

Figure 2A:
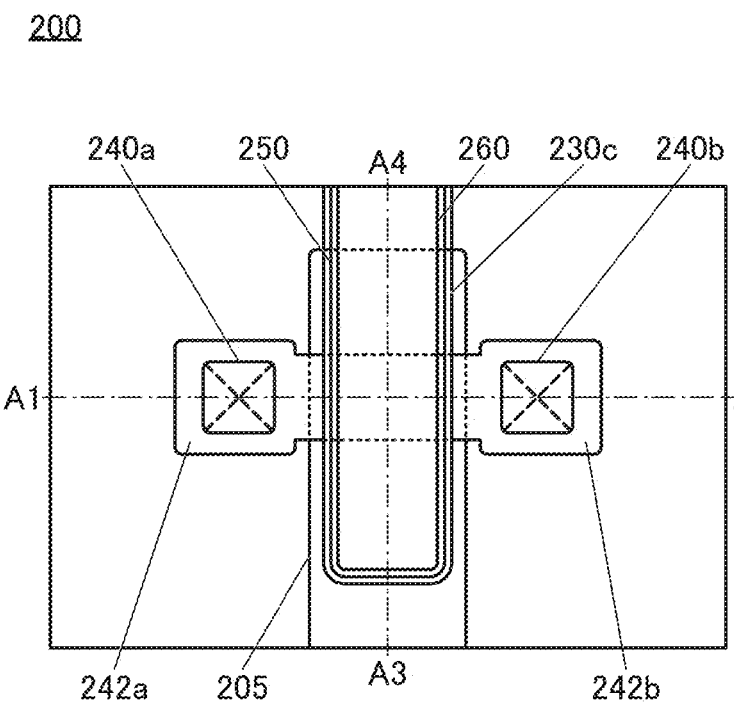
FIG. 2(A) A top view of a semiconductor device of one embodiment of the present invention. (B), (C) Cross-sectional views of a semiconductor device of one embodiment of the present invention.
Figure 2C:
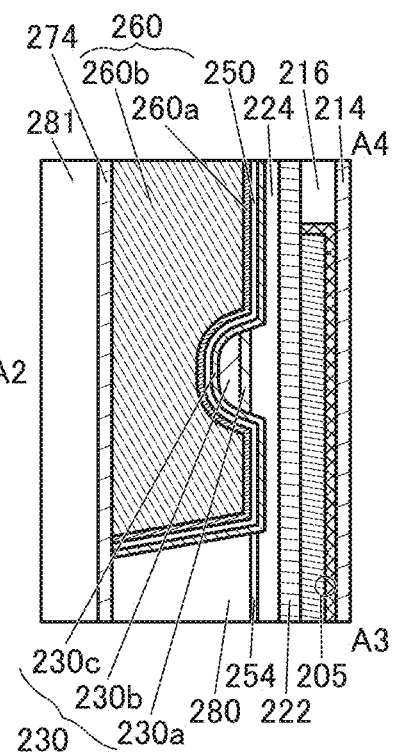
Figure 2B:
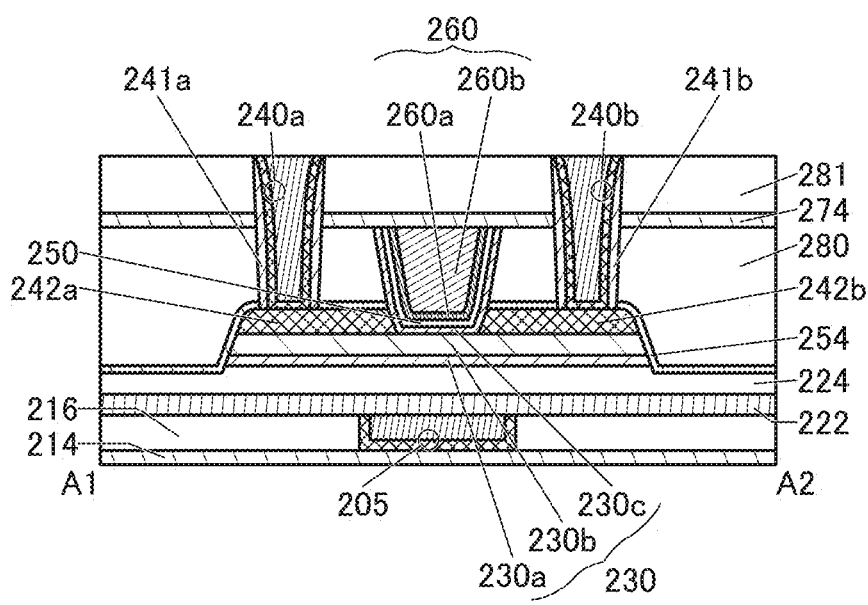

FIG. 2(A) to FIG. 2(C) are a top view and cross-sectional views of the semiconductor device of one embodiment of the present invention, the transistor 200 included in the semiconductor device, and the periphery of the transistor 200.

FIG. 2(A) is a top view of the semiconductor device including the transistor 200. FIG. 2(B) and FIG. 2(C) are cross-sectional views of the semiconductor device. Here, FIG. 2(B) is a cross-sectional view of a portion indicated by the dashed-dotted line A1-A2 in FIG. 2(A), and is also a cross-sectional view of the transistor 200 in the channel length direction. FIG. 2(C) is a cross-sectional view of a portion indicated by the dashed-dotted line A3-A4 in FIG. 2(A), and is also a cross-sectional view of the transistor 200 in the channel width direction. Note that for clarity of the drawing, some components are omitted in the top view of FIG. 2(A).

The semiconductor device of one embodiment of the present invention includes the transistor 200 and an insulator 214, an insulator 216, an insulator 280, an insulator 274, and an insulator 281 that function as interlayer films. A conductor 240 (a conductor 240a and a conductor 240b) that is electrically connected to the transistor 200 and functions as a plug is also included. Note that an insulator 241 (an insulator 241a and an insulator 241b) is provided in contact with a side surface of the conductor 240 functioning as a plug.

In contact with a side wall of an opening formed in the insulator 280, the insulator 274, the insulator 281, and the like, the insulator 241 is provided. In contact with its side surface, a first conductor of the conductor 240 is provided, and a second conductor of the conductor 240 is further provided on the inner side. Here, a top surface of the conductor 240 and a top surface of the insulator 281 can be substantially level with each other. Note that although the transistor 200 having a structure in which the first conductor of the conductor 240 and the second conductor of the conductor 240 are stacked is illustrated, the present invention is not limited thereto. For example, the conductor 240 may be provided as a single layer or to have a stacked-layer structure of three or more layers. When a component has a stacked-layer structure, layers may be distinguished by ordinal numbers corresponding to the formation order.

Here, the insulator 216 and the insulator 280 correspond to the insulator 10 illustrated in FIG. 1(A), FIG. 1(C), and FIG. 1(D) or the insulator 10a and the insulator 10b illustrated in FIG. 1(B). That is, it is preferable that one or both of the insulator 216 and the insulator 280 have a low hydrogen concentration, include an excess-oxygen region or excess oxygen, and be formed using a material similar to that for the insulator 10 illustrated in FIG. 1(A), FIG. 1(C), and FIG. 1(D) or the insulator 10a and the insulator 10b illustrated in FIG. 1(B). This can inhibit entry of hydrogen into a metal oxide included in the transistor 200 and can reduce oxygen vacancies in the metal oxide. Accordingly, a transistor that has stable electrical characteristics with a small variation in electrical characteristics and improved reliability can be provided.

The insulator 214 and the insulator 274 correspond to the insulator 20 illustrated in FIG. 1(A), FIG. 1(C), and FIG. 1(D) or the insulator 20a and the insulator 20b illustrated in FIG. 1(B). That is, it is preferable that one or both of the insulator 214 and the insulator 274 have a low hydrogen concentration, have a function of inhibiting hydrogen diffusion, and be formed using a material similar to that for the insulator 20 illustrated in FIG. 1(A), FIG. 1(C), and FIG. 1(D) or the insulator 20a and the insulator 20b illustrated in FIG. 1(B). This can inhibit entry of hydrogen contained in the insulator 281, a component provided below the insulator 214, and the like into the transistor 200. Accordingly, a transistor that has stable electrical characteristics with a small variation in electrical characteristics and improved reliability can be provided.

In the case where the insulator 274 has a function of inhibiting hydrogen diffusion, the hydrogen concentration sometimes differs between the insulator 280 and the insulator 281, which are separated by the insulator 274. For example, in the case where an insulating material with a low hydrogen concentration is used for the insulator 280, the hydrogen concentration in the insulator 280 is lower than the hydrogen concentration in the insulator 281.

[Transistor 200]

As illustrated in FIG. 2(A) to FIG. 2(C), the transistor 200 includes a conductor 205 placed over a substrate (not illustrated) to be embedded in the insulator 216; an insulator 222 placed over the insulator 216 and the conductor 205; an insulator 224 placed over the insulator 222; an oxide 230 (an oxide 230a, an oxide 230b, and an oxide 230c) placed over the insulator 224; an insulator 250 placed over the oxide 230; a conductor 260 (a conductor 260a and a conductor 260b) placed over the insulator 250; a conductor 242a and a conductor 242b in contact with part of a top surface of the oxide 230b; and an insulator 254 placed in contact with part of a top surface of the insulator 224, a side surface of the oxide 230a, a side surface of the oxide 230b, a side surface of the conductor 242a, a top surface of the conductor 242a, a side surface of the conductor 242b, and a top surface of the conductor 242b.

The oxide 230 preferably includes the oxide 230a placed over the insulator 224, the oxide 230b placed over the oxide 230a, and the oxide 230c that is placed over the oxide 230b and is at least partly in contact with the top surface of the oxide 230b.

Note that the transistor 200 has a structure in which three layers of the oxide 230a, the oxide 230b, and the oxide 230c are stacked in a channel formation region and its vicinity; however, the present invention is not limited thereto. For example, a single layer of the oxide 230b, a two-layer structure of the oxide 230a and the oxide 230b, a two-layer structure of the oxide 230b and the oxide 230c, or a stacked-layer structure of four or more layers may be provided.

In the transistor 200, a metal oxide functioning as a semiconductor (hereinafter, also referred to as an oxide semiconductor) is preferably used as the oxide 230 (the oxide 230a, the oxide 230b, and the oxide 230c) including a channel formation region. For example, as the metal oxide to be the channel formation region, a metal oxide having a band gap of 2 eV or more, preferably 2.5 eV or more is preferably used. With the use of a metal oxide having such a wide band gap, the off-state current of the transistor can be reduced. With the use of such a transistor, a semiconductor device with low power consumption can be provided.

For example, as the oxide 230, a metal oxide such as an In-M-Zn oxide (an element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum, gallium, yttrium, or tin is preferably used as the element M. Furthermore, an In—Ga oxide, an In—Zn oxide, or a Ga—Zn oxide may be used as the oxide 230.

A transistor using an oxide semiconductor is likely to have its electrical characteristics changed when impurities and oxygen vacancies exist in a channel formation region of the oxide semiconductor, which might affect the reliability. Moreover, when the channel formation region of the oxide semiconductor includes oxygen vacancies, the transistor is likely to have normally-on characteristics. Thus, it is preferable that oxygen vacancies in the channel formation region be reduced as much as possible. For example, oxygen is supplied to the oxide 230 through the insulator 250 or the like to fill the oxygen vacancies. Accordingly, a transistor that has stable electrical characteristics with a small variation in electrical characteristics and improved reliability can be provided.

Note that the oxide 30 illustrated in FIG. 1(A) to FIG. 1(D) corresponds to the oxide 230. That is, a metal oxide that can be used for the oxide 230 is preferably used for the oxide 30 illustrated in FIG. 1(A) to FIG. 1(D).

In the case where an element included in the conductor 242 (the conductor 242a and the conductor 242b) that is provided on and in contact with the oxide 230 and functions as a source electrode and a drain electrode has a function of absorbing oxygen in the oxide 230, a low-resistance region is sometimes partly formed between the oxide 230 and the conductor 242, or in the vicinity of the surface of the oxide 230. In that case, in the low-resistance region, an impurity (hydrogen, nitrogen, a metal element, or the like) that enters oxygen vacancies serves as a donor and the carrier density increases in some cases.

The conductor 260 functions as a first gate (also referred to as top gate) electrode of the transistor 200, and the conductor 242a and the conductor 242b function as a source electrode and a drain electrode of the transistor 200. In the transistor 200, the conductor 260 functioning as the first gate electrode is formed in a self-aligned manner to fill an opening formed in the insulator 280 and the like. The formation of the conductor 260 in this manner allows the conductor 260 to be positioned certainly in a region between the conductor 242a and the conductor 242b without alignment.

Note that the conductor 260 preferably includes the conductor 260a and the conductor 260b positioned over the conductor 260a. For example, the conductor 260a is preferably positioned to cover a bottom surface and a side surface of the conductor 260b. Moreover, as illustrated in FIG. 2(B), a top surface of the conductor 260 is substantially aligned with a top surface of the insulator 250 and a top surface of the oxide 230c.

The insulator 222 and the insulator 254 preferably have a function of inhibiting diffusion of hydrogen (e.g., at least one of a hydrogen atom, a hydrogen molecule, and the like). In addition, the insulator 222 and the insulator 254 preferably have a function of inhibiting diffusion of oxygen (e.g., at least one of an oxygen atom, an oxygen molecule, and the like). For example, the insulator 222 and the insulator 254 preferably have lower permeability of one or both of hydrogen and oxygen than the insulator 224. The insulator 222 and the insulator 254 preferably have lower permeability of one or both of hydrogen and oxygen than the insulator 250. The insulator 222 and the insulator 254 preferably have lower permeability of one or both of hydrogen and oxygen than the insulator 280.

As illustrated in FIG. 2(B), the insulator 254 is preferably in contact with the top surfaces of the conductor 242a and the conductor 242b, side surfaces of the conductor 242a and the conductor 242b other than their side surfaces facing each other, the side surfaces of the oxide 230a and the oxide 230b, and part of the top surface of the insulator 224. Thus, the insulator 280 is isolated from the insulator 224, the oxide 230a, and the oxide 230b by the insulator 254. This can inhibit entry of impurities such as hydrogen contained in the insulator 280 and the like into the insulator 224, the oxide 230a, and the oxide 230b.

As illustrated in FIG. 2(B), the transistor 200 has a structure in which the insulator 274 is in contact with the top surfaces of the conductor 260, the insulator 250, and the oxide 230c. Such a structure can inhibit entry of impurities such as hydrogen contained in the insulator 281 and the like into the insulator 250. Thus, adverse effects on the electric characteristics of the transistor and the reliability of the transistor can be suppressed.

Figure 3:
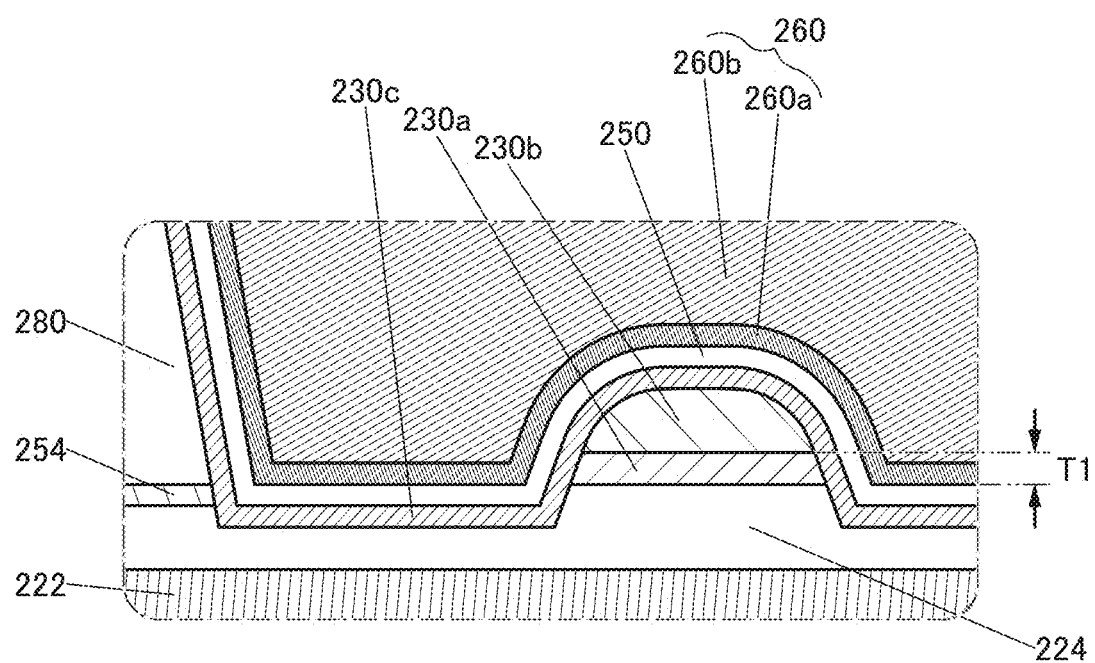
FIG. 3 A cross-sectional view of a semiconductor device of one embodiment of the present invention.

FIG. 3 illustrates an enlarged view of a region of part of the transistor 200 illustrated in FIG. 2(C). As illustrated in FIG. 2(C) and FIG. 3, in the channel width direction of the transistor 200, with reference to the bottom surface of the insulator 222, the level of the bottom surface of the conductor 260 in a region where the conductor 260 and the oxide 230b do not overlap with each other is preferably lower than the level of the bottom surface of the oxide 230b. When the conductor 260, which functions as a gate electrode, covers the side surface and the top surface of the oxide 230b in the channel formation region with the oxide 230c and the insulator 250 therebetween, electric fields of the conductor 260 are likely to affect the entire channel formation region of the oxide 230b. Thus, the on-state current of the transistor 200 can be increased, and the frequency characteristics can be improved. When the difference in level between the bottom surface of the conductor 260 in a region where the oxide 230a and the oxide 230b do not overlap with the conductor 260 and the bottom surface of the oxide 230b is T1, T1 is greater than or equal to 0 nm and less than or equal to 100 nm, preferably greater than or equal to 3 nm and less than or equal to 50 nm, further preferably greater than or equal to 5 nm and less than or equal to 20 nm.

Accordingly, a semiconductor device including a transistor having a high on-state current can be provided. A semiconductor device including a transistor having excellent frequency characteristics can be provided. A semiconductor device that has stable electrical characteristics with a small variation in electrical characteristics and improved reliability can be provided. In addition, a semiconductor device including a transistor having a low off-state current can be provided.

The detailed structure of the semiconductor device including the transistor 200 of one embodiment of the present invention will be described below.

The conductor 205 is positioned to overlap with the oxide 230 and the conductor 260. Furthermore, the conductor 205 is preferably provided to be embedded in the insulator 214 or the insulator 216. Here, the top surface of the conductor 205 preferably has favorable planarity. For example, the average surface roughness (Ra) of the top surface of the conductor 205 is less than or equal to 1 nm, preferably less than or equal to 0.5 nm, further preferably less than or equal to 0.3 nm. This achieves favorable planarity of the insulator 224 formed over the conductor 205 and the increase in crystallinity of the oxide 230a, the oxide 230b, and the oxide 230c.

Here, the conductor 260 sometimes functions as a first gate electrode. The conductor 205 functions as a second gate (also referred to as bottom gate) electrode in some cases. In that case, by changing a potential applied to the conductor 205 not in conjunction with but independently of a potential applied to the conductor 260, the threshold voltage (Vth) of the transistor 200 can be controlled. In particular, by applying a negative potential to the conductor 205, Vth of the transistor 200 can be further increased, and the off-state current can be reduced. Thus, a drain current at the time when a potential applied to the conductor 260 is 0 V can be lower in the case where a negative potential is applied to the conductor 205 than in the case where the negative potential is not applied.

Note that as illustrated in FIG. 2(B) and FIG. 2(C), the conductor 205 is preferably provided larger than the channel formation region of the oxide 230b. As illustrated in FIG. 2(C), it is particularly preferable that the conductor 205 also extend to a region outside an end portion of the oxide 230 that intersects with the channel width direction. That is, the conductor 205 and the conductor 260 preferably overlap with each other with the insulators therebetween on the outer side of the side surface of the oxide 230 in the channel width direction.

With the above structure, the channel formation region of the oxide 230 can be electrically surrounded by electric fields of the conductor 260 functioning as a first gate electrode and electric fields of the conductor 205 functioning as a second gate electrode. In this specification, a transistor structure in which a channel formation region is electrically surrounded by electric fields of a first gate electrode and a second gate electrode is referred to as a surrounded channel (S-channel) structure.

Furthermore, as illustrated in FIG. 2(C), the conductor 205 is extended to function as a wiring as well. However, without limitation to this structure, a structure where a conductor functioning as a wiring is provided below the conductor 205 may be employed. In addition, the conductor 205 is not necessarily provided in each transistor. For example, the conductor 205 may be shared by a plurality of transistors.

Although the transistor 200 having a structure in which the first conductor of the conductor 205 and the second conductor of the conductor 205 are stacked is illustrated, the present invention is not limited thereto. For example, the conductor 205 may be provided as a single layer or to have a stacked-layer structure of three or more layers.

Here, for the first conductor of the conductor 205, a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom (through which the above impurities are less likely to pass) is preferably used. Alternatively, it is preferable to use a conductive material having a function of inhibiting diffusion of oxygen (e.g., at least one of an oxygen atom, an oxygen molecule, and the like) (through which the above oxygen is less likely to pass). Note that in this specification, a function of inhibiting diffusion of impurities or oxygen means a function of inhibiting diffusion of any one or all of the above impurities and oxygen.

When a conductive material having a function of inhibiting oxygen diffusion is used for the first conductor of the conductor 205, the conductivity of the second conductor of the conductor 205 can be inhibited from being lowered because of oxidation. As a conductive material having a function of inhibiting oxygen diffusion, for example, tantalum, tantalum nitride, ruthenium, or ruthenium oxide is preferably used. Accordingly, the first conductor of the conductor 205 is a single layer or stacked layers of the above conductive materials. For example, the first conductor of the conductor 205 may be a stack of tantalum, tantalum nitride, ruthenium, or ruthenium oxide and titanium or titanium nitride.

A conductive material containing tungsten, copper, or aluminum as its main component is preferably used for the second conductor of the conductor 205. Note that the second conductor of the conductor 205 is a single layer in the drawing but may have a stacked-layer structure, for example, a stacked-layer structure of the above conductive material and titanium or titanium nitride.

The insulator 214 preferably functions as a barrier insulating film that inhibits diffusion of impurities such as water and hydrogen into the transistor 200 from the substrate side. Accordingly, for the insulator 214, it is preferable to use an insulating material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom (through which the above impurities are less likely to pass). Alternatively, it is preferable to use an insulating material having a function of inhibiting diffusion of oxygen (e.g., at least one of an oxygen atom, an oxygen molecule, and the like) (through which the above oxygen is less likely to pass).

For example, aluminum oxide, silicon nitride, or the like is preferably used for the insulator 214. Accordingly, impurities such as water and hydrogen can be inhibited from diffusing to the transistor 200 side from the substrate side through the insulator 214. Alternatively, oxygen contained in the insulator 224 and the like can be inhibited from diffusing to the substrate side through the insulator 214.

The dielectric constants of the insulator 216, the insulator 280, and the insulator 281 functioning as interlayer films are preferably lower than that of the insulator 214. When a material with a low dielectric constant is used for an interlayer film, the parasitic capacitance generated between wirings can be reduced. For example, as the insulator 216, the insulator 280, and the insulator 281, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like is used as appropriate.

The insulator 216 may have a stacked-layer structure. For example, in the insulator 216, an insulator similar to the insulator 214 may be provided at least in a portion in contact with a side surface of the conductor 205. Such a structure can inhibit oxidation of the conductor 205 due to oxygen contained in the insulator 216, or can inhibit absorption of oxygen contained in the insulator 216 by the conductor 205.

The insulator 222 and the insulator 224 function as a gate insulator.

Here, it is preferable that the insulator 224, which is in contact with the oxide 230, release oxygen by heating. For example, silicon oxide, silicon oxynitride, or the like is used as appropriate for the insulator 224. When an insulator containing oxygen is provided in contact with the oxide 230, oxygen vacancies in the oxide 230 can be reduced and the reliability of the transistor 200 can be improved.

For the insulator 224, specifically, an oxide material from which part of oxygen is released by heating is preferably used. An oxide that releases oxygen by heating is an oxide in which the amount of released oxygen converted into oxygen atoms is greater than or equal to $1.0 \times 10^{18}$ atoms/$cm^3$, preferably greater than or equal to $1.0 \times 10^{19}$ atoms/$cm^3$, further preferably greater than or equal to $2.0 \times 10^{19}$ atoms/$cm^3$ or greater than or equal to $3.0 \times 10^{20}$ atoms/$cm^3$ in TDS analysis. Note that the temperature of the film surface in the TDS analysis is preferably higher than or equal to 100° C. and lower than or equal to 700° C., or higher than or equal to 100° C. and lower than or equal to 400° C.

Note that the insulator 224 may be formed using a material similar to that for the insulator 10 illustrated in FIG. 1(A), FIG. 1(C), and FIG. 1(D) or the insulator 10a and the insulator 10b illustrated in FIG. 1(B).

The insulator 222 preferably functions as a barrier insulating film that inhibits diffusion of impurities such as water and hydrogen into the transistor 200 from the substrate side. For example, the insulator 222 preferably has lower hydrogen permeability than the insulator 224. By surrounding the insulator 224, the oxide 230, and the like with the insulator 222 and the insulator 254, diffusion of impurities such as water and hydrogen into the insulator 224 and the oxide 230 from the outside can be inhibited.

Furthermore, it is preferable that the insulator 222 have a function of inhibiting diffusion of oxygen (e.g., at least one of an oxygen atom, an oxygen molecule, and the like) (or be less likely to transmit the above oxygen). For example, the insulator 222 preferably has lower oxygen permeability than the insulator 224. The insulator 222 preferably has a function of inhibiting diffusion of oxygen and impurities, in which case diffusion of oxygen contained in the oxide 230 to the substrate side can be reduced. Furthermore, the conductor 205 can be inhibited from reacting with oxygen contained in the insulator 224 and the oxide 230.

As the insulator 222, an insulator containing an oxide of one or both of aluminum and hafnium, which is an insulating material, is preferably used. As the insulator containing an oxide of one or both of aluminum and hafnium, aluminum oxide, hafnium oxide, an oxide containing aluminum and hafnium (hafnium aluminate), or the like is preferably used. In the case where the insulator 222 is formed using such a material, the insulator 222 functions as a layer that inhibits release of oxygen from the oxide 230 and diffusion of impurities such as hydrogen from the periphery of the transistor 200 into the oxide 230. Note that among the above-described materials, hafnium oxide is particularly suitably used as the insulator 222. For example, when the insulator 222 is used as a gate insulating film, the use of hafnium oxide as the insulator 222 can sometimes reduce the interface state density, as compared to the case of using aluminum oxide.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

For example, a single layer or stacked layers of an insulator containing what is called a high-k material such as aluminum oxide, hafnium oxide, tantalum oxide, zirconium oxide, lead zirconate titanate (PZT), strontium titanate (SrTiO$_3$), or (Ba,Sr)TiO$_3$ (BST) may be used for the insulator 222. With miniaturization and high integration of transistors, a problem such as leakage current may arise because of a thinner gate insulator. When a high-k material is used for an insulator functioning as a gate insulator, a gate potential during operation of the transistor can be reduced while the physical thickness of the gate insulator is kept.

Note that the insulator 222 and the insulator 224 may each have a stacked-layer structure of two or more layers. In that case, without limitation to a stacked-layer structure formed of the same material, a stacked-layer structure formed of different materials may be employed. For example, an insulator similar to the insulator 224 may be provided below the insulator 222.

The oxide 230 includes the oxide 230a, the oxide 230b over the oxide 230a, and the oxide 230c over the oxide 230b. Including the oxide 230a below the oxide 230b makes it possible to inhibit diffusion of impurities into the oxide 230b from the components formed below the oxide 230a. Moreover, including the oxide 230c over the oxide 230b makes it possible to inhibit diffusion of impurities into the oxide 230b from the components formed above the oxide 230c.

Note that the oxide 230 preferably has a stacked-layer structure of oxides that differ in the atomic ratio of metal atoms. Specifically, the atomic ratio of the element M to the constituent elements in the metal oxide used for the oxide 230a is preferably greater than the atomic ratio of the element M to the constituent elements in the metal oxide used for the oxide 230b. Moreover, the atomic ratio of the element M to In in the metal oxide used for the oxide 230a is preferably greater than the atomic ratio of the element M to In in the metal oxide used for the oxide 230b. Furthermore, the atomic ratio of In to the element M in the metal oxide used for the oxide 230b is preferably greater than the atomic ratio of In to the element M in the metal oxide used for the oxide 230a. A metal oxide that can be used for the oxide 230a or the oxide 230b can be used for the oxide 230c.

The oxide 230b and the oxide 230c preferably have crystallinity. For example, a CAAC-OS (c-axis aligned crystalline oxide semiconductor) described later is preferably used. An oxide having crystallinity, such as a CAAC-OS, has a dense structure with small amounts of impurities and defects (e.g., oxygen vacancies) and high crystallinity. This can inhibit oxygen extraction from the oxide 230b by the source electrode or the drain electrode. This can reduce oxygen extraction from the oxide 230b even when heat treatment is performed; thus, the transistor 200 is stable with respect to high temperatures in a manufacturing process (what is called thermal budget).

The conduction band minimum of each of the oxide 230a and the oxide 230c is preferably closer to the vacuum level than the conduction band minimum of the oxide 230b. In other words, the electron affinity of each of the oxide 230a and the oxide 230c is preferably smaller than the electron affinity of the oxide 230b. In that case, a metal oxide that can be used for the oxide 230a is preferably used for the oxide 230c. Specifically, the atomic ratio of the element M to the constituent elements in the metal oxide used for the oxide 230c is preferably greater than the atomic ratio of the element M to the constituent elements in the metal oxide used for the oxide 230b. Moreover, the atomic ratio of the element M to In in the metal oxide used for the oxide 230c is preferably greater than the atomic ratio of the element M to In in the metal oxide used for the oxide 230b. Furthermore, the atomic ratio of In to the element M in the metal oxide used for the oxide 230b is preferably greater than the atomic ratio of In to the element M in the metal oxide used for the oxide 230c.

The conduction band minimum gradually changes at a junction portion of the oxide 230a, the oxide 230b, and the oxide 230c. In other words, the conduction band minimum at a junction portion of the oxide 230a, the oxide 230b, and the oxide 230c continuously changes or is continuously connected. To obtain this, the density of defect states in a mixed layer formed at an interface between the oxide 230a and the oxide 230b and an interface between the oxide 230b and the oxide 230c is preferably made low.

Specifically, when the oxide 230a and the oxide 230b or the oxide 230b and the oxide 230c contain the same element (as a main component) in addition to oxygen, a mixed layer with a low density of defect states can be formed. For example, in the case where the oxide 230b is an In—Ga—Zn oxide, an In—Ga—Zn oxide, a Ga—Zn oxide, gallium oxide, or the like may be used for the oxide 230a and the oxide 230c. In the case where the oxide 230c has a stacked-layer structure, it is possible to employ a stacked-layer structure of an In—Ga—Zn oxide and a Ga—Zn oxide over the In—Ga—Zn oxide, or a stacked-layer structure of an In—Ga—Zn oxide and gallium oxide over the In—Ga—Zn oxide, for example. In other words, a stacked-layer structure of an In—Ga—Zn oxide and an oxide that does not contain In may be used for the oxide 230c.

Specifically, as the oxide 230a, a metal oxide with In:Ga:Zn=1:3:4 [atomic ratio] or 1:1:0.5 [atomic ratio] is used. As the oxide 230b, a metal oxide with In:Ga:Zn=1:1:1 [atomic ratio], In:Ga:Zn=4:2:3 [atomic ratio], or In:Ga:Zn=3:1:2 [atomic ratio] is used. As the oxide 230c, a metal oxide with In:Ga:Zn=1:3:4 [atomic ratio], In:Ga:Zn=4:2:3 [atomic ratio], Ga:Zn=2:1 [atomic ratio], or Ga:Zn=2:5 [atomic ratio] is used. Specific examples of the oxide 230c having a stacked-layer structure include a stacked-layer structure of In:Ga:Zn=4:2:3 [atomic ratio] and In:Ga:Zn=1:3:4 [atomic ratio], a stacked-layer structure of In:Ga:Zn=4:2:3 [atomic ratio] and Ga:Zn=2:1 [atomic ratio], a stacked-layer structure of In:Ga:Zn=4:2:3 [atomic ratio] and Ga:Zn=2:5 [atomic ratio], and a stacked-layer structure of In:Ga:Zn=4:2:3 [atomic ratio] and gallium oxide.

When the metal oxide is formed by a sputtering method, the aforementioned atomic ratio is not limited to the atomic ratio of the formed metal oxide and may be the atomic ratio of a sputtering target used for forming the metal oxide.

At this time, the oxide 230b serves as a main carrier path. Alternatively, in the case where the oxide 230c has a stacked-layer structure of two layers, not only the oxide 230b but also a lower layer in the oxide 230c serves as a main carrier path in some cases. When the oxide 230a and the oxide 230c have the above structure, the density of defect states at the interface between the oxide 230a and the oxide 230b and the interface between the oxide 230b and the oxide 230c can be made low. Thus, the influence of interface scattering on carrier conduction is small, and the transistor 200 can have a high on-state current and excellent frequency characteristics. Note that in the case where the oxide 230c has a stacked-layer structure, in addition to the effect of reducing the density of defect states at the interface between the oxide 230b and the oxide 230c, the effect of inhibiting diffusion of the constituent element of the oxide 230c to the insulator 250 side is expected. More specifically, since the oxide 230c has a stacked-layer structure in which an oxide that does not contain In is positioned in the upper layer, the diffusion of In to the insulator 250 side can be inhibited. Since the insulator 250 functions as a gate insulator, the transistor exhibits poor characteristics when In enters the insulator 250 and the like. Thus, when the oxide 230c has a stacked-layer structure, a highly reliable semiconductor device can be provided.

The conductor 242 (the conductor 242a and the conductor 242b) functioning as the source electrode and the drain electrode is provided over the oxide 230b. The thickness of the conductor 242 is greater than or equal to 1 nm and less than or equal to 50 nm, preferably greater than or equal to 2 nm and less than or equal to 25 nm, for example.

For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements as its component; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

Like the insulator 214 and the like, the insulator 254 preferably functions as a barrier insulating film that inhibits diffusion of impurities such as water and hydrogen into the transistor 200 from the insulator 280 side. For example, the insulator 254 preferably has lower hydrogen permeability than the insulator 224. Furthermore, as illustrated in FIG. 2(B), the insulator 254 is preferably in contact with the top surface and the side surface of the conductor 242a, the top surface and the side surface of the conductor 242b, the side surfaces of the oxide 230a and the oxide 230b, and part of the top surface of the insulator 224. With such a structure, the insulator 280 is isolated from the insulator 224, the oxide 230a, and the oxide 230b by the insulator 254. Accordingly, hydrogen contained in the insulator 280 can be inhibited from diffusing into the oxide 230a and the oxide 230b; hence, the transistor 200 can have favorable electrical characteristics and reliability.

It is also preferable that the insulator 254 have a function of inhibiting diffusion of oxygen (e.g., at least one of an oxygen atom, an oxygen molecule, and the like) (or be less likely to transmit the above oxygen). For example, the insulator 254 preferably has lower oxygen permeability than the insulator 280 or the insulator 224.

The insulator 254 is preferably formed by a sputtering method. When the insulator 254 is formed by a sputtering method in an oxygen-containing atmosphere, oxygen can be added to the vicinity of a region of the insulator 224 that is in contact with the insulator 254. Accordingly, oxygen can be supplied from the region to the oxide 230 through the insulator 224. Here, with the insulator 254 having a function of inhibiting upward oxygen diffusion, oxygen can be prevented from diffusing from the oxide 230 into the insulator 280. Moreover, with the insulator 222 having a function of inhibiting downward oxygen diffusion, oxygen can be prevented from diffusing from the oxide 230 to the substrate side. In this manner, oxygen is supplied to the channel formation region of the oxide 230. Accordingly, oxygen vacancies in the oxide 230 can be reduced, so that the transistor can be inhibited from becoming normally on.

An insulator containing an oxide of one or both of aluminum and hafnium is preferably formed as the insulator 254, for example. In this case, the insulator 254 is preferably formed by an atomic layer deposition (ALD) method. An ALD method is a deposition method that provides good coverage, and thus can prevent formation of disconnection or the like due to unevenness of the insulator 254.

An insulator containing aluminum nitride may be used as the insulator 254, for example. It is preferable to use a nitride insulator that satisfies the composition formula AlNx (x is a real number greater than 0 and less than or equal to 2, preferably x is a real number greater than 0.5 and less than or equal to 1.5) as the insulator 254. Accordingly, a film having an excellent insulating property and high thermal conductivity can be obtained, and thus dissipation of heat generated in driving the transistor 200 can be increased. Alternatively, aluminum titanium nitride, titanium nitride, or the like can be used as the insulator 254. In that case, deposition by a sputtering method is preferable because deposition can be performed without using a highly oxidizing gas such as oxygen or ozone as a deposition gas. Alternatively, silicon nitride, silicon nitride oxide, or the like can be used.

An oxide containing gallium may be used for the insulator 254, for example. An oxide containing gallium is preferable because it sometimes has a function of inhibiting diffusion of one or both of hydrogen and oxygen. Note that gallium oxide, gallium zinc oxide, indium gallium zinc oxide, or the like is preferably used as an oxide containing gallium. In the case where indium gallium zinc oxide is used, the atomic proportion of gallium in the oxide is preferably high.

The insulator 254 can have a multilayer structure of two or more layers. For example, the insulator 254 may have a two-layer structure in which the first layer is formed by a sputtering method in an oxygen-containing atmosphere and then the second layer is formed by an ALD method. An ALD method is a deposition method that provides good coverage, and thus can prevent formation of disconnection or the like due to unevenness of the first layer. Note that in the case of employing a multilayer structure of two or more layers, the insulator 254 may have a multilayer structure using different materials. For example, a stacked-layer structure of silicon oxide, silicon oxynitride, silicon nitride oxide, or silicon nitride and an insulator having a function of inhibiting the passage of oxygen and impurities such as hydrogen may be employed. As the insulator having a function of inhibiting the passage of oxygen and impurities such as hydrogen, an insulator containing an oxide of one or both of aluminum and hafnium can be used, for example.

The insulator 250 functions as a gate insulator. The insulator 250 is preferably positioned in contact with at least part of the oxide 230c. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used. In particular, silicon oxide and silicon oxynitride, which have thermal stability, are preferable.

Like the insulator 224, the insulator 250 is preferably formed using an insulator from which oxygen is released by heating. When an insulator from which oxygen is released by heating is provided as the insulator 250 in contact with at least part of the oxide 230c, oxygen can be effectively supplied to the channel formation region of the oxide 230b. Furthermore, as in the insulator 224, the concentration of impurities such as water and hydrogen in the insulator 250 is preferably reduced. The thickness of the insulator 250 is preferably greater than or equal to 1 nm and less than or equal to 20 nm.

Furthermore, a metal oxide may be provided between the insulator 250 and the conductor 260. The metal oxide preferably inhibits diffusion of oxygen from the insulator 250 into the conductor 260. Providing the metal oxide that inhibits oxygen diffusion suppresses diffusion of oxygen from the insulator 250 into the conductor 260. That is, a reduction in the amount of oxygen supplied to the oxide 230 can be inhibited. Furthermore, oxidation of the conductor 260 due to oxygen from the insulator 250 can be inhibited.

Note that the metal oxide functions as part of the gate insulator in some cases. Therefore, when silicon oxide, silicon oxynitride, or the like is used for the insulator 250, a metal oxide that is a high-k material with a high dielectric constant is preferably used as the metal oxide. When the gate insulator has a stacked-layer structure of the insulator 250 and the metal oxide, the stacked-layer structure can be thermally stable and have a high dielectric constant. Thus, a gate potential that is applied during operation of the transistor can be reduced while the physical thickness of the gate insulator is maintained. Furthermore, the equivalent oxide thickness (EOT) of the insulator functioning as the gate insulator can be reduced.

The metal oxide may have a function of part of the first gate electrode. For example, an oxide semiconductor that can be used for the oxide 230 can be used as the metal oxide. In that case, when the conductor 260 is formed by a sputtering method, the metal oxide can have a reduced electric resistance to be a conductor. This can be referred to as an OC (Oxide Conductor) electrode.

With the metal oxide, the on-state current of the transistor 200 can be increased without a reduction in the influence of electric fields from the conductor 260. Since the distance between the conductor 260 and the oxide 230 is kept by the physical thicknesses of the insulator 250 and the metal oxide, leakage current between the conductor 260 and the oxide 230 can be reduced. Moreover, when the stacked-layer structure of the insulator 250 and the metal oxide is provided, the physical distance between the conductor 260 and the oxide 230 and the intensity of electric fields applied to the oxide 230 from the conductor 260 can be easily adjusted as appropriate.

Specifically, a metal oxide containing one kind or two or more kinds selected from hafnium, aluminum, gallium, yttrium, zirconium, tungsten, titanium, tantalum, nickel, germanium, magnesium, and the like can be used. In particular, aluminum oxide, hafnium oxide, an oxide containing aluminum and hafnium (hafnium aluminate), or the like, which is an insulator containing an oxide of one or both of aluminum and hafnium, is preferably used. Furthermore, the oxide semiconductor that can be used for the oxide 230 can also be used for the metal oxide when the resistance thereof is reduced.

Although FIG. 2(B) and FIG. 2(C) illustrate the conductor 260 having a two-layer structure, the conductor 260 may have a single-layer structure or a stacked-layer structure of three or more layers.

For the conductor 260a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like).

When the conductor 260a has a function of inhibiting oxygen diffusion, the conductivity of the conductor 260b can be inhibited from being lowered because of oxidation due to oxygen contained in the insulator 250. As a conductive material that has a function of inhibiting oxygen diffusion, for example, tantalum, tantalum nitride, ruthenium, ruthenium oxide, or the like is preferably used.

The conductor 260 also functions as a wiring and thus is preferably formed using a conductor having high conductivity. For example, a conductive material containing tungsten, copper, or aluminum as its main component can be used for the conductor 260b. The conductor 260b may have a stacked-layer structure, for example, a stacked-layer structure of any of the above conductive materials and titanium or titanium nitride.

The insulator 280 is provided over the insulator 224, the oxide 230, and the conductor 242 with the insulator 254 therebetween. For example, as the insulator 280, silicon oxide, silicon oxynitride, silicon nitride oxide, silicon oxide to which fluorine is added, silicon oxide to which carbon is added, silicon oxide to which carbon and nitrogen are added, porous silicon oxide, or the like is preferably included. In particular, silicon oxide and silicon oxynitride, which have thermal stability, are preferable. Materials such as silicon oxide, silicon oxynitride, and porous silicon oxide, in each of which a region containing oxygen released by heating can be easily formed, are particularly preferable.

The concentration of impurities such as water and hydrogen in the insulator 280 is preferably reduced. The insulator 280 may have a stacked-layer structure of two or more layers. In addition, the top surface of the insulator 280 may be planarized.

Like the insulator 214 and the like, the insulator 274 preferably functions as a barrier insulating film that inhibits diffusion of impurities such as water and hydrogen into the insulator 280 from above. As the insulator 274, for example, an insulator that can be used as the insulator 214, the insulator 254, and the like can be used.

The insulator 281 functioning as an interlayer film is preferably provided over the insulator 274. As in the insulator 224 and the like, the concentration of impurities such as water and hydrogen in the insulator 281 is preferably reduced.

The conductor 240a and the conductor 240b are positioned in openings formed in the insulator 281, the insulator 274, the insulator 280, and the insulator 254. The conductor 240a and the conductor 240b are provided to face each other with the conductor 260 therebetween. Note that top surfaces of the conductor 240a and the conductor 240b may be on the same plane as the top surface of the insulator 281.

Note that the insulator 241a is provided in contact with a side wall of the opening in the insulator 281, the insulator 274, the insulator 280, and the insulator 254, and the first conductor of the conductor 240a is formed on a side surface of the insulator 241a. The conductor 242a is located on at least part of the bottom portion of the opening, and the conductor 240a is in contact with the conductor 242a. Similarly, the insulator 241b is provided in contact with a side wall of the opening in the insulator 281, the insulator 274, the insulator 280, and the insulator 254, and the first conductor of the conductor 240b is formed on a side surface of the insulator 241b. The conductor 242b is located on at least part of the bottom portion of the opening, and the conductor 240b is in contact with the conductor 242b.

For the conductor 240a and the conductor 240b, a conductive material containing tungsten, copper, or aluminum as its main component is preferably used. In addition, the conductor 240a and the conductor 240b may have a stacked-layer structure.

In the case where the conductor 240a and the conductor 240b have a stacked-layer structure, a conductive material having a function of inhibiting the passage of impurities such as water and hydrogen is preferably used for a conductor in contact with the oxide 230a, the oxide 230b, the conductor 242, the insulator 254, the insulator 280, the insulator 274, and the insulator 281. For example, tantalum, tantalum nitride, titanium, titanium nitride, ruthenium, ruthenium oxide, or the like is preferably used. The conductive material having a function of inhibiting the passage of impurities such as water and hydrogen may be used as a single layer or stacked layers. The use of the conductive material can prevent oxygen added to the insulator 280 from being absorbed by the conductor 240a and the conductor 240b. Moreover, impurities such as water and hydrogen contained in a layer above the insulator 281 can be inhibited from diffusing into the oxide 230 through the conductor 240a and the conductor 240b.

An insulator that can be used as the insulator 254 and the like is used as the insulator 241a and the insulator 241b, for example. Since the insulator 241a and the insulator 241b are provided in contact with the insulator 254, impurities such as water and hydrogen contained in the insulator 280 and the like can be inhibited from diffusing into the oxide 230 through the conductor 240a and the conductor 240b. In addition, oxygen contained in the insulator 280 can be prevented from being absorbed by the conductor 240a and the conductor 240b. Note that the insulator 241a and the insulator 241b can be formed by an ALD method or a chemical vapor deposition (CVD) method.

In addition, although not illustrated, a conductor functioning as a wiring may be provided in contact with the top surface of the conductor 240a and the top surface of the conductor 240b. For the conductor functioning as a wiring, a conductive material containing tungsten, copper, or aluminum as its main component is preferably used. Furthermore, the conductor may have a stacked-layer structure, for example, a stack of the above conductive material and titanium or titanium nitride. Note that the conductor may be formed to be embedded in an opening provided in an insulator.

In addition, although not illustrated, an insulator having resistivity higher than or equal to $1.0 \times 10^{13}$ Ωcm and lower than or equal to $1.0 \times 10^{15}$ Ωcm, preferably higher than or equal to $5.0 \times 10^{13}$ Ωcm and lower than or equal to $5.0 \times 10^{14}$ Ωcm is preferably provided to cover the above conductor. It is preferable that an insulator having the above resistivity be provided over the conductor, in which case the insulator can disperse electric charge accumulated in the transistor 200 or between wirings of the conductor or the like and can inhibit poor characteristics and electrostatic breakdown of the transistor and an electronic device including the transistor due to the electric charge, while maintaining the insulating property.

<Constituent Material of Semiconductor Device>

Constituent materials that can be used for a semiconductor device are described below.

«Substrate»

As a substrate where the transistor 200 is formed, an insulator substrate, a semiconductor substrate, or a conductor substrate is used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate using silicon or germanium as a material and a compound semiconductor substrate made of silicon carbide, silicon germanium, gallium arsenide, indium phosphide, zinc oxide, or gallium oxide. Another example is a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor, a resistor, a switching element, a light-emitting element, and a memory element.

«Insulator»

Examples of an insulator include an oxide, a nitride, an oxynitride, a nitride oxide, a metal oxide, a metal oxynitride, and a metal nitride oxide, each of which has an insulating property.

As miniaturization and high integration of transistors progress, for example, a problem such as leakage current may arise because of a thinner gate insulator. When a high-k material is used for the insulator functioning as a gate insulator, the voltage during operation of the transistor can be reduced while the physical thickness of the gate insulator is kept. By contrast, when a material with a low dielectric constant is used for the insulator functioning as an interlayer film, parasitic capacitance generated between wirings can be reduced. Thus, a material is preferably selected depending on the function of an insulator.

Examples of the insulator with a high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator with a low dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor using an oxide semiconductor is surrounded by insulators having a function of inhibiting the passage of oxygen and impurities such as hydrogen (the insulator 214, the insulator 222, the insulator 254, the insulator 274, and the like), the electrical characteristics of the transistor can be stable. For the insulator having a function of inhibiting the passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum can be used. Specifically, as the insulator having a function of inhibiting the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide or a metal nitride such as aluminum nitride, aluminum titanium nitride, titanium nitride, silicon nitride oxide, or silicon nitride can be used.

In addition, the insulator functioning as the gate insulator is preferably an insulator including a region containing oxygen released by heating. For example, when a structure is employed in which silicon oxide or silicon oxynitride including a region containing oxygen released by heating is in contact with the oxide 230, oxygen vacancies included in the oxide 230 can be filled.

«Conductor»

For the conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements as its component; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. A semiconductor having high electric conductivity, typified by polycrystalline silicon containing an impurity element such as phosphorus, or silicide such as nickel silicide may be used.

A stack including a plurality of conductive layers formed of the above materials may be used. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed.

Note that when an oxide is used for the channel formation region of the transistor, a stacked-layer structure combining a material containing the above metal element and a conductive material containing oxygen is preferably used for the conductor functioning as the gate electrode. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide where the channel is formed. Alternatively, a conductive material containing the above metal element and nitrogen may be used. For example, a conductive material containing nitrogen, such as titanium nitride or tantalum nitride, may be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With the use of such a material, hydrogen contained in the metal oxide where the channel is formed can be trapped in some cases. Alternatively, hydrogen entering from an external insulator or the like can be trapped in some cases.

«Metal Oxide»

As the oxide 230, a metal oxide functioning as an oxide semiconductor is preferably used. A metal oxide that can be used as the oxide 230 of the present invention is described below.

The metal oxide preferably contains at least indium or zinc. In particular, indium and zinc are preferably contained. Moreover, aluminum, gallium, yttrium, tin, or the like is preferably contained in addition to them. Furthermore, one or more kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, an element M, and zinc is considered. Note that the element M is aluminum, gallium, yttrium, or tin. Examples of other elements that can be used as the element M include boron, titanium, iron, nickel, germanium, zirconium, molybdenum, lanthanum, cerium, neodymium, hafnium, tantalum, tungsten, and magnesium. Note that it is sometimes acceptable to use a plurality of the above-described elements in combination as the element M.

Note that in this specification and the like, a metal oxide containing nitrogen is also referred to as a metal oxide in some cases. A metal oxide containing nitrogen may be referred to as a metal oxynitride.

[Structure of Metal Oxide]

Oxide semiconductors (metal oxides) can be classified into a single crystal oxide semiconductor and a non-single-crystal oxide semiconductor. Examples of a non-single-crystal oxide semiconductor include a CAAC-OS, a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, an In layer) and a layer containing the element M, zinc, and oxygen (hereinafter, an (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can also be referred to as an (In,M) layer.

The CAAC-OS is a metal oxide with high crystallinity. By contrast, in the CAAC-OS, a reduction in electron mobility due to a crystal grain boundary is less likely to occur because it is difficult to observe a clear crystal grain boundary. Entry of impurities, formation of defects, or the like might decrease the crystallinity of a metal oxide, which means that the CAAC-OS is a metal oxide having small amounts of impurities and defects (e.g., oxygen vacancies). Thus, a metal oxide including a CAAC-OS is physically stable. Therefore, the metal oxide including a CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

Note that an In—Ga—Zn oxide (hereinafter, IGZO) that is a kind of metal oxide containing indium, gallium, and zinc has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor. The a-like OS includes a void or a low-density region. That is, the a-like OS has low crystallinity compared with the nc-OS and the CAAC-OS.

An oxide semiconductor (metal oxide) can have various structures which show different properties. Two or more of the amorphous oxide semiconductor, the polycrystalline oxide semiconductor, the a-like OS, the nc-OS, and the CAAC-OS may be included in an oxide semiconductor of one embodiment of the present invention.

[Impurity]

Here, the influence of each impurity in the metal oxide will be described.

When the metal oxide contains an alkali metal or an alkaline earth metal, defect states are formed and carriers are generated in some cases. Thus, a transistor using a metal oxide that contains an alkali metal or an alkaline earth metal for its channel formation region is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide obtained by SIMS is set lower than or equal to $1\times10^{18}$ atoms/cm$^3$, preferably lower than or equal to $2\times10^{16}$ atoms/cm$^3$.

Hydrogen contained in a metal oxide reacts with oxygen bonded to a metal atom to be water, and thus forms an oxygen vacancy in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor using a metal oxide containing hydrogen is likely to have normally-on characteristics.

Accordingly, hydrogen in the metal oxide is preferably reduced as much as possible. Specifically, the hydrogen concentration of the metal oxide obtained by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide in which impurities are sufficiently reduced is used in a channel formation region of a transistor, stable electrical characteristics can be given.

As a metal oxide used for a semiconductor of a transistor, a thin film having high crystallinity is preferably used. With the use of the thin film, the stability or reliability of the transistor can be improved. Examples of the thin film include a thin film of a single crystal metal oxide and a thin film of a polycrystalline metal oxide. However, to form the thin film of a single crystal metal oxide or the thin film of a polycrystalline metal oxide over a substrate, a high-temperature process or a laser heating process is needed. Thus, manufacturing cost is increased, and throughput is decreased.

Non-Patent Document 1 and Non-Patent Document 2 have reported that an In—Ga—Zn oxide having a CAAC structure (referred to as CAAC-IGZO) was found in 2009. Here, it has been reported that CAAC-IGZO has c-axis alignment, a crystal grain boundary is not clearly observed in CAAC-IGZO, and CAAC-IGZO can be formed over a substrate at low temperatures. It has also been reported that a transistor using CAAC-IGZO has excellent electrical characteristics and high reliability.

In addition, an In—Ga—Zn oxide having an nc structure (referred to as nc-IGZO) was found in 2013 (see Non-Patent Document 3). It has been reported that nc-IGZO has periodic atomic arrangement in a microscopic region (e.g., a region with a size greater than or equal to 1 nm and less than or equal to 3 nm) and there is no regularity of crystal orientation between different regions.

Non-Patent Document 4 and Non-Patent Document 5 have shown changes in average crystal size due to electron beam irradiation to thin films of CAAC-IGZO, nc-IGZO, and IGZO having low crystallinity. In the thin film of IGZO having low crystallinity, crystalline IGZO with a size of approximately 1 nm was observed even before electron beam irradiation. Thus, here, it has been reported that the existence of a completely amorphous structure could not be observed in IGZO. In addition, it has been shown that the thin film of CAAC-IGZO and the thin film of nc-IGZO each have higher stability to electron beam irradiation than the thin film of IGZO having low crystallinity. Thus, the thin film of CAAC-IGZO or the thin film of nc-IGZO is preferably used for the semiconductor of the transistor.

Non-Patent Document 6 shows that a transistor using a metal oxide has an extremely low leakage current in a non-conduction state; specifically, the off-state current per micrometer of the channel width of the transistor is in the order of yA/µm ($10^{-24}$ A/µm). For example, a CPU with low power consumption utilizing a characteristic of a low leakage current of a transistor using a metal oxide is disclosed (see Non-Patent Document 7).

Furthermore, an application of a transistor using a metal oxide to a display device utilizing the characteristic of a low leakage current of the transistor has been reported (see Non-Patent Document 8). In the display device, a displayed image is changed several tens of times per second. The number of times an image is changed per second is referred to as a refresh rate. The refresh rate is also referred to as drive frequency. Such high-speed screen change that is hard for human eyes to recognize is considered as a cause of eyestrain. In view of this, it is proposed that the refresh rate of the display device is lowered to reduce the number of times of image rewriting. Moreover, driving with a lowered refresh rate can reduce the power consumption of the display device. Such a driving method is referred to as idling stop (IDS) driving.

The discovery of the CAAC structure and the nc structure has contributed to an improvement in electrical characteristics and reliability of a transistor using a metal oxide having the CAAC structure or the nc structure, a reduction in manufacturing cost, and an improvement in throughput. Furthermore, applications of the transistor to a display device and an LSI utilizing the characteristic of a low leakage current of the transistor have been studied.

<Method for Manufacturing Semiconductor Device>

Next, a method for manufacturing the semiconductor device of one embodiment of the present invention illustrated in FIG. 2(A) to FIG. 2(C) is described with reference to FIG. 4(A) to FIG. 11(A), FIG. 4(B) to FIG. 11(B), and FIG. 4(C) to FIG. 11(C). FIG. 4(A) to FIG. 11(A) illustrate top views. FIG. 4(B) to FIG. 11(B) are cross-sectional views corresponding to a portion indicated by the dashed-dotted line A1-A2 in FIG. 4(A) to FIG. 11(A), and are also cross-sectional views of the transistor 200 in the channel length direction. FIG. 4(C) to FIG. 11(C) are cross-sectional views corresponding to a portion indicated by the dashed-dotted line A3-A4 in FIG. 4(A) to FIG. 11(A), and are also cross-sectional views of the transistor 200 in the channel width direction. Note that for clarity of the drawings, some components are omitted in the top views of FIG. 4(A) to FIG. 11(A).

First, a substrate (not illustrated) is prepared, and the insulator 214 is formed over the substrate. The insulator 214 can be formed by a sputtering method, a CVD method, a molecular beam epitaxy (MBE) method, a pulsed laser deposition (PLD) method, an ALD method, or the like.

Note that CVD methods can be classified into a plasma enhanced CVD (PECVD) method using plasma, a thermal CVD (TCVD) method using heat, a photo CVD method using light, and the like. Moreover, the CVD methods can be classified into a metal CVD (MCVD) method and a metal organic CVD (MOCVD) method depending on a source gas to be used.

By a plasma CVD method, a high-quality film can be obtained at a relatively low temperature. Furthermore, a thermal CVD method is a deposition method that does not use plasma and thus enables less plasma damage to an object to be processed. For example, a wiring, an electrode, an element (e.g., a transistor and a capacitor), and the like included in a semiconductor device might be charged up by receiving electric charge from plasma. In that case, accumulated electric charge might break the wiring, the electrode, the element, and the like included in the semiconductor device. By contrast, such plasma damage does not occur in the case of a thermal CVD method that does not use plasma, and thus the yield of the semiconductor device can be increased. In addition, the thermal CVD method does not cause plasma damage during deposition, so that a film with few defects can be obtained.

In an ALD method, one atomic layer can be deposited at a time using self-regulating characteristics of atoms. Thus, the ALD method has advantages such as deposition of an extremely thin film, deposition on a component with a high aspect ratio, deposition of a film with a small number of defects such as pinholes, deposition with good coverage, and low-temperature deposition. Furthermore, the ALD method includes a PEALD (Plasma Enhanced ALD) method using plasma. The use of plasma is sometimes preferable because deposition at lower temperature is possible. Note that a precursor used in the ALD method sometimes contains impurities such as carbon. For that reason, in some cases, a film provided by the ALD method contains impurities such as carbon in a larger amount than a film provided by another deposition method. Note that impurities can be quantified by X-ray photoelectron spectroscopy (XPS).

Unlike a deposition method in which particles ejected from a target or the like are deposited, a CVD method and an ALD method are deposition methods in which a film is formed by reaction at a surface of an object. Thus, a CVD method and an ALD method are deposition methods that enable favorable step coverage almost regardless of the shape of an object. In particular, an ALD method enables excellent step coverage and excellent thickness uniformity and can be suitably used to cover a surface of an opening portion with a high aspect ratio, for example. On the other hand, an ALD method has a relatively low deposition rate, and thus is preferably used in combination with another deposition method with a high deposition rate, such as a CVD method, in some cases.

When a CVD method or an ALD method is used, the composition of a film to be formed can be controlled with the flow rate ratio of source gases. For example, by a CVD method or an ALD method, a film with a certain composition can be formed depending on the flow rate ratio of the source gases. Moreover, with a CVD method or an ALD method, by changing the flow rate ratio of the source gases while forming a film, a film whose composition is continuously changed can be formed. In the case of forming a film while changing the flow rate ratio of source gases, as compared with the case of forming a film with the use of a plurality of deposition chambers, time taken for the film formation can be shortened because time taken for transfer and pressure adjustment is not required. Thus, the productivity of the semiconductor device can be increased in some cases.

In this embodiment, for the insulator 214, aluminum oxide or silicon nitride is formed by a sputtering method. In addition, the insulator 214 may have a multilayer structure. For example, a structure may be employed in which aluminum oxide is formed by a sputtering method and aluminum oxide is formed over the aluminum oxide by an ALD method. Alternatively, a structure may be employed in which aluminum oxide is formed by an ALD method and aluminum oxide is formed over the aluminum oxide by a sputtering method.

Next, the insulator 216 is formed over the insulator 214. The insulator 216 can be formed by a sputtering method, a CVD method, an MBE method, a PLD method, an ALD method, or the like. In this embodiment, for the insulator 216, silicon oxynitride is formed by a CVD method or silicon oxide is formed by a sputtering method.

Then, an opening reaching the insulator 214 is formed in the insulator 216. Examples of the opening include a groove and a slit. A region where the opening is formed may be referred to as an opening portion. Wet etching may be used for the formation of the opening; however, dry etching is preferably used for microfabrication. As the insulator 214, it is preferable to select an insulator that functions as an etching stopper film used in forming the groove by etching the insulator 216. For example, in the case where silicon oxide is used for the insulator 216 in which the groove is to be formed, silicon nitride, aluminum oxide, or hafnium oxide is preferably used for the insulator 214.

As a dry etching apparatus, a capacitively coupled plasma (CCP) etching apparatus including parallel plate electrodes can be used. The capacitively coupled plasma etching apparatus including the parallel plate electrodes may have a structure in which a high-frequency voltage is applied to one of the parallel plate electrodes. Alternatively, a structure may be employed in which different high-frequency voltages are applied to one of the parallel plate electrodes. Alternatively, a structure may be employed in which high-frequency voltages with the same frequency are applied to the parallel plate electrodes. Alternatively, a structure may be employed in which high-frequency voltages with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus or the like can be used, for example.

After the formation of the opening, a conductive film to be the first conductor of the conductor 205 is formed. The conductive film desirably includes a conductor that has a function of inhibiting the passage of oxygen. For example, tantalum nitride, tungsten nitride, or titanium nitride can be used. Alternatively, a stacked-layer film of the above conductor and tantalum, tungsten, titanium, molybdenum, aluminum, copper, or a molybdenum-tungsten alloy can be used. The conductive film can be formed by a sputtering method, a CVD method, an MBE method, a PLD method, an ALD method, or the like.

In this embodiment, as the conductive film to be the first conductor of the conductor 205, a tantalum nitride film or a film of tantalum nitride and titanium nitride stacked thereover is formed by a sputtering method. With the use of such a metal nitride as the first conductor of the conductor 205, even when a metal that easily diffuses, such as copper, is used for the second conductor of the conductor 205 described later, the metal can be prevented from diffusing outward through the first conductor of the conductor 205.

Next, a conductive film to be the second conductor of the conductor 205 is formed over the conductive film to be the first conductor of the conductor 205. The conductive film can be formed by a plating method, a sputtering method, a CVD method, an MBE method, a PLD method, an ALD method, or the like. In this embodiment, tungsten is deposited for the conductive film.

Next, CMP (Chemical Mechanical Polishing) treatment is performed to partly remove the conductive film to be the first conductor of the conductor 205 and the conductive film to be the second conductor of the conductor 205 to expose the insulator 216. As a result, the conductive film to be the first conductor of the conductor 205 and the conductive film to be the second conductor of the conductor 205 remain only in the opening portion. Thus, the conductor 205 including the first conductor of the conductor 205 and the second conductor of the conductor 205, which has a flat top surface, can be formed (see FIG. 4(A) to FIG. 4(C)). Note that the insulator 216 is partly removed by the CMP treatment in some cases.

Note that after the conductor 205 is formed, part of the second conductor of the conductor 205 may be removed, a conductive film may be formed over the conductor 205 and the insulator 216, and CMP treatment may be performed. By the CMP treatment, part of the conductive film is removed to expose the insulator 216. Note that part of the second conductor of the conductor 205 is preferably removed by a dry etching method or the like. The conductive film is preferably formed using a material similar to that for the first conductor of the conductor 205 and the second conductor of the conductor 205.

Through the above steps, the conductor 205 including the conductive film, which has a flat top surface, can be formed. The improvement in planarity of the top surfaces of the insulator 216 and the conductor 205 results in improved crystallinity of the CAAC-OS that forms the oxide 230b and the oxide 230c.

Here, a method for forming the conductor 205 that is different from the above will be described below.

The conductive film to be the conductor 205 is formed over the insulator 214. The conductive film can be formed by a sputtering method, a CVD method, an MBE method, a PLD method, an ALD method, or the like. In addition, the conductive film can be a multilayer film. For example, tungsten is deposited for the conductive film.

Next, the conductive film to be the conductor 205 is processed by a lithography method, so that the conductor 205 is formed.

Note that in the lithography method, first, a resist is exposed to light through a mask. Next, a region exposed to light is removed or left using a developer, so that a resist mask is formed. Then, etching treatment through the resist mask is conducted, whereby a conductor, a semiconductor, an insulator, or the like can be processed into a desired shape. The resist mask is formed by, for example, exposure of the resist to light such as KrF excimer laser light, ArF excimer laser light, or EUV (Extreme Ultraviolet) light. Alternatively, a liquid immersion technique may be employed in which a gap between a substrate and a projection lens is filled with liquid (e.g., water) in light exposure. Alternatively, an electron beam or an ion beam may be used instead of the light. Note that a mask is unnecessary in the case of using an electron beam or an ion beam. Note that the resist mask can be removed by dry etching treatment such as ashing, wet etching treatment, wet etching treatment after dry etching treatment, or dry etching treatment after wet etching treatment.

In addition, a hard mask formed of an insulator or a conductor may be used instead of the resist mask. In the case where a hard mask is used, a hard mask with a desired shape can be formed by forming an insulating film or a conductive film to be a hard mask material over the conductive film to be the conductor 205, forming a resist mask thereover, and then etching the hard mask material. The etching of the conductive film to be the conductor 205 may be performed after removal of the resist mask or with the resist mask remaining. In the latter case, the resist mask sometimes disappears during the etching. The hard mask may be removed by etching after the etching of the conductive film to be the conductor 205. Meanwhile, the hard mask is not necessarily removed when the hard mask material does not affect the following process or can be utilized in the following process.

Next, an insulating film to be the insulator 216 is formed over the insulator 214 and the conductor 205. The insulating film is formed to be in contact with the top surface and side surface of the conductor 205. The insulating film can be formed by a sputtering method, a CVD method, an MBE method, a PLD method, an ALD method, or the like.

Here, the thickness of the insulating film to be the insulator 216 is preferably greater than or equal to the thickness of the conductor 205. For example, when the thickness of the conductor 205 is 1, the thickness of the insulating film to be the insulator 216 is greater than or equal to 1 and less than or equal to 3. In this embodiment, the thickness of the conductor 205 is 150 nm, and the thickness of the insulating film to be the insulator 216 is 350 nm.

Next, CMP treatment is performed on the insulating film to be the insulator 216, so that part of the insulating film to be the insulator 216 is removed and a surface of the conductor 205 is exposed. Thus, the conductor 205 and the insulator 216 in contact with the side surface of the conductor 205, each of which has a flat top surface, can be formed. The above is another method for forming the conductor 205.

Next, the insulator 222 is formed over the insulator 216 and the conductor 205. An insulator containing an oxide of one or both of aluminum and hafnium is preferably formed as the insulator 222. The insulator containing an oxide of one or both of aluminum and hafnium has a barrier property against oxygen, hydrogen, and water. When the insulator 222 has a barrier property against hydrogen and water, hydrogen and water contained in components provided around the transistor 200 are inhibited from diffusing into the transistor 200 through the insulator 222, and generation of oxygen vacancies in the oxide 230 can be inhibited.

The insulator 222 can be formed by a sputtering method, a CVD method, an MBE method, a PLD method, an ALD method, or the like. In this embodiment, for the insulator 222, hafnium oxide is formed by an ALD method.

Next, heat treatment is preferably performed. The heat treatment is performed at a temperature higher than or equal to 250° C. and lower than or equal to 650° C., preferably higher than or equal to 300° C. and lower than or equal to 500° C., further preferably higher than or equal to 320° C. and lower than or equal to 450° C. Note that the heat treatment is performed in a nitrogen gas or inert gas atmosphere, or an atmosphere containing an oxidizing gas at 10 ppm or more, 1% or more, or 10% or more. Alternatively, the heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen.

In this embodiment, the heat treatment is performed in such a manner that treatment is performed at 400° C. in a nitrogen atmosphere for one hour after the formation of the insulator 222, and then another treatment is successively performed at 400° C. in an oxygen atmosphere for one hour. By the heat treatment, impurities such as water and hydrogen contained in the insulator 222 can be removed, for example. The heat treatment can also be performed after the formation of the insulator 224, for example.

Next, the insulator 224 is formed over the insulator 222. The insulator 224 can be formed by a sputtering method, a CVD method, an MBE method, a PLD method, an ALD method, or the like. In this embodiment, as the insulator 224, a silicon oxynitride film is formed by a CVD method or a silicon oxide film is formed by a sputtering method.

Here, in order to form an excess-oxygen region in the insulator 224, plasma treatment with oxygen may be performed under reduced pressure. For the plasma treatment with oxygen, an apparatus including a power source for generating high-density plasma using microwaves is preferably used, for example. Alternatively, a power source for applying an RF (Radio Frequency) to a substrate side may be included. The use of high-density plasma enables high-density oxygen radicals to be produced, and RF application to the substrate side allows the oxygen radicals produced by the high-density plasma to be efficiently introduced into the insulator 224. Alternatively, after plasma treatment with an inert gas is performed using this apparatus, plasma treatment with oxygen may be performed to compensate for released oxygen. Note that impurities such as water and hydrogen contained in the insulator 224 can be removed by appropriate selection of the conditions of the plasma treatment. In that case, the heat treatment does not need to be performed.

Here, after aluminum oxide is formed over the insulator 224 by a sputtering method, for example, CMP treatment may be performed until the insulator 224 is exposed. The CMP treatment can planarize and smooth the surface of the insulator 224. When the CMP treatment is performed on the aluminum oxide placed over the insulator 224, it is easy to detect the endpoint of the CMP treatment. Although part of the insulator 224 is polished by the CMP treatment and the thickness of the insulator 224 is reduced in some cases, the thickness is adjusted when the insulator 224 is formed.

Planarizing and smoothing the surface of the insulator 224 can prevent deterioration of the coverage with an oxide formed later and a decrease in the yield of the semiconductor device in some cases. The formation of aluminum oxide over the insulator 224 by a sputtering method is preferred because oxygen can be added to the insulator 224.

Next, an oxide film 230A to be the oxide 230a and an oxide film 230B to be the oxide 230b are formed in this order over the insulator 224 (see FIG. 4(B) and FIG. 4(C)). Note that the oxide films are preferably formed successively without being exposed to an atmospheric environment. By the film formation without exposure to the air, impurities or moisture from the atmospheric environment can be prevented from being attached onto the oxide film 230A and the oxide film 230B, so that the vicinity of the interface between the oxide film 230A and the oxide film 230B can be kept clean.

The oxide film 230A and the oxide film 230B can be formed by a sputtering method, a CVD method, an MBE method, a PLD method, an ALD method, or the like.

In the case where the oxide film 230A and the oxide film 230B are formed by a sputtering method, for example, oxygen or a mixed gas of oxygen and a rare gas is used as a sputtering gas. Increasing the proportion of oxygen contained in the sputtering gas can increase the amount of excess oxygen in the formed oxide films. In the case where the oxide films are formed by a sputtering method, the above In-M-Zn oxide target and the like can be used. Furthermore, a direct current (DC) power source or an alternating current (AC) power source such as a radio frequency (RF) power source is connected to a target, and required power can be applied depending on the electric conductivity of the target.

In particular, at the time of forming the oxide film 230A, part of oxygen contained in the sputtering gas is supplied to the insulator 224 in some cases. Thus, the proportion of oxygen contained in the sputtering gas is higher than or equal to 70%, preferably higher than or equal to 80%, further preferably 100%.

In the case where the oxide film 230B is formed by a sputtering method and the proportion of oxygen contained in the sputtering gas for deposition is higher than 30% and lower than or equal to 100%, preferably higher than or equal to 70% and lower than or equal to 100%, an oxygen-excess oxide semiconductor is formed. In a transistor using an oxygen-excess oxide semiconductor for its channel formation region, comparatively high reliability can be obtained. Note that one embodiment of the present invention is not limited thereto. In the case where the oxide film 230B is formed by a sputtering method and the proportion of oxygen contained in the sputtering gas for deposition is higher than or equal to 1% and lower than or equal to 30%, preferably higher than or equal to 5% and lower than or equal to 20%, an oxygen-deficient oxide semiconductor is formed. In a transistor using an oxygen-deficient oxide semiconductor for its channel formation region, comparatively high field-effect mobility can be obtained. Furthermore, when deposition is performed while the substrate is heated, the crystallinity of the oxide film can be improved.

In this embodiment, the oxide film 230A is formed by a sputtering method using an oxide target with In:Ga:Zn=1:3:4 [atomic ratio]. In addition, the oxide film 230B is formed by a sputtering method using an oxide target with In:Ga:Zn=4:2:4.1 [atomic ratio]. Note that each of the oxide films is formed to have characteristics required for the oxide 230 by selecting the deposition condition and the atomic ratio as appropriate.

Here, the insulator 222, the insulator 224, the oxide film 230A, and the oxide film 230B are preferably formed without exposure to the air. For example, a multi-chamber deposition apparatus can be used.

Next, heat treatment may be performed. For the heat treatment, the conditions for the above heat treatment can be used. Through the heat treatment, impurities such as water and hydrogen in the oxide film 230A and the oxide film 230B can be removed, for example. In this embodiment, treatment is performed at 400° C. in a nitrogen atmosphere for one hour, and treatment is successively performed at 400° C. in an oxygen atmosphere for one hour.

Next, a conductive film 242A is formed over the oxide film 230B. The conductive film 242A can be formed by a sputtering method, a CVD method, an MBE method, a PLD method, an ALD method, or the like (see FIG. 4(B) and FIG. 4(C)). Note that heat treatment may be performed before the formation of the conductive film 242A. Heat treatment may be performed under reduced pressure, and the conductive film 242A may be successively formed without exposure to the air. The treatment can remove moisture and hydrogen adsorbed onto the surface of the oxide film 230B and the like, and further can reduce the moisture concentration and the hydrogen concentration of the oxide film 230A and the oxide film 230B. The heat treatment is preferably performed at a temperature higher than or equal to 100° C. and lower than or equal to 400° C. In this embodiment, the heat treatment is performed at 200° C.

Figure 5A:
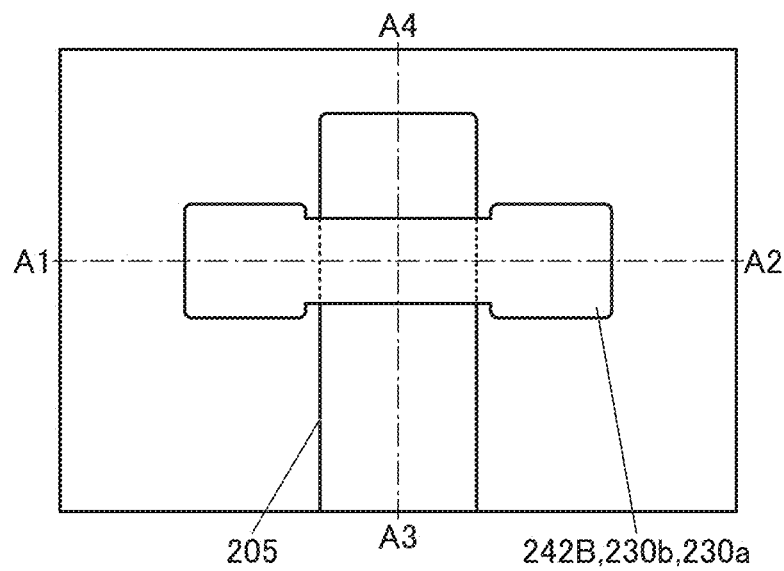
FIG. 5(A) A top view illustrating a method for manufacturing a semiconductor device of one embodiment of the present invention. (B), (C) Cross-sectional views illustrating a method for manufacturing a semiconductor device of one embodiment of the present invention.
Figure 5C:
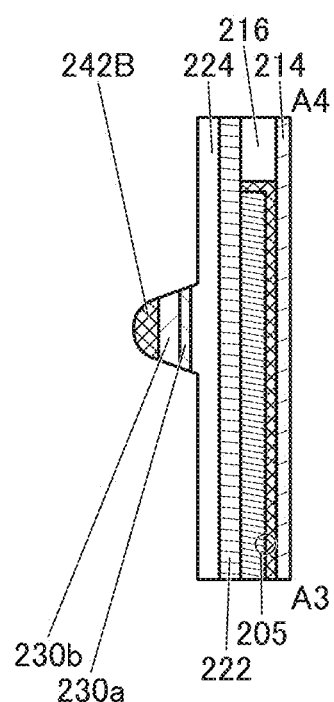
Figure 5B:
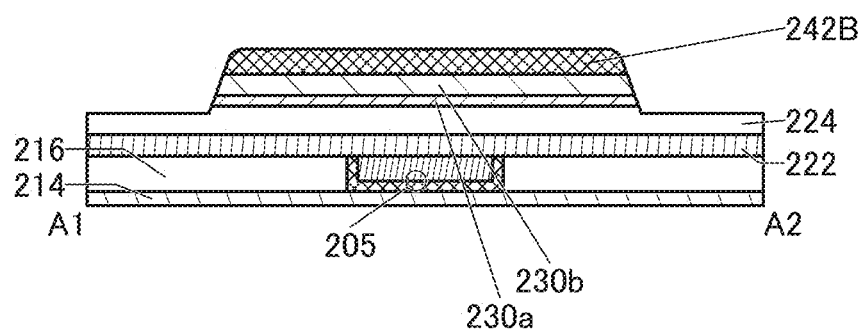

Next, the oxide film 230A, the oxide film 230B, and the conductive film 242A are processed into island shapes to form the oxide 230a, the oxide 230b, and a conductive layer 242B (see FIG. 5(A) to FIG. 5(C)).

Here, the oxide 230a, the oxide 230b, and the conductive layer 242B are formed to at least partly overlap with the conductor 205. It is preferable that the side surfaces of the oxide 230a, the oxide 230b, and the conductive layer 242B be substantially perpendicular to a top surface of the insulator 224. When the side surfaces of the oxide 230a, the oxide 230b, and the conductive layer 242B are substantially perpendicular to the top surface of the insulator 224, a plurality of transistors 200 can be provided in a smaller area and at a higher density. Alternatively, a structure may be employed in which an angle formed by the side surfaces of the oxide 230a, the oxide 230b, and the conductive layer 242B and the top surface of the insulator 224 is a small angle. In that case, the angle formed by the side surfaces of the oxide 230a, the oxide 230b, and the conductive layer 242B and the top surface of the insulator 224 is preferably greater than or equal to 60° and less than 70°. With such a shape, coverage with the insulator 254 and the like can be improved in a later step, so that defects such as voids can be reduced.

There is a curved surface between the side surface of the conductive layer 242B and the top surface of the conductive layer 242B. That is, an end portion of the side surface and an end portion of the top surface are preferably curved (such a shape is hereinafter also referred to as a rounded shape). The radius of curvature of the curved surface at the end portion of the conductive layer 242B is greater than or equal to 3 nm and less than or equal to 10 nm, preferably greater than or equal to 5 nm and less than or equal to 6 nm, for example. When the end portions are not angular, coverage with films in later deposition steps is improved.

Note that the oxide film 230A, the oxide film 230B, and the conductive film 242A can be processed by a lithography method. A dry etching method or a wet etching method can be used for the processing. Processing by a dry etching method is suitable for microfabrication. The oxide film 230A, the oxide film 230B, and the conductive film 242A may be processed under different conditions.

Figure 6A:
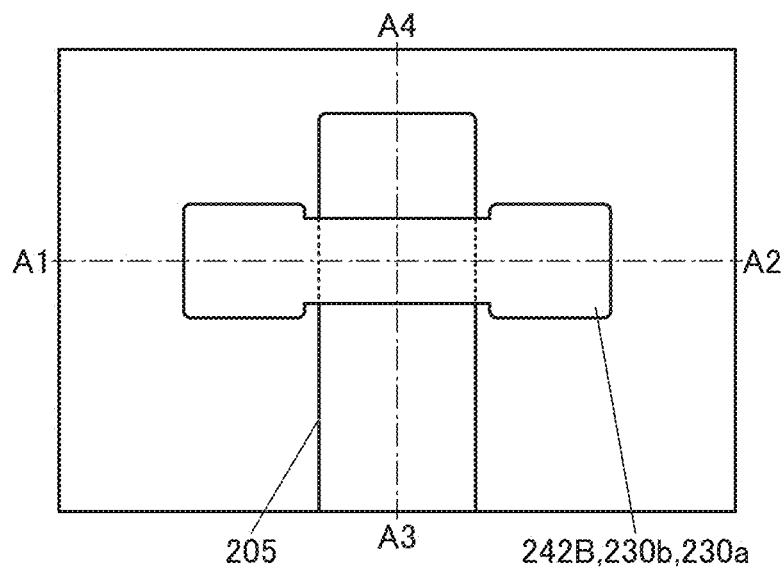
FIG. 6(A) A top view illustrating a method for manufacturing a semiconductor device of one embodiment of the present invention. (B), (C) Cross-sectional views illustrating a method for manufacturing a semiconductor device of one embodiment of the present invention.
Figure 6C:
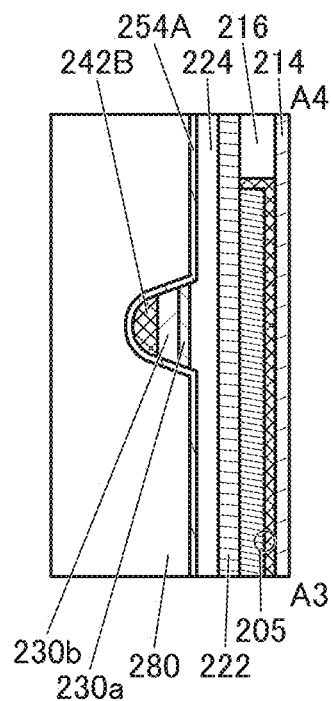
Figure 6B:
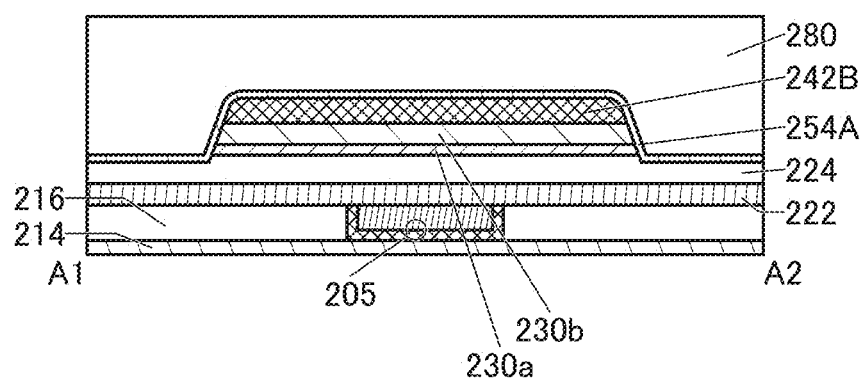

Next, an insulating film 254A is formed over the insulator 224, the oxide 230a, the oxide 230b, and the conductive layer 242B (see FIG. 6(B) and FIG. 6(C)).

As the insulating film 254A, an insulating film having a function of inhibiting the passage of oxygen is preferably used. For example, an aluminum oxide film is preferably formed by a sputtering method. When an aluminum oxide film is formed by a sputtering method using a gas containing oxygen, oxygen can be injected into the insulator 224. That is, the insulator 224 can contain excess oxygen.

The insulating film 254A may have a stacked-layer structure of two layers. For example, an aluminum oxide film may be formed by a sputtering method as a lower layer of the insulating film 254A, and an aluminum oxide film may be formed by an ALD method as an upper layer of the insulating film 254A. The stacked-layer structure of two layers can prevent formation of disconnection or the like due to unevenness of the lower layer of the insulating film 254A.

Next, an insulating film to be the insulator 280 is formed over the insulating film 254A. The insulating film can be formed by a sputtering method, a CVD method, an MBE method, a PLD method, an ALD method, or the like. In this embodiment, as the insulating film, a silicon oxide film is formed by a CVD method or a sputtering method. Note that heat treatment may be performed before the insulating film is formed. The heat treatment may be performed under reduced pressure, and the insulating film may be successively formed without exposure to the air. The treatment can remove moisture and hydrogen adsorbed onto the surface of the insulating film 254A and the like, and further can reduce the moisture concentration and the hydrogen concentration of the oxide 230a, the oxide 230b, and the insulating film 254A. For the heat treatment, the conditions for the above heat treatment can be used.

The insulating film to be the insulator 280 may have a multilayer structure. For example, a structure may be employed in which a silicon oxide film is formed by a sputtering method and another silicon oxide film is formed over the silicon oxide film by a CVD method.

Next, the insulating film to be the insulator 280 is subjected to CMP treatment, so that the insulator 280 having a flat top surface is formed (see FIG. 6(B) and FIG. 6(C)).

Then, part of the insulator 280, part of the insulating film 254A, and part of the conductive layer 242B are processed to form an opening reaching the oxide 230b. The opening is preferably formed to overlap with the conductor 205. The conductor 242a, the conductor 242b, and the insulator 254 are formed by the opening (see FIG. 7(A) to FIG. 7(C)).

Part of the insulator 280, part of the insulating film 254A, and part of the conductive layer 242B may be processed under different conditions. For example, part of the insulator 280 may be processed by a dry etching method, part of the insulating film 254A may be processed by a wet etching method, and part of the conductive layer 242B may be processed by a dry etching method.

In some cases, the treatment such as the dry etching performed thus far causes impurities due to an etching gas or the like to be attached to the surfaces or diffused to the inside of the oxide 230a, the oxide 230b, and the like. Examples of the impurities include fluorine and chlorine.

In order to remove the impurities and the like, cleaning is performed. Examples of the cleaning method include wet cleaning using a cleaning solution and the like, plasma treatment using plasma, and cleaning by heat treatment, and any of these cleanings may be performed in appropriate combination.

The wet cleaning may be performed using an aqueous solution in which oxalic acid, phosphoric acid, hydrofluoric acid, or the like is diluted with carbonated water or pure water. Alternatively, ultrasonic cleaning using pure water or carbonated water may be performed.

After the etching or the cleaning, heat treatment may be performed. The heat treatment is performed at a temperature higher than or equal to 100° C. and lower than or equal to 400° C., preferably higher than or equal to 100° C. and lower than or equal to 300° C. Note that the heat treatment is performed in a nitrogen gas or inert gas atmosphere, or an atmosphere containing an oxidizing gas at 10 ppm or more, 1% or more, or 10% or more. Alternatively, the heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen.

Through the heat treatment, an oxide film is sometimes formed on the side surface of the conductor 242 in the vicinity of the channel formation region or at the interface between the conductor 242 and the oxide 230b. The thickness of the oxide film is preferably less than or equal to 2.5 nm, further preferably less than or equal to 2.1 nm. It is preferable that a region where an indium atom is deficient not be formed in a region of the oxide 230b in the vicinity of an end portion of the conductor 242 on the channel formation region side. With such a structure, unnecessary electric resistance is not formed between a source electrode and a drain electrode; thus, the on-state current and field-effect mobility of the transistor 200 can be made favorable.

Next, heat treatment may be performed, the heat treatment may be performed under reduced pressure, and an oxide film 230C may be successively formed without exposure to the air. The treatment can remove moisture and hydrogen adsorbed onto the surface of the oxide 230b and the like, and further can reduce the moisture concentration and the hydrogen concentration of the oxide 230a and the oxide 230b. The heat treatment is preferably performed at a temperature higher than or equal to 100° C. and lower than or equal to 400° C. In this embodiment, the heat treatment is performed at 200° C. (see FIG. 8(A) to FIG. 8(C)).

The oxide film 230C can be formed by a sputtering method, a CVD method, an MBE method, a PLD method, an ALD method, or the like. The oxide film 230C is formed by a deposition method similar to that for the oxide film 230A or the oxide film 230B in accordance with characteristics required for the oxide film 230C. In this embodiment, the oxide film 230C is formed by a sputtering method using an oxide target with In:Ga:Zn=1:3:4 [atomic ratio] or 4:2:4.1 [atomic ratio].

In particular, in the formation of the oxide film 230C, part of oxygen contained in the sputtering gas is sometimes supplied to the oxide 230a and the oxide 230b. Thus, the proportion of oxygen contained in the sputtering gas for the oxide film 230C is higher than or equal to 70%, preferably higher than or equal to 80%, further preferably 100%.

Next, heat treatment may be performed. Heat treatment may be performed under reduced pressure, and an insulating film 250A may be successively formed without exposure to the air. The treatment can remove moisture and hydrogen adsorbed onto the surface of the oxide film 230C and the like, and further can reduce the moisture concentration and the hydrogen concentration of the oxide 230a, the oxide 230b, and the oxide film 230C. The heat treatment is preferably performed at a temperature higher than or equal to 100° C. and lower than or equal to 400° C. (see FIG. 9(A) to FIG. 9(C)).

The insulating film 250A can be formed by a sputtering method, a CVD method, an MBE method, a PLD method, an ALD method, or the like. In this embodiment, for the insulating film 250A, silicon oxynitride is formed by a CVD method. Note that the deposition temperature at the time of forming the insulating film 250A is preferably higher than or equal to 350° C. and lower than 450° C., particularly preferably approximately 400° C. When the insulating film 250A is formed at 400° C., an insulating film having few impurities can be formed.

Next, a conductive film 260A and a conductive film 260B are formed. The conductive film 260A and the conductive film 260B can be formed by a sputtering method, a CVD method, an MBE method, a PLD method, an ALD method, or the like. A CVD method is preferably used, for example. In this embodiment, the conductive film 260A is formed by an ALD method, and the conductive film 260B is formed by a CVD method (see FIG. 10(A) to FIG. 10(C)).

Figure 11A:
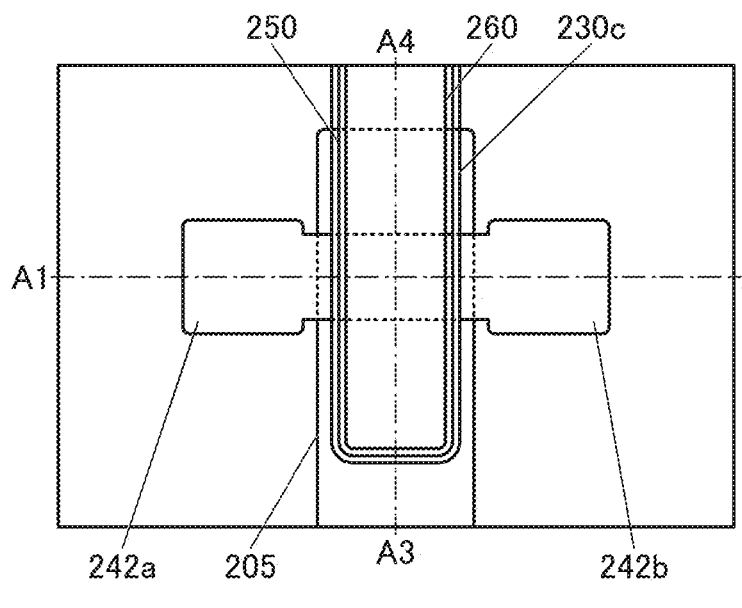
FIG. 11(A) A top view illustrating a method for manufacturing a semiconductor device of one embodiment of the present invention. (B), (C) Cross-sectional views illustrating a method for manufacturing a semiconductor device of one embodiment of the present invention.
Figure 11C:
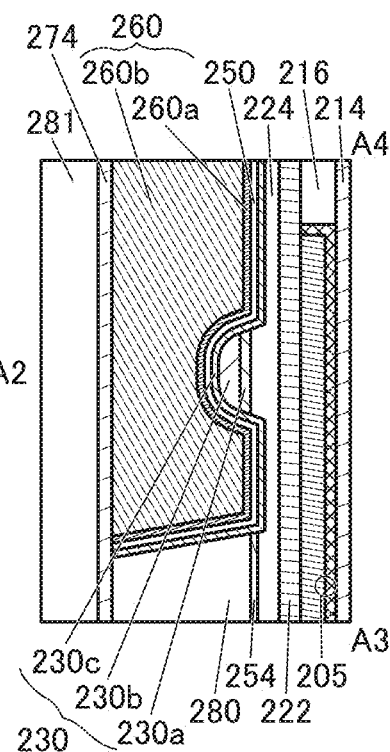
Figure 11B:
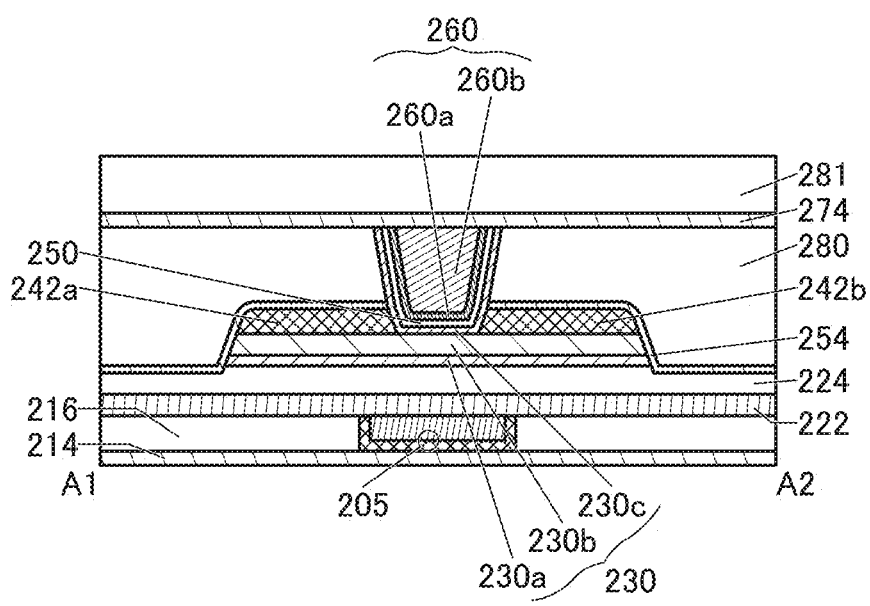

Then, the oxide film 230C, the insulating film 250A, the conductive film 260A, and the conductive film 260B are polished by CMP treatment until the insulator 280 is exposed, whereby the oxide 230c, the insulator 250, and the conductor 260 (the conductor 260a and the conductor 260b) are formed (see FIG. 11(A) to FIG. 11(C)). Accordingly, the oxide 230c is positioned to cover the inner wall (the side wall and bottom surface) of the opening that reaches the oxide 230b. The insulator 250 is positioned to cover the inner wall of the opening with the oxide 230c therebetween. The conductor 260 is positioned to fill the opening with the oxide 230c and the insulator 250 therebetween.

Next, heat treatment may be performed. In this embodiment, the treatment is performed at 400° C. in a nitrogen atmosphere for one hour. The heat treatment can reduce the moisture concentration and the hydrogen concentration in the insulator 250 and the insulator 280.

Next, the insulator 274 is formed over the oxide 230c, the insulator 250, the conductor 260, and the insulator 280. The insulator 274 can be formed by a sputtering method, a CVD method, an MBE method, a PLD method, an ALD method, or the like. An aluminum oxide film or a silicon nitride film is preferably formed as the insulator 274 by a sputtering method, for example. When an aluminum oxide film or a silicon nitride film is formed by a sputtering method, diffusion of hydrogen contained in the insulator 281 into the oxide 230 can be inhibited. Forming the insulator 274 to be in contact with the conductor 260 is preferable, in which case oxidation of the conductor 260 can be inhibited.

When an aluminum oxide film is formed as the insulator 274 by a sputtering method, oxygen can be supplied to the insulator 280. Oxygen supplied to the insulator 280 is sometimes supplied to the channel formation region included in the oxide 230b through the oxide 230c. Furthermore, when oxygen is supplied to the insulator 280, oxygen that is contained in the insulator 280 before the formation of the insulator 274 may be supplied to the channel formation region included in the oxide 230b through the oxide 230c.

In addition, the insulator 274 may have a multilayer structure. For example, a structure may be employed in which an aluminum oxide film is formed by a sputtering method and a silicon nitride film is formed over the aluminum oxide film by a sputtering method.

Next, heat treatment may be performed. For the heat treatment, the conditions for the above heat treatment can be used. The heat treatment can reduce the moisture concentration and hydrogen concentration in the insulator 280. Moreover, oxygen contained in the insulator 274 can be injected into the insulator 280.

Note that as a method for forming the insulator 274, the following may be performed: first, an aluminum oxide film is formed over the insulator 280 and the like by a sputtering method, heat treatment is performed under the above heat treatment conditions, the aluminum oxide film is removed by CMP treatment, and then the insulator 274 is formed. By this method, a larger number of excess-oxygen regions can be formed in the insulator 280. Note that in the step of removing the aluminum oxide film, part of the insulator 280, part of the conductor 260, part of the insulator 250, and part of the oxide 230c are removed in some cases.

An insulator may be provided between the insulator 280 and the insulator 274. As the insulator, silicon oxide formed by a sputtering method can be used, for example. Providing the insulator can form an excess-oxygen region in the insulator 280.

Next, the insulator 281 may be formed over the insulator 274. The insulator 281 can be formed by a sputtering method, a CVD method, an MBE method, a PLD method, an ALD method, or the like (see FIG. 11(B) and FIG. 11(C)).

Then, openings that reach the conductor 242a and the conductor 242b are formed in the insulator 254, the insulator 280, the insulator 274, and the insulator 281. The openings are formed by a lithography method.

Next, an insulating film to be the insulator 241 is formed and the insulating film is subjected to anisotropic etching, so that the insulator 241 is formed. The insulating film can be formed by a sputtering method, a CVD method, an MBE method, a PLD method, an ALD method, or the like. As the insulating film, an insulating film having a function of inhibiting the passage of oxygen is preferably used. For example, an aluminum oxide film is preferably formed by an ALD method. Alternatively, a silicon nitride film may be formed by an ALD method or a CVD method. In the case where a silicon nitride film is formed by an ALD method, a precursor containing silicon and halogen or precursors of aminosilanes can be used. As the precursor containing silicon and halogen, $SiCl_4$, $SiH_2Cl_2$, $Si_2Cl_6$, $Si_3Cl_8$, or the like can be used. As the precursors of aminosilanes, monovalent, divalent, or trivalent aminosilanes can be used. Moreover, as a nitriding gas, ammonia or hydrazine can be used. For the anisotropic etching, a dry etching method or the like may be employed, for example. When the side wall portions of the openings have such a structure, the passage of oxygen from the outside can be inhibited and oxidation of the conductor 240a and the conductor 240b to be formed next can be prevented. Furthermore, impurities such as water and hydrogen can be prevented from diffusing from the conductor 240a and the conductor 240b to the outside.

Next, a conductive film to be the conductor 240a and the conductor 240b is formed. The conductive film desirably has a stacked-layer structure that includes a conductor having a function of inhibiting diffusion of impurities such as water and hydrogen. For example, a stack of tantalum nitride, titanium nitride, or the like and tungsten, molybdenum, copper, or the like can be employed. The conductive film can be formed by a sputtering method, a CVD method, an MBE method, a PLD method, an ALD method, or the like.

Next, part of the conductive film to be the conductor 240a and the conductor 240b is removed by CMP treatment, so that the insulator 281 is exposed. As a result, the conductive film remains only in the openings, so that the conductor 240a and the conductor 240b having flat top surfaces can be formed (see FIG. 2(B) and FIG. 2(C)). Note that the insulator 281 is partly removed by the CMP treatment in some cases.

Through the above steps, the semiconductor device of this embodiment illustrated in FIG. 2(A) to FIG. 2(C) can be manufactured.

According to one embodiment of the present invention, a semiconductor device with a high on-state current can be provided. According to one embodiment of the present invention, a semiconductor device having excellent frequency characteristics can be provided. According to one embodiment of the present invention, a highly reliable semiconductor device can be provided. According to one embodiment of the present invention, a semiconductor device that can be miniaturized or highly integrated can be provided. According to one embodiment of the present invention, a semiconductor device having excellent electrical characteristics can be provided. According to one embodiment of the present invention, a semiconductor device with a low off-state current can be provided. According to one embodiment of the present invention, a semiconductor device with reduced power consumption can be provided. According to one embodiment of the present invention, a semiconductor device with high productivity can be provided.

<Structure Example 2 of Semiconductor Device>

FIG. 12(A) to FIG. 12(C) are a top view and cross-sectional views of the semiconductor device of one embodiment of the present invention, a transistor 200A included in the semiconductor device, and the periphery of the transistor 200A.

FIG. 12(A) is a top view of a semiconductor device including the transistor 200A. FIG. 12(B) and FIG. 12(C) are cross-sectional views of the semiconductor device. Here, FIG. 12(B) is a cross-sectional view of a portion indicated by the dashed-dotted line A1-A2 in FIG. 12(A), and is also a cross-sectional view of the transistor 200A in the channel length direction. FIG. 12(C) is a cross-sectional view of a portion indicated by the dashed-dotted line A3-A4 in FIG. 12(A), and is also a cross-sectional view of the transistor 200A in the channel width direction. Note that for clarity of the drawing, some components are omitted in the top view of FIG. 12(A).

Note that in the semiconductor device illustrated in FIG. 12(A) to FIG. 12(C), components having the same functions as the components configuring the semiconductor device described in <Structure example 1 of semiconductor device> are denoted by the same reference numerals.

The structure of the semiconductor device will be described below with reference to FIG. 12(A) to FIG. 12(C). Note that the materials described in detail in <Structure example 1 of semiconductor device> can be used as constituent materials of the semiconductor devices in this section.

The semiconductor device of one embodiment of the present invention includes the transistor 200A and the insulator 214, the insulator 216, the insulator 280 (an insulator 280a and an insulator 280b), the insulator 274, and the insulator 281 that function as interlayer films. The conductor 240 (the conductor 240a and the conductor 240b) that is electrically connected to the transistor 200A and functions as a plug is also included. Note that the insulator 241 (the insulator 241a and the insulator 241b) is provided in contact with a side surface of the conductor 240 functioning as a plug.

[Transistor 200A]

As illustrated in FIG. 12(A) to FIG. 12(C), the transistor 200A includes the conductor 205 that is positioned over a substrate (not illustrated) to be embedded in the insulator 216; the insulator 222 positioned over the insulator 216 and the conductor 205; the insulator 224 positioned over the insulator 222; the oxide 230 (the oxide 230a, the oxide 230b, an oxide 230c1, and an oxide 230c2) positioned over the insulator 224; the insulator 250 positioned over the oxide 230; the conductor 260 (the conductor 260a and the conductor 260b) positioned over the insulator 250; and the conductor 242a and the conductor 242b in contact with part of the top surface of the oxide 230b.

The semiconductor device is different from the semiconductor device described in <Structure example 1 of semiconductor device> in that the insulator 280 has a structure in which two layers of the insulator 280a and the insulator 280b are stacked. The transistor 200A is different from the above-described transistor 200 in that the oxide 230c has a structure in which two layers of the oxide 230c1 and the oxide 230c2 are stacked, the insulator 224 is processed into an island shape, and the insulator 254 is not provided. In addition, the transistor 200A is different from the above-described transistor 200 in including a region where the insulator 222 is in contact with the oxide 230c1 in the channel width direction. Differences from the semiconductor device described in <Structure example 1 of semiconductor device> and the above-described transistor 200 will be described below.

As illustrated in FIG. 12(B) and FIG. 12(C), the insulator 280 includes the insulator 280a and the insulator 280b provided over the insulator 280a. The insulator 280a is provided in contact with part of the top surface of the insulator 222, the side surfaces of the insulator 224, the oxide 230a, and the oxide 230b, the side surface of the conductor 242a, the top surface of the conductor 242a, the side surface of the conductor 242b, and the top surface of the conductor 242b.

For example, an insulating material including an excess-oxygen region or an insulating material in which an excess-oxygen region is easily formed is preferably used for the insulator 280a and the insulator 280b. Specifically, silicon oxide formed by a sputtering method is used as the insulator 280a, and silicon oxynitride formed by a CVD method is used as the insulator 280b. The thickness of the insulator 280a is preferably greater than or equal to 30 nm and less than or equal to 100 nm, further preferably greater than or equal to 40 nm and less than or equal to 80 nm. A structure in which such two layers are stacked can improve the coverage with the insulator 280.

For example, it is preferred that an insulating material including an excess-oxygen region or an insulating material in which an excess-oxygen region is likely to be formed be used for the insulator 280a, and an insulating material that is likely to form an excess-oxygen region in the film on which the material is formed be used for the insulator 280b. Specifically, silicon oxide formed by a sputtering method is used as the insulator 280a, and aluminum oxide formed by a sputtering method is used as the insulator 280b. The structure in which such two layers are stacked can efficiently supply excess oxygen contained in the insulator 280a to the oxide 230.

Note that the insulator 280 is not limited to having the structure in which the insulator 280a and the insulator 280b are stacked, and may be a single layer or have a stacked-layer structure of three or more layers. In the case where the insulator 280 has a stacked-layer structure of two or more layers, a combination and the stacking order of insulating materials used for the insulator 280 are designed as appropriate for required transistor characteristics.

As illustrated in FIG. 12(A) to FIG. 12(C), the oxide 230c includes the oxide 230c1 and the oxide 230c2 positioned over the oxide 230c1. The oxide 230c1 preferably contains at least one of the metal elements contained in the metal oxide used as the oxide 230b, and further preferably contains all of these metal elements. Accordingly, the density of defect states at the interface between the oxide 230b and the oxide 230c1 can be decreased. The oxide 230c2 is preferably a metal oxide that inhibits diffusion or passage of oxygen, compared to the oxide 230c1. Providing the oxide 230c2 between the insulator 250 and the oxide 230c1 can inhibit diffusion of oxygen contained in the insulator 280 into the insulator 250. Therefore, the oxygen is more likely to be supplied to the oxide 230 through the oxide 230c1.

The conduction band minimum of each of the oxide 230a and the oxide 230c2 is preferably closer to the vacuum level than the conduction band minimum of each of the oxide 230b and the oxide 230c1. In other words, the electron affinity of each of the oxide 230a and the oxide 230c2 is preferably smaller than the electron affinity of each of the oxide 230b and the oxide 230c1. In that case, it is preferred that a metal oxide that can be used as the oxide 230a be used as the oxide 230c2, and a metal oxide that can be used as the oxide 230b be used as the oxide 230c1.

It is preferable that the oxide 230c1 and the oxide 230c2 have crystallinity, and it is further preferable that the crystallinity of the oxide 230c2 be higher than that of the oxide 230c1. In particular, a CAAC-OS is preferably used as the oxide 230c1 and the oxide 230c2; the c-axes of crystals included in the oxide 230c1 and the oxide 230c2 are preferably aligned in a direction substantially perpendicular to the formation surfaces or the top surfaces of the oxide 230c1 and the oxide 230c2. The CAAC-OS has a property such that oxygen is less likely to be moved in the c-axis direction. Therefore, providing the oxide 230c2 between the oxide 230c1 and the insulator 250 can inhibit diffusion of oxygen contained in the oxide 230c1 into the insulator 250 and efficiently supply the oxygen to the oxide 230.

Specifically, a metal oxide with In:Ga:Zn=4:2:3 [atomic ratio] is used as the oxide 230c1, and a metal oxide with In:Ga:Zn=1:3:4 [atomic ratio] is used as the oxide 230c2. When the atomic ratio of In to the constituent elements in the metal oxide used as the oxide 230c2 is made lower than the atomic ratio of In to the constituent elements in the metal oxide used as the oxide 230c1, diffusion of In to the insulator 250 side can be inhibited. Since the insulator 250 functions as a gate insulator, the transistor exhibits poor characteristics when In enters the insulator 250 and the like. Thus, when the oxide 230c has a stacked-layer structure, a highly reliable semiconductor device can be provided.

As illustrated in FIG. 12(C), in the channel width direction of the transistor 200A, at least part of the oxide 230c1 in a region that does not overlap with the oxide 230b, the oxide 230a, and the insulator 224 may be in contact with the insulator 222. With such a structure, oxygen contained in the oxide 230c1 can be prevented from diffusing to the outside of the transistor 200 through the insulator 224. Alternatively, oxygen contained in the oxide 230b and the oxide 230a can be prevented from diffusing to the outside of the transistor 200 through the insulator 224. Alternatively, a decrease in the area of the insulator 224 reduces the amount of oxygen taken into the insulator 224, thereby suppressing a reduction in the amount of oxygen supplied to the oxide 230. Accordingly, oxygen contained in the oxide 230c1 can be efficiently supplied to the oxide 230b and the oxide 230a, thereby inhibiting a reduction in the resistance of the oxide 230 in the channel formation region. Thus, it is possible to suppress variations in electrical characteristics of the transistor, achieve stable electrical characteristics, and increase the reliability.

Alternatively, employing the above structure can inhibit entry of impurities such as hydrogen contained in the insulator 224 and the like into the oxide 230. That is, a reduction in the resistance of the oxide 230 can be inhibited. Accordingly, it is possible to suppress variations in electrical characteristics of the transistor, achieve stable electrical characteristics, and increase the reliability. Note that the structure can be formed by removing the insulator 224 in a region that does not overlap with the oxide 230b and the oxide 230a.

When the insulator 224 in the region that does not overlap with the oxide 230b and the oxide 230a is removed, as illustrated in FIG. 12(C), in the channel width direction of the transistor 200A, with reference to the bottom surface of the insulator 222, the level of the bottom surface of the conductor 260 in a region where the oxide 230a and the oxide 230b do not overlap with the conductor 260 (the conductor 260a and the conductor 260b) is likely to be lower than the level of the bottom surface of the oxide 230b. Thus, the on-state current of the transistor 200 can be increased, and the frequency characteristics can be improved.

As illustrated in FIG. 12(B) and FIG. 12(C), the insulator 222 may have a smaller thickness in a region that does not overlap with the oxide 230b than in the other regions. The thickness of the insulator 222 in the region that does not overlap with the oxide 230b is preferably a thickness with which the insulator 222 can function as an etching stopper film or a thickness large enough to prevent the surface of the insulator 216 or the conductor 205 from being exposed, at the time of forming an opening in the insulator 280 and the like.

In the transistor 200, an oxide may be provided between the oxide 230b and the conductor 242 (the conductor 242a and the conductor 242b) functioning as a source electrode and a drain electrode. Thus, the conductor 242 is not in contact with the oxide 230, so that the conductor 242 can be inhibited from absorbing oxygen in the oxide 230. That is, preventing the oxidation of the conductor 242 can inhibit a decrease in conductivity of the conductor 242. Accordingly, the oxide preferably has a function of inhibiting the oxidation of the conductor 242.

The oxide preferably has conductivity. The oxide having conductivity is preferably provided between the conductor 242, which functions as the source electrode and the drain electrode, and the oxide 230b, in which case the electrical resistance between the conductor 242 and the oxide 230b can be reduced. Such a structure improves the electrical characteristics and reliability of the transistor 200. Note that the oxide may have a crystal structure.

As the oxide, an oxide containing zinc can be used. For example, zinc oxide, gallium zinc oxide, indium zinc oxide, indium gallium zinc oxide, or the like can be used. Alternatively, indium oxide, indium tin oxide, or the like may be used. The oxide is preferably an oxide containing a metal atom having a strong bond to an oxygen atom. The conductivity of the oxide is preferably higher than the conductivity of the oxide 230 (the oxide 230a, the oxide 230b, and the oxide 230c). The thickness of the oxide is preferably greater than or equal to 1 nm and less than or equal to 10 nm, further preferably greater than or equal to 1 nm and less than or equal to 5 nm. The oxide preferably has crystallinity. The oxide having crystallinity can inhibit release of oxygen from the oxide 230. When the oxide has a hexagonal crystal structure, for example, release of oxygen from the oxide 230 can sometimes be inhibited.

The structure, method, and the like described above in this embodiment can be used in appropriate combination with the structures, methods, and the like described in the other embodiments and the examples.

Embodiment 2

In this embodiment, one embodiment of a semiconductor device will be described with reference to FIG. 13 and FIG. 14.

[Memory Device 1]

Figure 13:
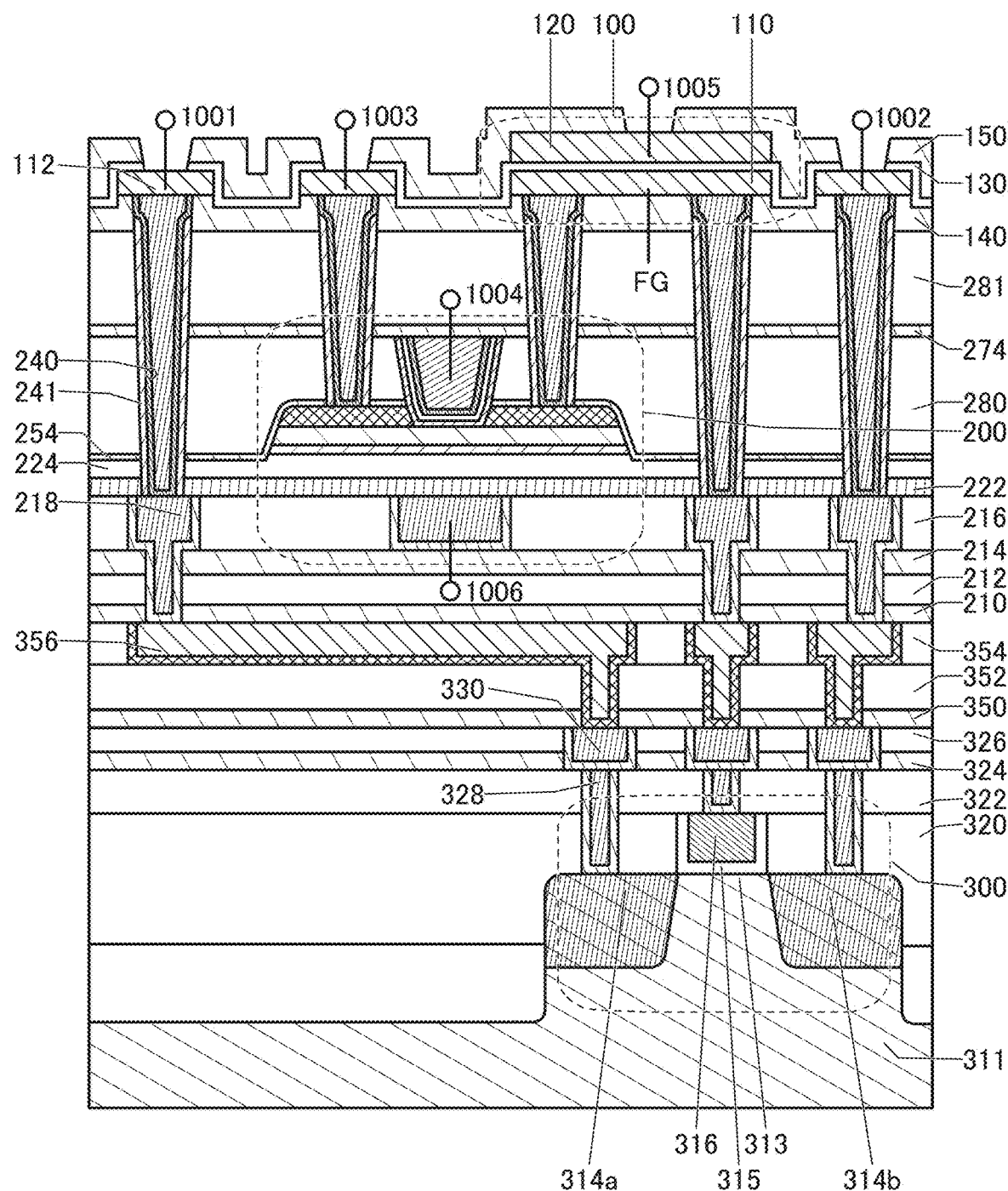
FIG. 13 A cross-sectional view illustrating a structure of a memory device of one embodiment of the present invention.

FIG. 13 illustrates an example of a semiconductor device (memory device) using a capacitor of one embodiment of the present invention. In a semiconductor device of one embodiment of the present invention, the transistor 200 is provided above a transistor 300, and a capacitor 100 is provided above the transistor 300 and the transistor 200. Note that the transistor 200 described in the foregoing embodiment, for example, can be used as the transistor 200.

The transistor 200 is a transistor in which a channel is formed in a semiconductor layer including an oxide semiconductor. Since the transistor 200 has a low off-state current, a memory device including the transistor 200 can retain stored data for a long time. In other words, such a memory device does not require refresh operation or has extremely low frequency of the refresh operation, which leads to a sufficient reduction in power consumption of the memory device.

In the semiconductor device illustrated in FIG. 13, a wiring 1001 is electrically connected to a source of the transistor 300, and a wiring 1002 is electrically connected to a drain of the transistor 300. A wiring 1003 is electrically connected to one of a source and a drain of the transistor 200, a wiring 1004 is electrically connected to a first gate (also referred to as a top gate) of the transistor 200, and a wiring 1006 is electrically connected to a second gate (also referred to as a back gate) of the transistor 200. A gate of the transistor 300 and the other of the source and the drain of the transistor 200 are electrically connected to one electrode of the capacitor 100, and a wiring 1005 is electrically connected to the other electrode of the capacitor 100. Note that a node where the gate of the transistor 300, the other of the source and the drain of the transistor 200, and the one electrode of the capacitor 100 are connected to each other is hereinafter referred to as a node FG in some cases. Note that the semiconductor device illustrated in FIG. 13 enables data writing, retention, and reading by having the capability of retaining the potential of the gate of the transistor 300 (the node FG) by switching of the transistor 200.

Furthermore, by arranging the memory devices illustrated in FIG. 13 in a matrix, a memory cell array can be formed.

<Transistor 300>

The transistor 300 is provided on a substrate 311 and includes a conductor 316 functioning as a gate electrode, an insulator 315 functioning as a gate insulator, a semiconductor region 313 that is part of the substrate 311, and a low-resistance region 314a and a low-resistance region 314b functioning as a source region and a drain region. The transistor 300 may be a p-channel transistor or an n-channel transistor.

Here, in the transistor 300 illustrated in FIG. 13, the semiconductor region 313 (part of the substrate 311) in which a channel is formed has a convex shape. In addition, the conductor 316 is provided to cover a side surface and a top surface of the semiconductor region 313 with the insulator 315 therebetween. Note that a material adjusting a work function may be used for the conductor 316. Such a transistor 300 is also referred to as a FIN-type transistor because it utilizes a convex portion of a semiconductor substrate. Note that an insulator functioning as a mask for forming the convex portion may be included in contact with an upper portion of the convex portion. Furthermore, although the case where the convex portion is formed by processing part of the semiconductor substrate is described here, a semiconductor film having a convex shape may be formed by processing an SOI substrate.

Note that the transistor 300 illustrated in FIG. 13 is only an example and the structure is not limited thereto; a transistor appropriate for a circuit configuration or a driving method is used.

<Capacitor 100>

The capacitor 100 is provided above the transistor 200. The capacitor 100 includes a conductor 110 functioning as a first electrode, a conductor 120 functioning as a second electrode, and an insulator 130 functioning as a dielectric.

For example, a conductor 112 and the conductor 110 over the conductor 240 can be formed at the same time. Note that the conductor 112 has a function of a plug or a wiring that is electrically connected to the capacitor 100, the transistor 200, or the transistor 300.

Although the conductor 112 and the conductor 110 each having a single-layer structure are illustrated in FIG. 13, the structure is not limited thereto, and a stacked-layer structure of two or more layers may be employed. For example, between a conductor having a barrier property and a conductor having high conductivity, a conductor that is highly adhesive to the conductor having a barrier property and the conductor having high conductivity may be formed.

The insulator 130 can be provided to have stacked layers or a single layer using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like.

For example, it is preferable to use a stacked-layer structure of a material with high dielectric strength, such as silicon oxynitride, and a high dielectric constant (high-k) material for the insulator 130. In the capacitor 100 having such a structure, sufficient capacitance can be secured because a high dielectric constant (high-k) insulator is included, and dielectric strength can be improved because an insulator with high dielectric strength is included; hence, the electrostatic breakdown of the capacitor 100 can be inhibited.

Note that examples of the insulator with a high dielectric constant (high-k) material (a material having a high dielectric constant) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the material with high dielectric strength (a material having a low dielectric constant) include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

<Wiring Layer>

Wiring layers provided with an interlayer film, a wiring, a plug, and the like may be provided between the components. In addition, a plurality of wiring layers can be provided in accordance with design. Here, a plurality of conductors having functions of plugs or wirings are collectively denoted by the same reference numeral in some cases. Furthermore, in this specification and the like, a wiring and a plug electrically connected to the wiring may be a single component. That is, there are a case where part of a conductor functions as a wiring and a case where part of a conductor functions as a plug.

For example, an insulator 320, an insulator 322, an insulator 324, and an insulator 326 are stacked in this order as interlayer films over the substrate 311. Note that the insulator 315 and the conductor 316 are provided to be embedded in the insulator 320. In addition, a conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 function as a plug or a wiring.

The insulators functioning as interlayer films may also function as planarization films that cover uneven shapes thereunder. For example, a top surface of the insulator 322 may be planarized by planarization treatment using a chemical mechanical polishing (CMP) method or the like to improve planarity.

A wiring layer may be provided over the insulator 326 and the conductor 330. For example, in FIG. 13, an insulator 350, an insulator 352, and an insulator 354 are stacked in this order. Furthermore, a conductor 356 is formed in the insulator 350, the insulator 352, and the insulator 354. The conductor 356 functions as a plug or a wiring.

An insulator 210, an insulator 212, the insulator 214, and the insulator 216 are stacked in this order over the insulator 354 and the conductor 356. A conductor 218, a conductor (the conductor 205) included in the transistor 200, and the like are embedded in the insulator 210, the insulator 212, the insulator 214, and the insulator 216. Note that the conductor 218 has a function of a plug or a wiring that is electrically connected to the capacitor 100 or the transistor 300. In addition, an insulator 150 is provided over the conductor 120 and the insulator 130.

Examples of an insulator that can be used as an interlayer film include an insulating oxide, an insulating nitride, an insulating oxynitride, an insulating nitride oxide, an insulating metal oxide, an insulating metal oxynitride, and an insulating metal nitride oxide.

For example, when a material having a low dielectric constant is used for the insulator functioning as an interlayer film, parasitic capacitance generated between wirings can be reduced. Thus, a material is preferably selected depending on the function of an insulator.

For example, the insulator 212, the insulator 352, the insulator 354, and the like each preferably include an insulator having a low dielectric constant. For example, the insulators preferably include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulators preferably have a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and a low dielectric constant. Examples of the resin include polyester, polyolefin, polyamide (e.g., nylon and aramid), polyimide, polycarbonate, and acrylic.

It is preferable that one or both of the insulator 130 and the insulator 150 provided over the conductor 112 or the conductor 120 be an insulator having a resistivity higher than or equal to $1.0\times10^{12}$ Ωcm and lower than or equal to $1.0\times10^{15}$ Ωcm, preferably higher than or equal to $5.0\times10^{12}$ Ωcm and lower than or equal to $1.0\times10^{14}$ Ωcm, further preferably higher than or equal to $1.0\times10^{13}$ Ωcm and lower than or equal to $5.0\times10^{13}$ Ωcm. One or both of the insulator 130 and the insulator 150 are preferably an insulator having resistivity in the above range because the insulator or the insulators can disperse electric charge accumulated between the transistor 200, the transistor 300, the capacitor 100, and wirings such as the conductor 112 and the conductor 120 and can inhibit poor characteristics and electrostatic breakdown of the transistor and a memory device including the transistor due to the electric charge, while maintaining the insulating property. For such an insulator, silicon nitride or silicon nitride oxide can be used.

In addition, as the insulator having resistivity in the above range, an insulator 140 may be provided below the conductor 112. In that case, the insulator 140 is formed over the insulator 281; an opening portion is formed in the insulator 140, the insulator 281, the insulator 274, the insulator 280, the insulator 254, and the like; and the insulator 241 is formed or the conductor 240 that is electrically connected to the transistor 200, the conductor 218, and the like is formed in the opening portion. For the insulator 140, a material similar to that of the insulator 130 or the insulator 150 can be used.

When a transistor using an oxide semiconductor is surrounded by an insulator having a function of inhibiting the passage of oxygen and impurities such as hydrogen, the electrical characteristics of the transistor can be stable. Thus, an insulator having a function of inhibiting the passage of oxygen and impurities such as hydrogen is used as the insulator 210, the insulator 350, and the like.

For the insulator having a function of inhibiting the passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum can be used. Specifically, for the insulator having a function of inhibiting the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

For the conductor that can be used as a wiring or a plug, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. A semiconductor having high electric conductivity, typified by polycrystalline silicon containing an impurity element such as phosphorus, or silicide such as nickel silicide may be used.

For example, as the conductor 328, the conductor 330, the conductor 356, the conductor 218, the conductor 110, the conductor 112, the conductor 120, and the like, a single layer or stacked layers of a conductive material such as a metal material, an alloy material, a metal nitride material, a metal oxide material, and the like that are formed using the above materials can be used. It is preferable to use a high-melting-point material that has both heat resistance and conductivity, such as tungsten or molybdenum, and it is preferable to use tungsten. Alternatively, it is preferable to use a low-resistance conductive material such as aluminum or copper. The use of a low-resistance conductive material can reduce wiring resistance.

«Wiring or Plug in Layer Provided with Oxide Semiconductor»

Note that in the case where an oxide semiconductor is used for the transistor 200, an insulator including an excess-oxygen region is provided in the vicinity of the oxide semiconductor in some cases. In that case, an insulator having a barrier property is preferably provided between the insulator including the excess-oxygen region and a conductor provided in the insulator including the excess-oxygen region.

For example, in FIG. 13, the insulator 241 is preferably provided between the insulators 280 and 281 and the conductor 240. When the insulator 241 is placed between the insulators 280 and 281 and the conductor 240, it is possible to inhibit absorption of oxygen contained in the insulator 280 and the insulator 281 by the conductor 240, that is, oxidation of the conductor 240.

That is, when the insulator 241 is provided, absorption of excess oxygen contained in the insulator 280 by the conductor 240 can be inhibited. In addition, when the insulator 241 is included, diffusion of hydrogen, which is an impurity, into the transistor 200 through the conductor 240 can be inhibited.

Note that an insulating material having a function of inhibiting diffusion of oxygen and impurities such as water and hydrogen is preferably used for the insulator 241. For example, aluminum oxide, hafnium oxide, or the like is preferably used. Alternatively, for example, a metal oxide such as magnesium oxide, gallium oxide, germanium oxide, yttrium oxide, zirconium oxide, lanthanum oxide, neodymium oxide, or tantalum oxide; silicon nitride oxide; silicon nitride; or the like can be used.

The above is the description of the structure example. With the use of this structure, changes in electrical characteristics can be inhibited and reliability can be improved in a semiconductor device using a transistor including an oxide semiconductor. A transistor that includes an oxide semiconductor and has a high on-state current can be provided. A transistor that includes an oxide semiconductor and has a low off-state current can be provided. A semiconductor device with low power consumption can be provided.

[Memory Device 2]

Figure 14:
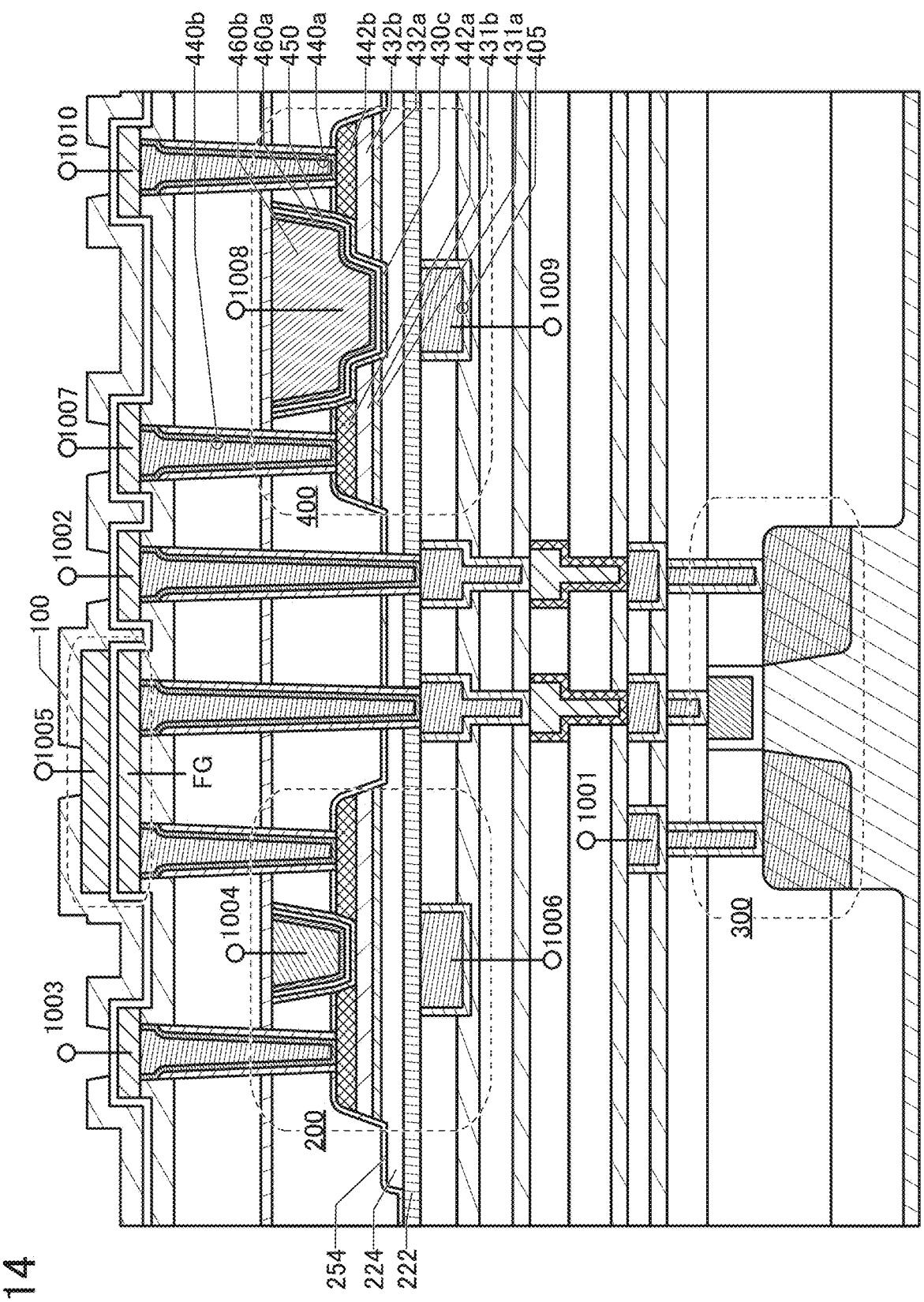
FIG. 14 A cross-sectional view illustrating a structure of a memory device of one embodiment of the present invention.

FIG. 14 illustrates an example of a memory device using the semiconductor device of one embodiment of the present invention. The memory device illustrated in FIG. 14 includes a transistor 400 in addition to the transistor 200, the transistor 300, and the capacitor 100 illustrated in FIG. 13.

The transistor 400 can control a second gate voltage of the transistor 200. For example, a structure is employed in which a first gate and a second gate of the transistor 400 are diode-connected to a source of the transistor 400, and the source of the transistor 400 is connected to the second gate of the transistor 200. When a negative potential of the second gate of the transistor 200 is retained in this structure, a voltage between the first gate and the source and a voltage between the second gate and the source of the transistor 400 become 0 V. In the transistor 400, a drain current at the time when a second gate voltage and a first gate voltage are 0 V is extremely low; thus, the negative potential of the second gate of the transistor 200 can be maintained for a long time even without power supply to the transistor 200 and the transistor 400. Accordingly, the memory device including the transistor 200 and the transistor 400 can retain stored data for a long time.

Accordingly, in FIG. 14, the wiring 1001 is electrically connected to the source of the transistor 300, and the wiring 1002 is electrically connected to the drain of the transistor 300. The wiring 1003 is electrically connected to one of the source and the drain of the transistor 200, the wiring 1004 is electrically connected to the first gate of the transistor 200, and the wiring 1006 is electrically connected to the second gate of the transistor 200. The gate of the transistor 300 and the other of the source and the drain of the transistor 200 are electrically connected to one electrode of the capacitor 100, and the wiring 1005 is electrically connected to the other electrode of the capacitor 100. A wiring 1007 is electrically connected to the source of the transistor 400, a wiring 1008 is electrically connected to the first gate of the transistor 400, a wiring 1009 is electrically connected to the second gate of the transistor 400, and a wiring 1010 is electrically connected to a drain of the transistor 400. Here, the wiring 1006, the wiring 1007, the wiring 1008, and the wiring 1009 are electrically connected to each other.

When the memory devices illustrated in FIG. 14 are arranged in a matrix like the memory devices illustrated in FIG. 13, a memory cell array can be formed. Note that one transistor 400 can control the second gate voltages of a plurality of transistors 200. For this reason, the number of transistors 400 is preferably smaller than the number of transistors 200.

<Transistor 400>

The transistor 400 and the transistor 200 are formed in the same layer and thus can be fabricated in parallel. The transistor 400 includes a conductor 460 (a conductor 460*a* and a conductor 460*b*) functioning as a first gate electrode; a conductor 405 functioning as a second gate electrode; the insulator 222, the insulator 224, and an insulator 450 functioning as a gate insulator; an oxide 430*c* including a region where a channel is formed; a conductor 442*a*, an oxide 431*a*, and an oxide 431*b* functioning as one of a source and a drain; a conductor 442*b*, an oxide 432*a*, and an oxide 432*b* functioning as the other of the source and the drain; and a conductor 440 (a conductor 440*a* and a conductor 440*b*).

In the transistor 400, the conductor 405 is formed in the same layer as the conductor 205 included in the transistor 200. Similarly, the oxide 431*a* and the oxide 432*a* are formed in the same layer as the oxide 230*a*, and the oxide 431*b* and the oxide 432*b* are formed in the same layer as the oxide 230*b*. The conductor 442 is formed in the same layer as the conductor 242. The oxide 430*c* is formed in the same layer as the oxide 230*c*. The insulator 450 is formed in the same layer as the insulator 250. The conductor 460 is formed in the same layer as the conductor 260.

Note that the components formed in the same layer can be formed at the same time. For example, the oxide 430*c* can be formed by processing an oxide film to be the oxide 230*c*.

In the oxide 430*c* functioning as an active layer of the transistor 400, oxygen vacancies and impurities such as water and hydrogen are reduced, as in the oxide 230 and the like. Accordingly, the threshold voltage of the transistor 400 can be further increased, the off-state current can be reduced, and the drain current at the time when the second gate voltage and the first gate voltage are 0 V can be extremely low.

«Dicing Line»

A dicing line (also referred to as a scribe line, a dividing line, or a cutting line in some cases) that is provided when a large-sized substrate is divided into semiconductor elements so that a plurality of semiconductor devices are obtained in a chip form will be described below. Examples of a dividing method include the case where a groove (a dicing line) for separating the semiconductor elements is formed on the substrate, and then the substrate is cut along the dicing line to divide (split) it into a plurality of semiconductor devices.

Here, for example, as illustrated in FIG. 14, it is preferable that a region in which the insulator 254 and the insulator 222 are in contact with each other be the dicing line. That is, an opening is provided in the insulator 224 near the region to be the dicing line that is provided in the outer edge of the transistor 400 and the memory cell including a plurality of transistors 200. The insulator 254 is provided to cover the side surface of the insulator 224.

That is, in the opening provided in the insulator 224, the insulator 222 is in contact with the insulator 254. For example, in this instance, the insulator 222 and the insulator 254 may be formed using the same material and the same method. When the insulator 222 and the insulator 254 are formed using the same material and the same method, the adhesion therebetween can be increased. For example, aluminum oxide is preferably used.

With this structure, the insulator 224, the transistor 200, and the transistor 400 can be enclosed with the insulator 222 and the insulator 254. Since the insulator 222 and the insulator 254 have a function of inhibiting diffusion of oxygen, hydrogen, and water, even when the substrate is divided into circuit regions including the semiconductor elements of this embodiment to be processed into a plurality of chips, impurities such as water and hydrogen can be prevented from entering from the direction of a side surface of the divided substrate and diffusing into the transistor 200 and the transistor 400.

Furthermore, with this structure, excess oxygen in the insulator 224 can be prevented from diffusing to the outside of the insulator 254 and the insulator 222. Accordingly, excess oxygen in the insulator 224 is efficiently supplied to the oxide where the channel of the transistor 200 or the transistor 400 is formed. The oxygen can reduce oxygen vacancies in the oxide where the channel of the transistor 200 or the transistor 400 is formed. Thus, the oxide where the channel of the transistor 200 or the transistor 400 is formed can be an oxide semiconductor having a low density of defect states and stable characteristics. That is, variations in electrical characteristics of the transistor 200 or the transistor 400 can be reduced and the reliability can be improved.

This embodiment can be implemented in an appropriate combination with the structures described in the other embodiments, the examples, and the like.

Embodiment 3

In this embodiment, a memory device of one embodiment of the present invention including a transistor in which an oxide is used for a semiconductor (hereinafter, referred to as an OS transistor in some cases) and a capacitor (hereinafter, such a memory device is referred to as an OS memory device in some cases) will be described with reference to FIG. 15(A), FIG. 15(B), and FIG. 16(A) to FIG. 16(H). The OS memory device is a memory device including at least a capacitor and an OS transistor that controls charge and discharge of the capacitor. Since the off-state current of the OS transistor is extremely low, the OS memory device has excellent retention characteristics and can function as a nonvolatile memory.

<Structure Example of Memory Device>

Figure 15A:
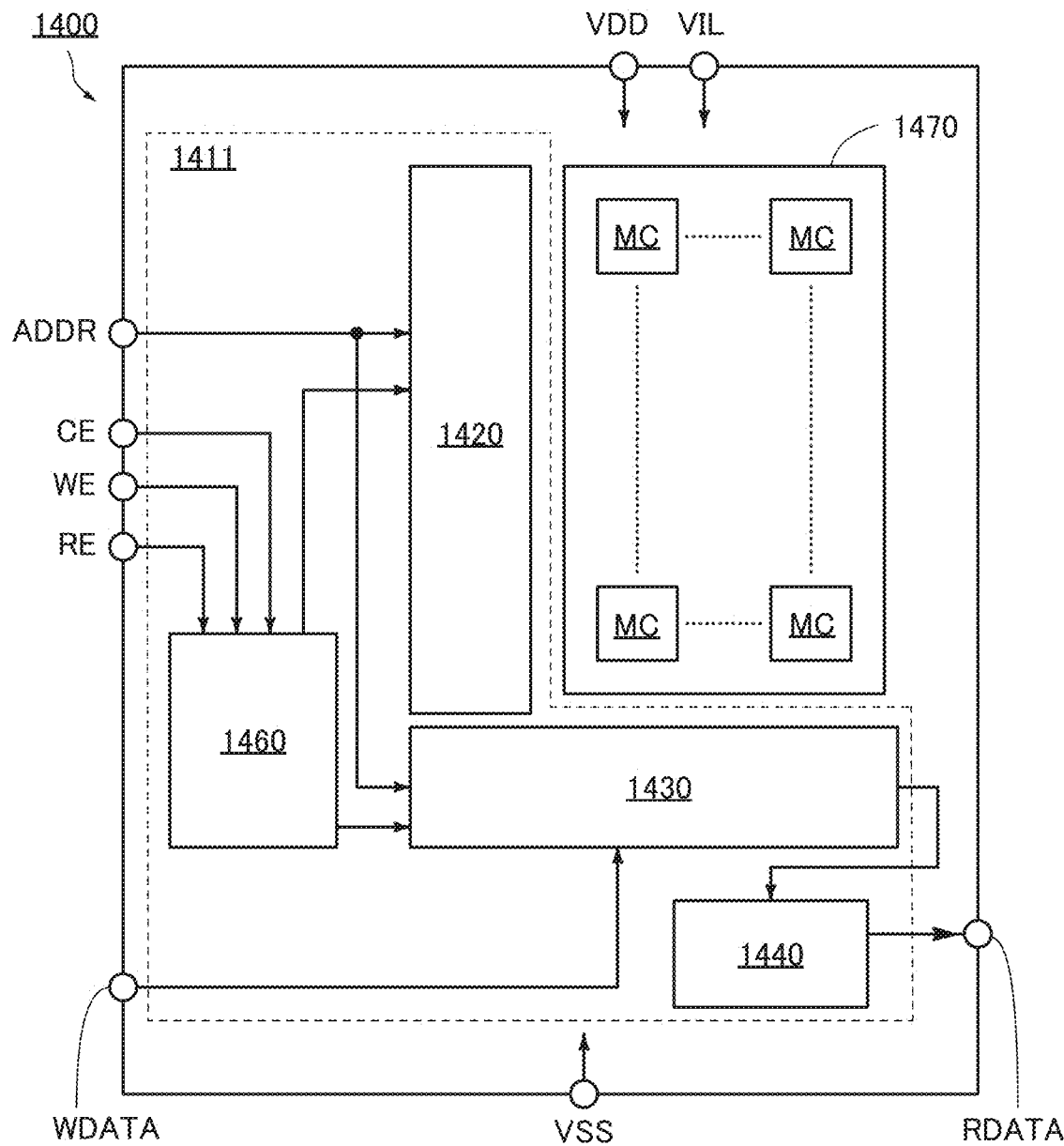
FIG. 15(A) A block diagram illustrating a structure example of a memory device of one embodiment of the present invention. (B) A schematic diagram illustrating a structure example of a memory device of one embodiment of the present invention.

FIG. 15(A) illustrates a structure example of the OS memory device. A memory device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes a column decoder, a precharge circuit, a sense amplifier, and a write circuit, for example. The precharge circuit has a function of precharging wirings. The sense amplifier has a function of amplifying a data signal read from a memory cell. Note that the wirings are wirings connected to memory cells included in the memory cell array 1470, which will be described in detail later. An amplified data signal is output to the outside of the memory device 1400 as a data signal RDATA through the output circuit 1440. The row circuit 1420 includes a row decoder and a word line driver circuit, for example, and can select a row to be accessed.

As power supply voltages, a low power supply voltage (VSS), a high power supply voltage (VDD) for the peripheral circuit 1411, and a high power supply voltage (VIL) for the memory cell array 1470 are supplied to the memory device 1400 from the outside. In addition, control signals (CE, WE, and RE), an address signal ADDR, and a data signal WDATA are input to the memory device 1400 from the outside. The address signal ADDR is input to the row decoder and the column decoder, and WDATA is input to the write circuit.

The control logic circuit 1460 processes the input signals (CE, WE, and RE) from the outside, and generates control signals for the row decoder and the column decoder. CE is a chip enable signal, WE is a write enable signal, and RE is a read-out enable signal. Signals processed by the control logic circuit 1460 are not limited thereto, and other control signals are input as necessary.

The memory cell array 1470 includes a plurality of memory cells MC arranged in a matrix and a plurality of wirings. Note that the number of wirings that connect the memory cell array 1470 and the row circuit 1420 depends on the structure of the memory cell MC, the number of memory cells MC included in one column, and the like. Furthermore, the number of wirings that connect the memory cell array 1470 and the column circuit 1430 depends on the structure of the memory cell MC, the number of memory cells MC included in one row, and the like.

Figure 15B:
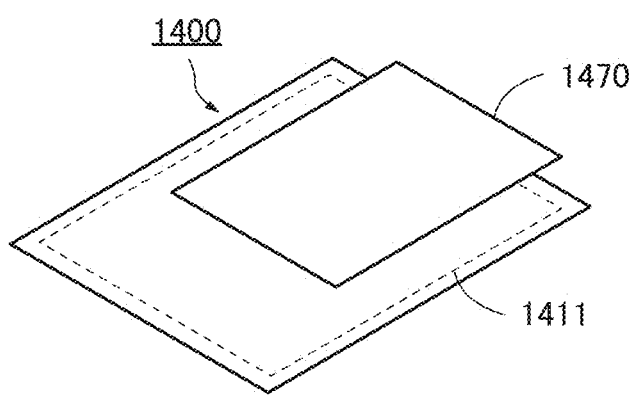

Note that FIG. 15(A) illustrates an example in which the peripheral circuit 1411 and the memory cell array 1470 are formed on the same plane; however, this embodiment is not limited thereto. For example, as illustrated in FIG. 15(B), the memory cell array 1470 may be provided over the peripheral circuit 1411 to partly overlap with the peripheral circuit 1411. For example, a structure may be employed in which the sense amplifier is provided below the memory cell array 1470 to overlap with the memory cell array 1470.

FIG. 16(A) to FIG. 16(H) illustrate structure examples of memory cells applicable to the memory cell MC.

[DOSRAM]

Figure 16A:
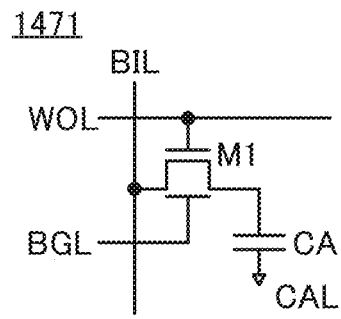
FIG. 16(A) to (H) Circuit diagrams illustrating structure examples of a memory device of one embodiment of the present invention.
Figure 16B:
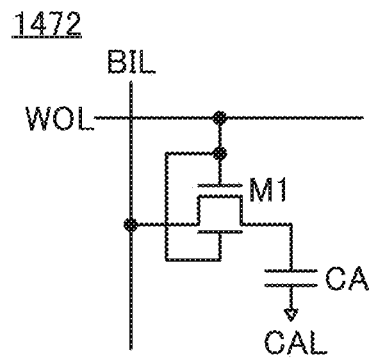
Figure 16C:
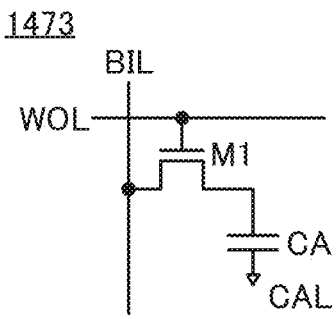
Figure 16D:
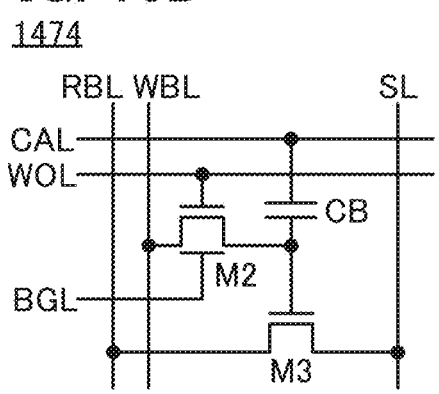
Figure 16E:
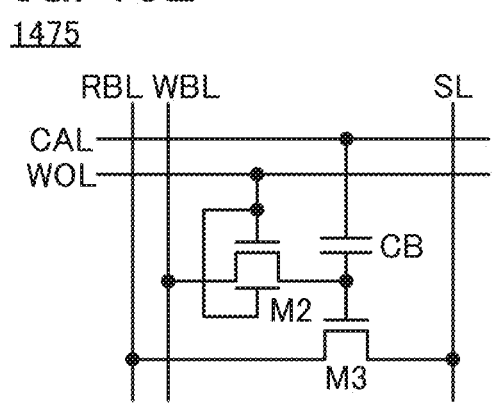
Figure 16F:
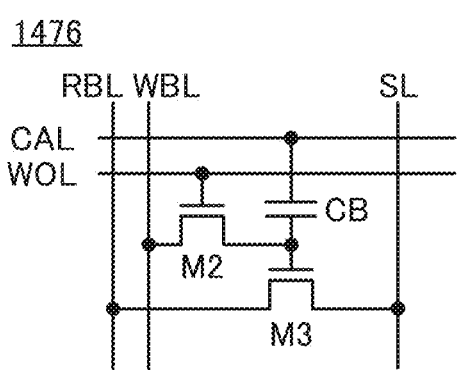
Figure 16G:
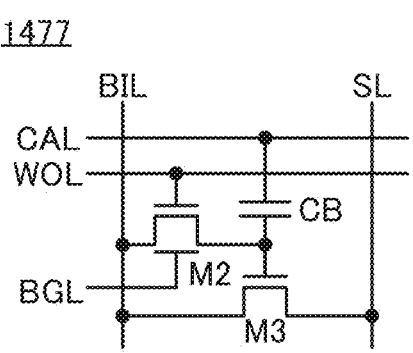

FIG. 16(A) to FIG. 16(C) illustrate circuit structure examples of a memory cell of a DRAM. In this specification and the like, a DRAM using a memory cell including one OS transistor and one capacitor is sometimes referred to as a DOSRAM. A memory cell 1471 illustrated in FIG. 16(A) includes a transistor M1 and a capacitor CA. Note that the transistor M1 includes a gate (sometimes referred to as a top gate) and a back gate.

A first terminal of the transistor M1 is connected to a first terminal of the capacitor CA. A second terminal of the transistor M1 is connected to a wiring BIL. The gate of the transistor M1 is connected to a wiring WOL. The back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. In data writing and reading, a low-level potential is preferably applied to the wiring CAL. The wiring BGL functions as a wiring for applying a potential to the back gate of the transistor M1. Applying a given potential to the wiring BGL can increase or decrease the threshold voltage of the transistor M1.

The memory cell MC is not limited to the memory cell 1471, and its circuit structure can be changed. For example, in the memory cell MC, the back gate of the transistor M1 may be connected to the wiring WOL instead of the wiring BGL as in a memory cell 1472 illustrated in FIG. 16(B). As another example, the memory cell MC may be configured with a single-gate transistor, that is, the transistor M1 that does not have a back gate, like a memory cell 1473 illustrated in FIG. 16(C).

In the case where the semiconductor device described in the above embodiment is used in the memory cell 1471 and the like, the transistor 200 can be used as the transistor M1, and the capacitor 100 can be used as the capacitor CA. When an OS transistor is used as the transistor M1, the leakage current of the transistor M1 can be extremely low. That is, written data can be retained for a long time with the use of the transistor M1; thus, the frequency of refresh of the memory cell can be reduced. Alternatively, the refresh operation of the memory cell can be omitted. In addition, the extremely low leakage current allows multi-level data or analog data to be retained in the memory cell 1471, the memory cell 1472, and the memory cell 1473.

In the DOSRAM, providing the sense amplifier below the memory cell array 1470 so that they overlap with each other as described above can shorten the bit line. This reduces the bit line capacitance, which reduces the storage capacitance of the memory cell.

[NOSRAM]

FIG. 16(D) to FIG. 16(G) each illustrate a circuit structure example of a gain-cell memory cell including two transistors and one capacitor. A memory cell 1474 illustrated in FIG. 16(D) includes a transistor M2, a transistor M3, and a capacitor CB. Note that the transistor M2 includes a top gate (sometimes simply referred to as a gate) and a back gate. In this specification and the like, a memory device including a gain-cell memory cell using an OS transistor as the transistor M2 is referred to as a NOSRAM (Nonvolatile Oxide Semiconductor RAM) in some cases.

A first terminal of the transistor M2 is connected to a first terminal of the capacitor CB. A second terminal of the transistor M2 is connected to a wiring WBL. The gate of the transistor M2 is connected to the wiring WOL. The back gate of the transistor M2 is connected to the wiring BGL. A second terminal of the capacitor CB is connected to the wiring CAL. A first terminal of the transistor M3 is connected to a wiring RBL. A second terminal of the transistor M3 is connected to a wiring SL. A gate of the transistor M3 is connected to the first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. In data writing, data retention, and data reading, a low-level potential is preferably applied to the wiring CAL. The wiring BGL functions as a wiring for applying a potential to the back gate of the transistor M2. Applying a given potential to the wiring BGL can increase or decrease the threshold voltage of the transistor M2.

The memory cell MC is not limited to the memory cell 1474, and its circuit structure can be changed as appropriate. For example, in the memory cell MC, the back gate of the transistor M2 may be connected to the wiring WOL instead of the wiring BGL as in a memory cell 1475 illustrated in FIG. 16(E). As another example, the memory cell MC may be configured with a single-gate transistor, that is, the transistor M2 that does not have a back gate, like a memory cell 1476 illustrated in FIG. 16(F). As another example, the memory cell MC may have a structure in which the wiring WBL and the wiring RBL are combined into one wiring BIL as in a memory cell 1477 illustrated in FIG. 16(G).

In the case where the semiconductor device described in the above embodiment is used in the memory cell 1474 and the like, the transistor 200 can be used as the transistor M2, the transistor 300 can be used as the transistor M3, and the capacitor 100 can be used as the capacitor CB. When an OS transistor is used as the transistor M2, the leakage current of the transistor M2 can be extremely low. Consequently, written data can be retained for a long time with the use of the transistor M2; thus, the frequency of refresh of the memory cell can be reduced. Alternatively, the refresh operation of the memory cell can be omitted. Furthermore, since the leakage current is extremely low, multi-level data or analog data can be retained in the memory cell 1474. The same applies to the memory cell 1475 to the memory cell 1477.

Note that the transistor M3 may be a transistor containing silicon in a channel formation region (hereinafter, such a transistor is referred to as a Si transistor in some cases). The conductivity type of the Si transistor may be an n-channel type or a p-channel type. A Si transistor has higher field-effect mobility than an OS transistor in some cases. Therefore, a Si transistor may be used as the transistor M3 functioning as a read transistor. Furthermore, the use of a Si transistor as the transistor M3 enables the transistor M2 to be stacked over the transistor M3, in which case the area occupied by the memory cell can be reduced and high integration of the memory device can be achieved.

Alternatively, the transistor M3 may be an OS transistor. When OS transistors are used as the transistor M2 and the transistor M3, the circuit of the memory cell array 1470 can be configured using only n-channel transistors.

Figure 16H:
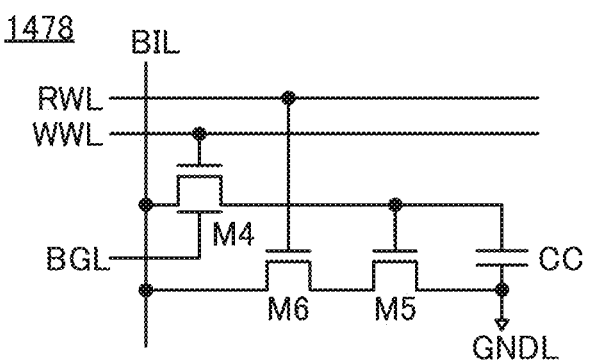

FIG. 16(H) illustrates an example of a gain-cell memory cell including three transistors and one capacitor. A memory cell 1478 illustrated in FIG. 16(H) includes a transistor M4 to a transistor M6 and a capacitor CC. The capacitor CC is provided as appropriate. The memory cell 1478 is electrically connected to the wiring BIL, a wiring RWL, a wiring WWL, the wiring BGL, and a wiring GNDL. The wiring GNDL is a wiring for supplying a low-level potential. Note that the memory cell 1478 may be electrically connected to the wiring RBL and the wiring WBL instead of the wiring BIL.

The transistor M4 is an OS transistor including a back gate, and the back gate is electrically connected to the wiring BGL. Note that the back gate and a gate of the transistor M4 may be electrically connected to each other. Alternatively, the transistor M4 does not necessarily include the back gate.

Note that each of the transistor M5 and the transistor M6 may be an n-channel Si transistor or a p-channel Si transistor. Alternatively, the transistor M4 to the transistor M6 may be OS transistors. In that case, the circuit of the memory cell array 1470 can be configured using only n-channel transistors.

In the case where the semiconductor device described in the above embodiment is used in the memory cell 1478, the transistor 200 can be used as the transistor M4, the transistors 300 can be used as the transistor M5 and the transistor M6, and the capacitor 100 can be used as the capacitor CC. When an OS transistor is used as the transistor M4, the leakage current of the transistor M4 can be extremely low.

Note that the structures of the peripheral circuit 1411, the memory cell array 1470, and the like described in this embodiment are not limited to those described above. The arrangements and functions of these circuits and the wirings, circuit components, and the like connected to these circuits can be changed, removed, or added as needed.

The structure described in this embodiment can be used in an appropriate combination with the structures described in the other embodiments, the examples, and the like.

Embodiment 4

In this embodiment, an example of a chip 1200 on which the semiconductor device of the present invention is mounted will be described with reference to FIG. 17(A) and FIG. 17(B). A plurality of circuits (systems) are mounted on the chip 1200. The technique for integrating a plurality of circuits (systems) on one chip is referred to as system on chip (SoC) in some cases.

Figure 17A:
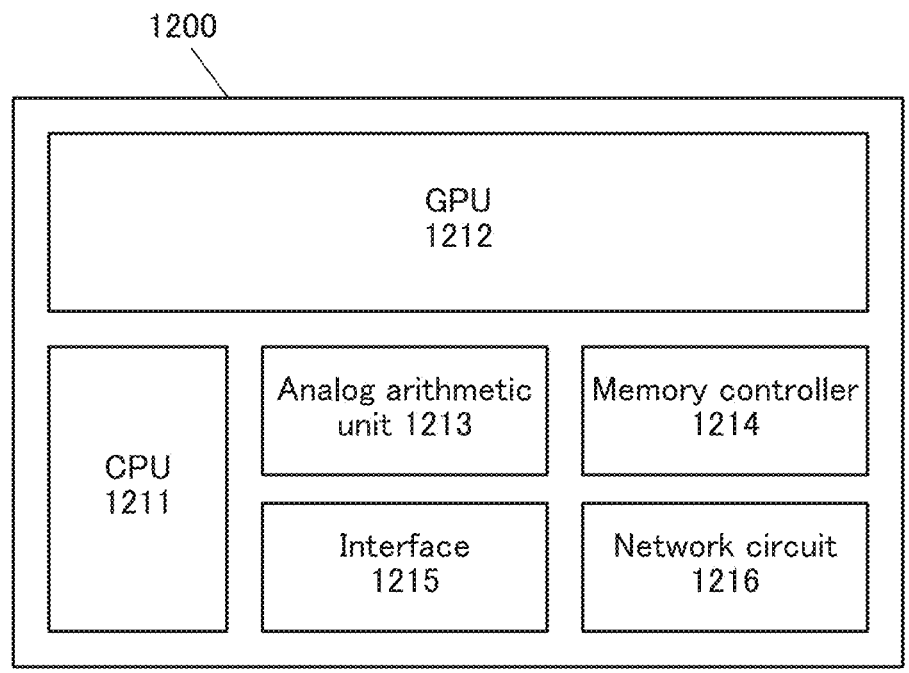
FIG. 17(A) A block diagram of a semiconductor device of one embodiment of the present invention. (B) A schematic diagram of a semiconductor device of one embodiment of the present invention.

As illustrated in FIG. 17(A), the chip 1200 includes a CPU (Central Processing Unit) 1211, a GPU (Graphics Processing Unit) 1212, one or more analog arithmetic units 1213, one or more memory controllers 1214, one or more interfaces 1215, one or more network circuits 1216, and the like.

Figure 17B:
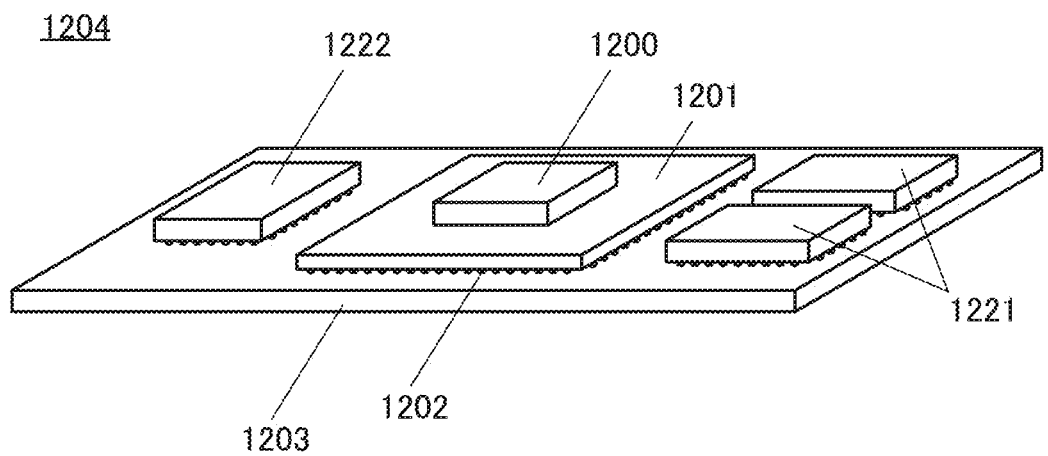

A bump (not illustrated) is provided on the chip 1200, and as illustrated in FIG. 17(B), the chip 1200 is connected to a first surface of a printed circuit board (PCB) 1201. A plurality of bumps 1202 are provided on the rear side of the first surface of the PCB 1201, and the PCB 1201 is connected to a motherboard 1203.

A memory device such as a DRAM 1221 or a flash memory 1222 may be provided over the motherboard 1203. For example, the DOSRAM described in the above embodiment can be used as the DRAM 1221. For example, the NOSRAM described in the above embodiment can be used as the flash memory 1222.

The CPU 1211 preferably includes a plurality of CPU cores. Furthermore, the GPU 1212 preferably includes a plurality of GPU cores. The CPU 1211 and the GPU 1212 may each include a memory for storing data temporarily. Alternatively, a common memory for the CPU 1211 and the GPU 1212 may be provided in the chip 1200. The NOSRAM or the DOSRAM described above can be used as the memory. The GPU 1212 is suitable for parallel computation of a number of data and thus can be used for image processing or product-sum operation. When an image processing circuit or a product-sum operation circuit including an oxide semiconductor of the present invention is provided in the GPU 1212, image processing and product-sum operation can be performed with low power consumption.

In addition, since the CPU 1211 and the GPU 1212 are provided in the same chip, a wiring between the CPU 1211 and the GPU 1212 can be shortened; accordingly, the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. Furthermore, the analog arithmetic unit 1213 may include the above-described product-sum operation circuit.

The memory controller 1214 includes a circuit functioning as a controller of the DRAM 1221 and a circuit functioning as the interface of the flash memory 1222.

The interface 1215 includes an interface circuit for connection with an external connection device such as a display device, a speaker, a microphone, a camera, or a controller. Examples of the controller include a mouse, a keyboard, and a game controller. As such an interface, USB (Universal Serial Bus), HDMI (registered trademark) (High-Definition Multimedia Interface), or the like can be used.

The network circuit 1216 includes a circuit for a network such as a LAN (Local Area Network). Furthermore, the network circuit 1216 may include a circuit for network security.

The circuits (systems) can be formed in the chip 1200 in the same manufacturing process. Therefore, even when the number of circuits needed for the chip 1200 is increased, there is no need to increase the number of steps in the manufacturing process; thus, the chip 1200 can be manufactured at low cost.

The motherboard 1203 provided with the PCB 1201 on which the chip 1200 including the GPU 1212 is mounted, the DRAM 1221, and the flash memory 1222 can be referred to as a GPU module 1204.

The GPU module 1204 includes the chip 1200 formed using the SoC technology, and thus can have a small size. Furthermore, the GPU module 1204 is excellent in image processing, and thus is suitably used in a portable electronic device such as a smartphone, a tablet terminal, a laptop PC, or a portable (mobile) game machine. Furthermore, the product-sum operation circuit using the GPU 1212 can implement an arithmetic operation such as a deep neural network (DNN), a convolutional neural network (CNN), a recurrent neural network (RNN), an autoencoder, a deep Boltzmann machine (DBM), or a deep belief network (DBN); thus, the chip 1200 can be used as an AI chip or the GPU module 1204 can be used as an AI system module.

The structure described in this embodiment can be used in an appropriate combination with the structures described in the other embodiments, the examples, and the like.

Embodiment 5

In this embodiment, application examples of the memory device using the semiconductor device described in the above embodiment will be described. The semiconductor device described in the above embodiment can be used for, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is used for removable memory devices such as memory cards (e.g., SD cards), USB memories, and SSDs (solid state drives). FIG. 18(A) to FIG. 18(E) schematically illustrate some structure examples of removable memory devices. The semiconductor device described in the above embodiment is processed into a packaged memory chip and used in a variety of storage devices and removable memories, for example.

Figure 18A:
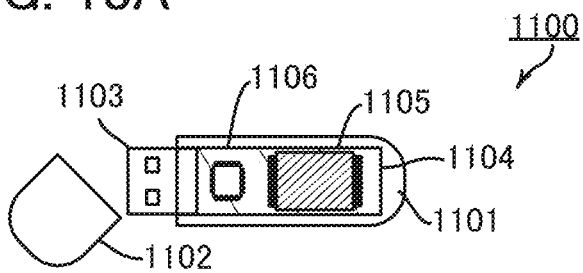
FIG. 18(A) to (E) Schematic diagrams of memory devices of one embodiment of the present invention.

FIG. 18(A) is a schematic view of a USB memory. A USB memory 1100 includes a housing 1101, a cap 1102, a USB connector 1103, and a substrate 1104. The substrate 1104 is held in the housing 1101. For example, a memory chip 1105 and a controller chip 1106 are attached to the substrate 1104. The semiconductor device described in the above embodiment can be incorporated in the memory chip 1105 or the like.

Figure 18B:
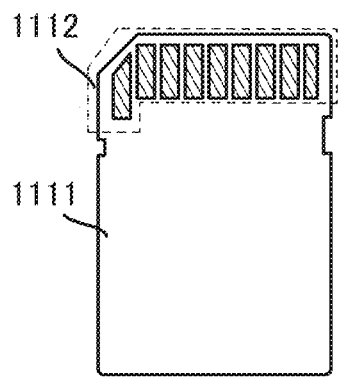
Figure 18C:
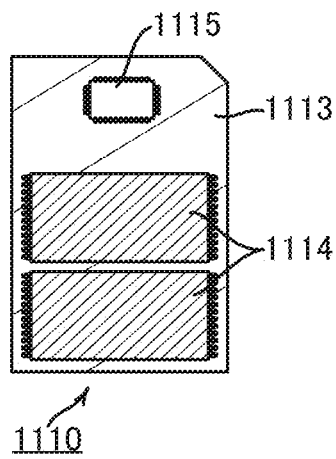

FIG. 18(B) is a schematic external view of an SD card, and FIG. 18(C) is a schematic view of the internal structure of the SD card. An SD card 1110 includes a housing 1111, a connector 1112, and a substrate 1113. The substrate 1113 is held in the housing 1111. For example, a memory chip 1114 and a controller chip 1115 are attached to the substrate 1113. When the memory chip 1114 is also provided on the rear surface side of the substrate 1113, the capacity of the SD card 1110 can be increased. In addition, a wireless chip with a radio communication function may be provided on the substrate 1113. With such a wireless chip, data can be read from and written in the memory chip 1114 by radio communication between a host device and the SD card 1110. The semiconductor device described in the above embodiment can be incorporated in the memory chip 1114 or the like.

Figure 18D:
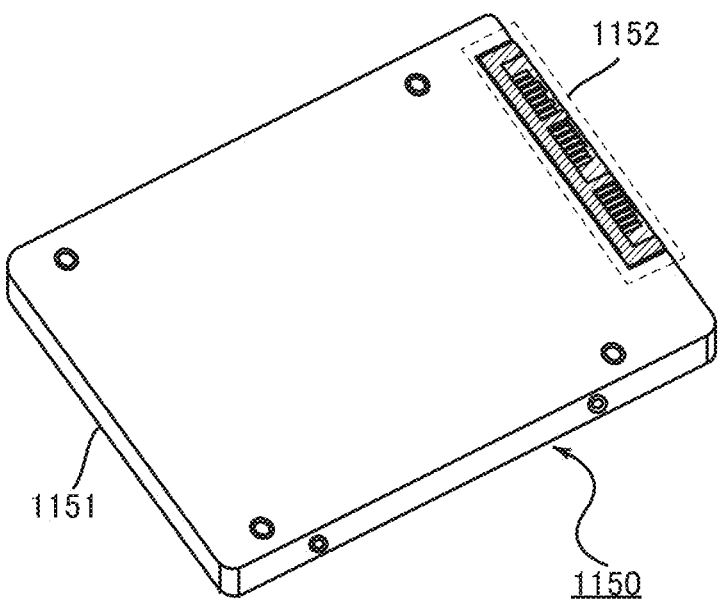
Figure 18E:
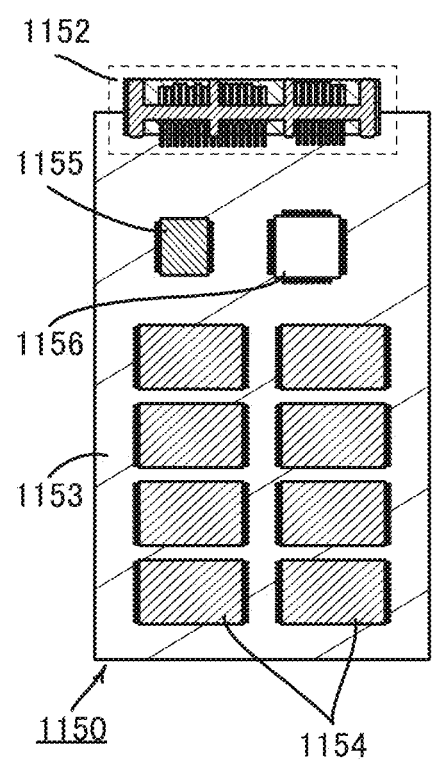

FIG. 18(D) is a schematic external view of an SSD, and FIG. 18(E) is a schematic view of the internal structure of the SSD. An SSD 1150 includes a housing 1151, a connector 1152, and a substrate 1153. The substrate 1153 is held in the housing 1151. For example, a memory chip 1154, a memory chip 1155, and a controller chip 1156 are attached to the substrate 1153. The memory chip 1155 is a work memory for the controller chip 1156, and a DOSRAM chip can be used, for example. When the memory chip 1154 is also provided on the rear surface side of the substrate 1153, the capacity of the SSD 1150 can be increased. The semiconductor device described in the above embodiment can be incorporated in the memory chip 1154 or the like.

This embodiment can be implemented in an appropriate combination with the structures described in the other embodiments, the examples, and the like.

Embodiment 6

The semiconductor device of one embodiment of the present invention can be used for a chip or a processor such as a CPU or a GPU. FIG. 19 illustrates specific examples of electronic devices including a processor such as a CPU or a GPU or a chip of one embodiment of the present invention.
<Electronic Device and System>

The GPU or the chip of one embodiment of the present invention can be incorporated into a variety of electronic devices. Examples of electronic devices include a digital camera, a digital video camera, a digital photo frame, an e-book reader, a mobile phone, a portable game machine, a portable information terminal, and an audio reproducing device in addition to electronic devices provided with a relatively large screen, such as a television device, a monitor for a desktop or notebook information terminal or the like, digital signage, and a large game machine like a pachinko machine. When the GPU or the chip of one embodiment of the present invention is provided in an electronic device, the electronic device can include artificial intelligence.

The electronic device of one embodiment of the present invention may include an antenna. When a signal is received by the antenna, the electronic device can display a video, data, or the like on the display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radioactive rays, flow rate, humidity, gradient, oscillation, a smell, or infrared rays).

The electronic device of one embodiment of the present invention can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIG. 19(A) to FIG. 19(H) illustrate examples of electronic devices.

[Information Terminal]

Figure 19A:
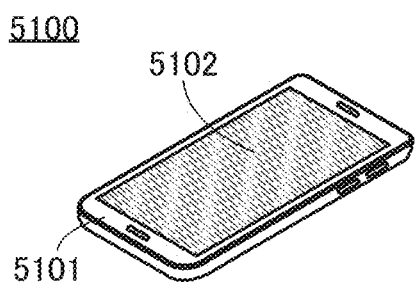
FIG. 19(A) to (H) Diagrams illustrating electronic devices of one embodiment of the present invention.

FIG. 19(A) illustrates a mobile phone (smartphone), which is a type of information terminal. An information terminal 5100 includes a housing 5101 and a display portion 5102. As input interfaces, a touch panel is provided in the display portion 5102 and a button is provided in the housing 5101.

The information terminal 5100 can execute an application utilizing artificial intelligence, with the use of the chip of one embodiment of the present invention. Examples of the application utilizing artificial intelligence include an application for interpreting a conversation and displaying its content on the display portion 5102; an application for recognizing letters, figures, and the like input to the touch panel of the display portion 5102 by a user and displaying them on the display portion 5102; and an application for biometric authentication using fingerprints, voice prints, or the like.

Figure 19B:
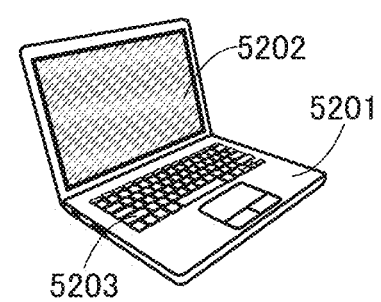

FIG. 19(B) illustrates a notebook information terminal 5200. The notebook information terminal 5200 includes a main body 5201 of the information terminal, a display portion 5202, and a keyboard 5203.

Like the information terminal 5100 described above, the notebook information terminal 5200 can execute an application utilizing artificial intelligence, with the use of the chip of one embodiment of the present invention. Examples of the application utilizing artificial intelligence include design-support software, text correction software, and software for automatic menu generation. Furthermore, with the use of the notebook information terminal 5200, novel artificial intelligence can be developed.

Note that although the smartphone and the notebook information terminal are respectively illustrated in FIG. 19(A) and FIG. 19(B) as examples of the electronic device, one embodiment of the present invention can be applied to an information terminal other than the smartphone and the notebook information terminal. Examples of an information terminal other than the smartphone and the notebook information terminal include a PDA (Personal Digital Assistant), a desktop information terminal, and a workstation.

[Game Machine]

Figure 19C:
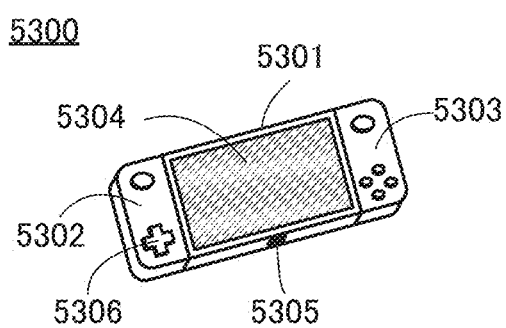

FIG. 19(C) illustrates a portable game machine 5300, which is an example of a game machine. The portable game machine 5300 includes a housing 5301, a housing 5302, a housing 5303, a display portion 5304, a connection portion 5305, an operation key 5306, and the like. The housing 5302 and the housing 5303 can be detached from the housing 5301. When the connection portion 5305 provided in the housing 5301 is attached to another housing (not illustrated), a video to be output to the display portion 5304 can be output to another video device (not illustrated). In that case, the housing 5302 and the housing 5303 can each function as an operating unit. Thus, a plurality of players can play a game at the same time. The chip described in the above embodiment can be incorporated into a chip provided on a substrate in the housing 5301, the housing 5302, and the housing 5303, for example.

Figure 19D:
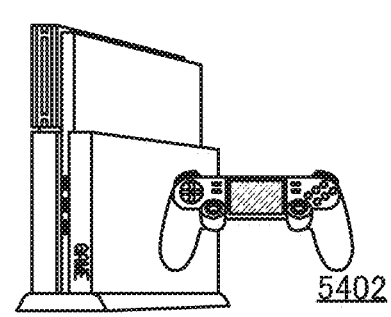

FIG. 19(D) illustrates a stationary game machine 5400, which is an example of a game machine. A controller 5402 is connected to the stationary game machine 5400 with or without a wire.

Using the GPU or the chip of one embodiment of the present invention in a game machine such as the portable game machine 5300 and the stationary game machine 5400 can achieve a low-power-consumption game machine. Moreover, heat generation from a circuit can be reduced owing to low power consumption; thus, the influence of heat generation on the circuit, the peripheral circuit, and the module can be reduced.

Furthermore, when the GPU or the chip of one embodiment of the present invention is used in the portable game machine 5300, the portable game machine 5300 including artificial intelligence can be obtained.

In general, the progress of a game, the actions and words of game characters, and expressions of a phenomenon and the like in the game are determined by the program in the game; however, the use of artificial intelligence in the portable game machine 5300 enables expressions not limited by the game program. For example, questions posed by the player, the progress of the game, timing when an event occurs in the game, the actions and words of the game characters, and the like can be changed for various expressions without being limited by the game program.

When a game requiring a plurality of players is played on the portable game machine 5300, the artificial intelligence can create a virtual game player; thus, the game can be played alone with the game player created by the artificial intelligence as an opponent.

Although the portable game machine and the stationary game machine are respectively illustrated in FIG. 19(C) and FIG. 19(D) as examples of a game machine, the game machine using the GPU or the chip of one embodiment of the present invention is not limited thereto. Examples of the game machine using the GPU or the chip of one embodiment of the present invention include an arcade game machine installed in entertainment facilities (a game center, an amusement park, and the like) and a throwing machine for batting practice installed in sports facilities.

[Large Computer]

The GPU or the chip of one embodiment of the present invention can be used in a large computer.

Figure 19E:
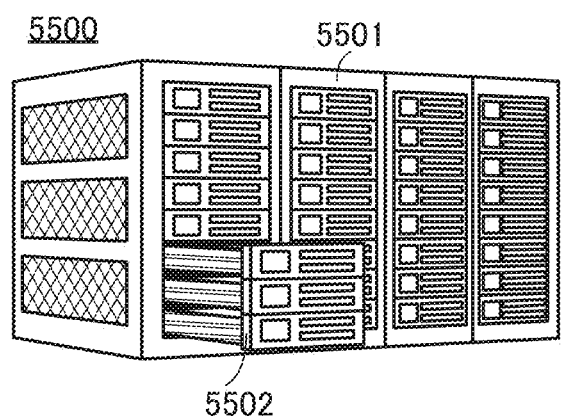
Figure 19F:
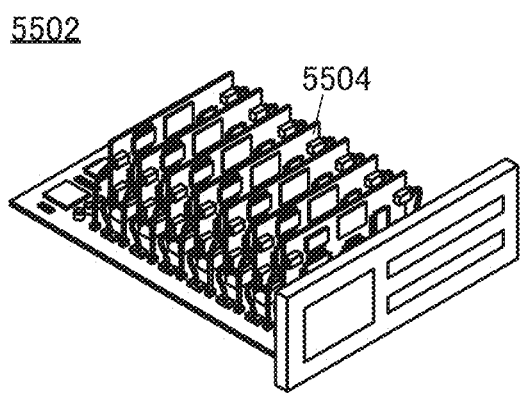

FIG. 19(E) illustrates a supercomputer 5500 as an example of a large computer. FIG. 19(F) illustrates a rack-mount computer 5502 included in the supercomputer 5500.

The supercomputer 5500 includes a rack 5501 and a plurality of rack-mount computers 5502. The plurality of computers 5502 are stored in the rack 5501. The computer 5502 includes a plurality of substrates 5504, and the GPU or the chip described in the above embodiment can be mounted on the substrates.

The supercomputer 5500 is a large computer mainly used for scientific computation. In scientific computation, an enormous amount of arithmetic operation needs to be processed at a high speed; hence, power consumption is high and chips generate a large amount of heat. Using the GPU or the chip of one embodiment of the present invention in the supercomputer 5500 can achieve a low-power-consumption supercomputer. Moreover, heat generation from a circuit can be reduced owing to low power consumption; thus, the influence of heat generation on the circuit, the peripheral circuit, and the module can be reduced.

Although a supercomputer is illustrated as an example of a large computer in FIG. 19(E) and FIG. 19(F), a large computer using the GPU or the chip of one embodiment of the present invention is not limited thereto. Examples of a large computer using the GPU or the chip of one embodiment of the present invention include a computer that provides service (a server) and a large general-purpose computer (a mainframe).

[Moving Vehicle]

The GPU or the chip of one embodiment of the present invention can be used in an automobile, which is a moving vehicle, and around a driver's seat in the automobile.

Figure 19G:
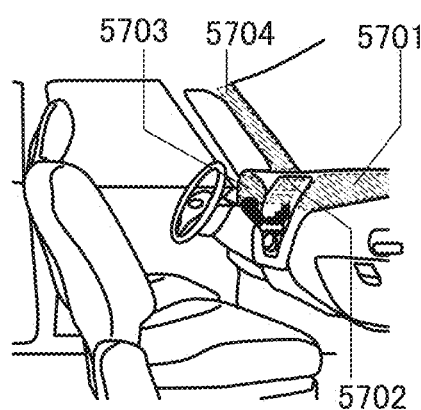

FIG. 19(G) illustrates the periphery of a windshield inside an automobile, which is an example of a moving vehicle. FIG. 19(G) illustrates a display panel 5701, a display panel 5702, and a display panel 5703 that are attached to a dashboard and a display panel 5704 that is attached to a pillar.

The display panel 5701 to the display panel 5703 can provide a variety of kinds of information by displaying a speedometer, a tachometer, a mileage, a fuel meter, a gear-shift indicator, air-condition setting, and the like. The content, layout, or the like of the display on the display panels can be changed as appropriate to suit the user's preference, so that the design can be improved. The display panel 5701 to the display panel 5703 can also be used as lighting devices.

The display panel 5704 can compensate for the view obstructed by the pillar (a blind spot) by showing an image taken by an imaging device (not illustrated) provided on the outside of the automobile. That is, displaying an image taken by the imaging device provided on the outside of the automobile leads to compensation for the blind spot and enhancement of safety. In addition, showing an image for compensating for the area that cannot be seen makes it possible to confirm the safety more naturally and comfortably. The display panel 5704 can also be used as a lighting device.

Since the GPU or the chip of one embodiment of the present invention can be used as a component of artificial intelligence, the chip can be used in an automatic driving system of the automobile, for example. The chip can also be used for a system for navigation, risk prediction, or the like. The display panel 5701 to the display panel 5704 may display information regarding navigation, risk prediction, or the like.

Although an automobile is described above as an example of a moving vehicle, a moving vehicle is not limited to an automobile. Examples of a moving vehicle include a train, a monorail train, a ship, and a flying object (a helicopter, an unmanned aircraft (a drone), an airplane, and a rocket), and these moving vehicles can include a system utilizing artificial intelligence when equipped with the chip of one embodiment of the present invention.

[Electrical Appliance]

Figure 19H:
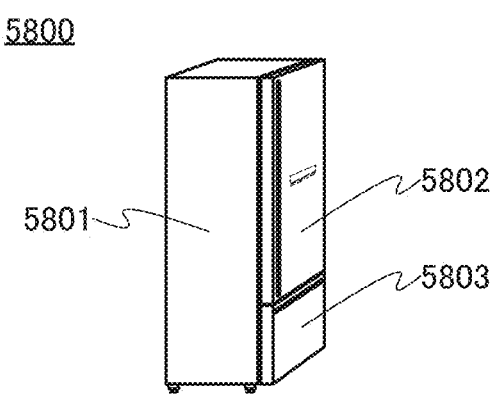

FIG. 19(H) illustrates an electric refrigerator-freezer 5800, which is an example of an electrical appliance. The electric refrigerator-freezer 5800 includes a housing 5801, a refrigerator door 5802, a freezer door 5803, and the like.

When the chip of one embodiment of the present invention is used in the electric refrigerator-freezer 5800, the electric refrigerator-freezer 5800 including artificial intelligence can be obtained. Utilizing the artificial intelligence enables the electric refrigerator-freezer 5800 to have a function of automatically making a menu based on foods stored in the electric refrigerator-freezer 5800, expiration dates of the foods, or the like, a function of automatically adjusting the temperature to be appropriate for the foods stored in the electric refrigerator-freezer 5800, and the like.

Although the electric refrigerator-freezer is described as an example of an electrical appliance, other examples of an electrical appliance include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

The electronic devices, the functions of the electronic devices, application examples of artificial intelligence and its effects, and the like described in this embodiment can be combined as appropriate with the description of another electronic device.

This embodiment can be implemented in an appropriate combination with the structures described in the other embodiments, the examples, and the like.

Example 1

In this example, the hydrogen concentrations in insulating films were evaluated. Specifically, samples (Sample 1A to Sample 4A) in each of which an insulating film was formed were fabricated, and the hydrogen concentrations in the insulating films were measured by SIMS.

First, a method for fabricating Sample 1A to Sample 4A is described.

A method for fabricating Sample 1A is described. A 500-nm-thick silicon oxynitride film was formed over a substrate containing silicon by a CVD method. Through the above process, Sample 1A was obtained.

Next, a method for fabricating Sample 2A is described. A 300-nm-thick silicon oxide film was formed over a substrate containing silicon by a sputtering method. Through the above process, Sample 2A was obtained.

Next, a method for fabricating Sample 3A is described. A surface of a substrate containing silicon was subjected to heat treatment in a hydrogen chloride (HCl) atmosphere, and a 100-nm-thick silicon oxide film was formed over the substrate. Next, a 500-nm-thick silicon nitride film was formed over the silicon oxide film by a CVD method. Through the above process, Sample 3A was obtained.

Next, a method for fabricating Sample 4A is described. A surface of a substrate containing silicon was subjected to heat treatment in a hydrogen chloride (HCl) atmosphere, and a 100-nm-thick silicon oxide film was formed over the substrate. Next, a 50-nm-thick silicon nitride film was formed over the silicon oxide film by a sputtering method, and a 50-nm-thick silicon nitride film was formed over the silicon nitride film by a sputtering method. Through the above process, Sample 4A was obtained.

Figure 20A:
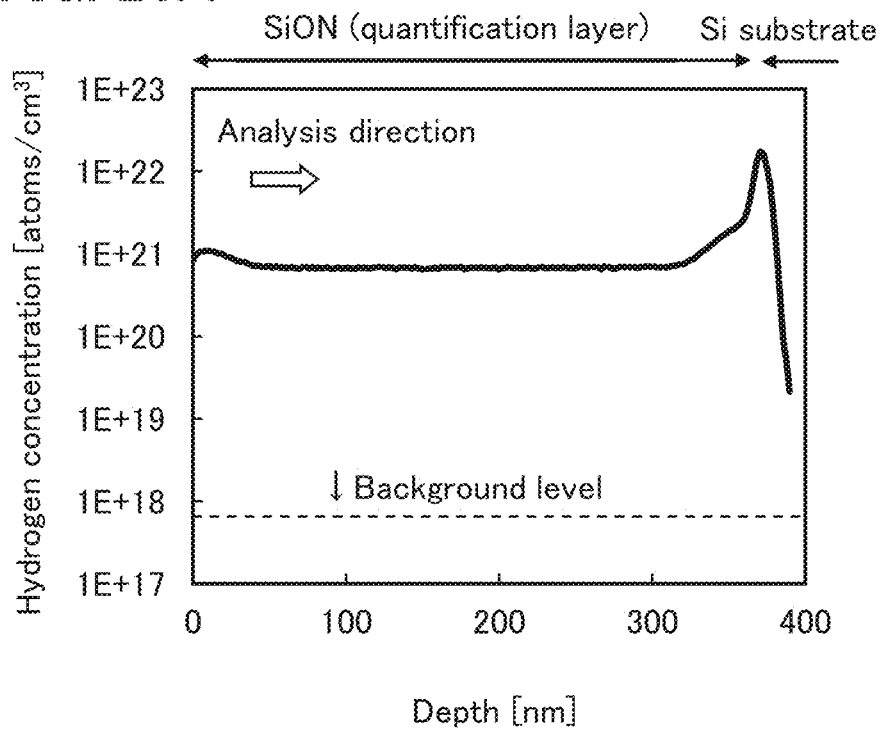
FIG. 20(A), (B) Diagrams showing SIMS analysis results in Example.
Figure 20B:
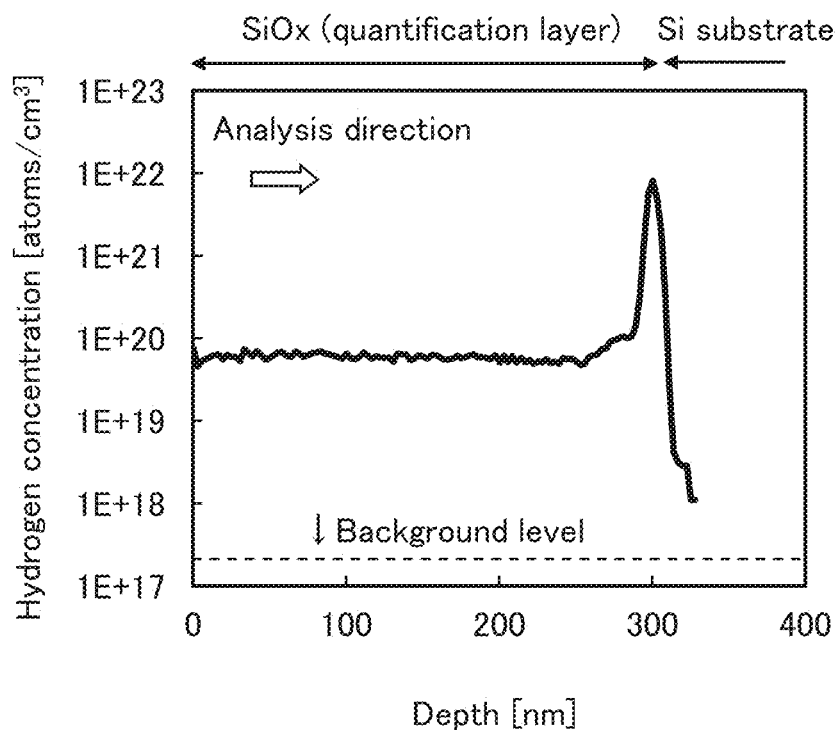
Figure 21:
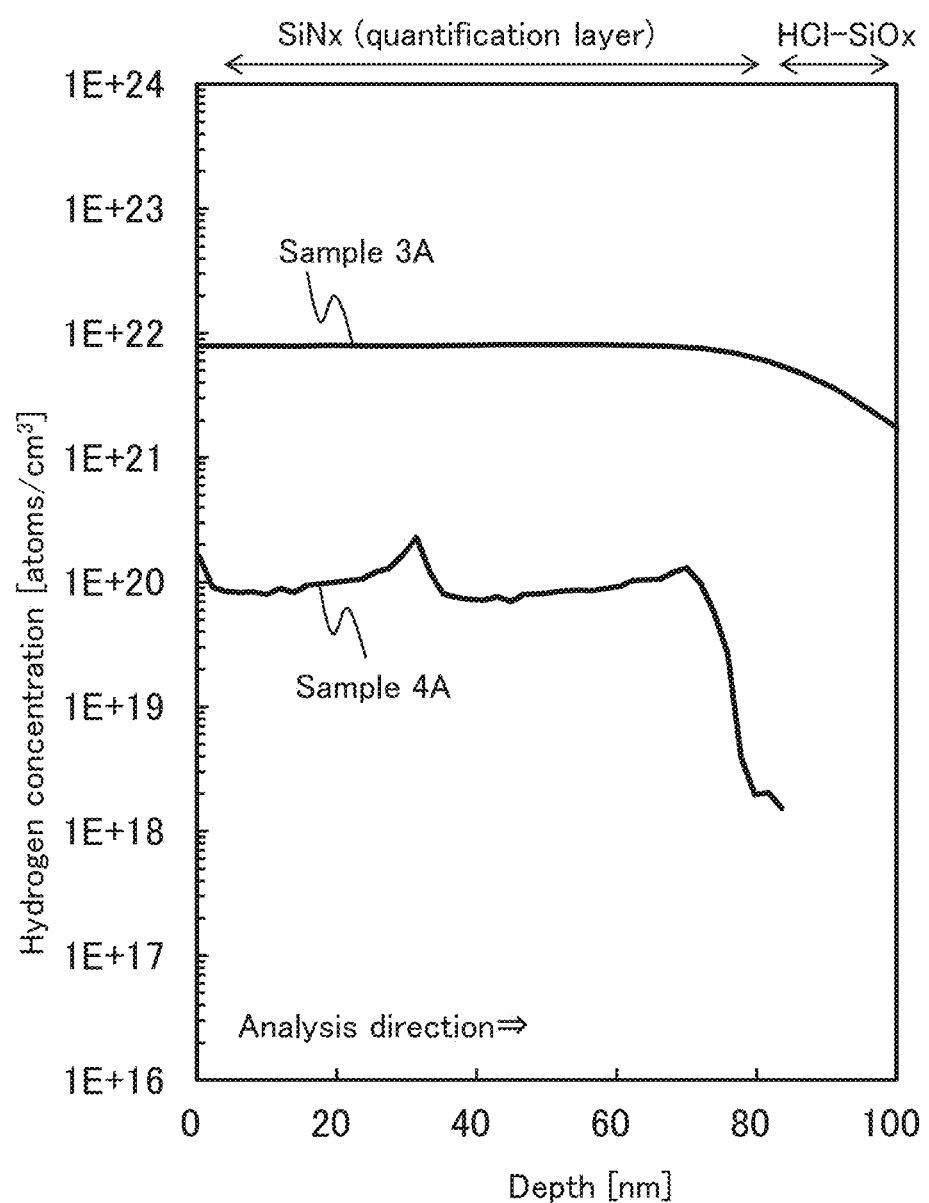
FIG. 21 A diagram showing SIMS analysis results in Example.

The hydrogen concentrations in Sample 1A to Sample 4A fabricated above were evaluated with a SIMS analysis apparatus. Note that the analysis was performed on the surface of each sample. FIG. 20(A), FIG. 20(B), and FIG. 21 show the SIMS analysis results.

FIG. 20(A) shows the SIMS analysis results of Sample 1A, and shows a hydrogen concentration profile in the depth direction of the silicon oxynitride film (SiON) formed by a CVD method. FIG. 20(B) shows the SIMS analysis results of Sample 2A, and shows a hydrogen concentration profile in the depth direction of the silicon oxide film (SiOx) formed by a sputtering method. In FIG. 20(A) and FIG. 20(B), the horizontal axis represents depth [nm] in the direction perpendicular to the film surface of the sample, and the vertical axis represents the hydrogen concentration [atoms/cm$^3$] in the film. Note that the depth in SIMS in this specification is an approximate value estimated from the etching rate of a silicon oxide film and does not always match the actual depth; therefore, the depth in SIMS is used only as a guide. In FIG. 20(A) and FIG. 20(B), the hydrogen concentrations in the silicon oxynitride film and the silicon oxide film are quantified.

FIG. 20(A) reveals that the average hydrogen concentration in the silicon oxynitride film formed by a CVD method is approximately $7 \times 10^{20}$ atoms/cm$^3$ in the range of the depth (the horizontal axis) from 50 nm to 250 nm. FIG. 20(B) reveals that the average hydrogen concentration in the silicon oxide film formed by a sputtering method is approximately $6 \times 10^{19}$ atoms/cm$^3$ in the range of the depth (the horizontal axis) from 50 nm to 250 nm. That is, the hydrogen concentration in the silicon oxide film formed by a sputtering method is found to be lower than the hydrogen concentration in the silicon oxynitride film formed by a CVD method. Thus, forming the silicon oxide film by a sputtering method can reduce the hydrogen concentration in the silicon oxide film.

FIG. 21 shows the SIMS analysis results of Sample 3A and Sample 4A, and shows hydrogen concentration profiles in the depth direction of the silicon nitride film (SiNx) formed by a CVD method or a sputtering method. In FIG. 21, the horizontal axis represents depth [nm] in the direction perpendicular to the film surface of the sample, and the vertical axis represents the hydrogen concentration [atoms/cm$^3$] in the film. FIG. 21 shows the hydrogen concentration profiles such that the top surfaces of the silicon oxides in Sample 3A and Sample 4A are aligned with each other. In FIG. 21, the hydrogen concentration in the silicon nitride film is quantified.

FIG. 21 reveals that the average hydrogen concentration in the silicon nitride film formed by a CVD method is approximately $8 \times 10^{21}$ atoms/cm$^3$ in the range of the depth (the horizontal axis) from 40 nm to 60 nm. Moreover, the average hydrogen concentration in the silicon nitride film formed by a sputtering method is approximately $8 \times 10^{19}$ atoms/cm$^3$ in the range of the depth (the horizontal axis) from 40 nm to 60 nm. That is, the hydrogen concentration in the silicon nitride film formed by a sputtering method is found to be lower than the hydrogen concentration in the silicon nitride film formed by a CVD method. Thus, forming the silicon nitride film by a sputtering method can reduce the hydrogen concentration in the silicon nitride film.

At least part of the structure, the method, and the like described in this example can be implemented in appropriate combination with other embodiments and examples described in this specification.

Example 2

In this example, hydrogen-transmitting properties of insulating films were evaluated. Specifically, samples (Sample 2B to Sample 7B) in each of which an insulating film whose hydrogen-transmitting property was to be evaluated was provided between an insulating film containing deuterium and an insulating film functioning as a quantification layer and a sample (Sample 1B) in which the insulating film was not provided were fabricated, and the deuterium concentrations in the insulating films functioning as quantification layers were measured by SIMS.

First, a method for fabricating Sample 1B to Sample 7B is described.

A method for fabricating Sample 1B is described. A surface of a substrate containing silicon was subjected to heat treatment in a hydrogen chloride (HCl) atmosphere, and a 100-nm-thick silicon oxide film was formed over the substrate. Next, a 100-nm-thick first silicon oxynitride film was formed over the silicon oxide film by a CVD method. Note that the first silicon oxynitride film was formed using a silane ($SiH_4$) gas, a dinitrogen monoxide ($N_2O$) gas, and an argon gas containing 5% deuterium ($D_2$), whereby the film was able to contain deuterium at a proportion higher than the natural abundance.

Next, a 100-nm-thick second silicon oxynitride film was formed over the first silicon oxynitride film by a CVD method. Note that the second silicon oxynitride film was formed using a silane ($SiH_4$) gas and a dinitrogen monoxide ($N_2O$) gas, so that deuterium was mixed into the film at approximately the natural abundance. Through the above process, Sample 1B was obtained.

Next, a method for fabricating Sample 2B is described. As in Sample 1B, a silicon oxide film and a first silicon oxynitride film were formed over a substrate containing silicon. Next, a 10-nm-thick aluminum oxide film was formed over the first silicon oxynitride film by an ALD method. Next, a 100-nm-thick second silicon oxynitride film was formed over the aluminum oxide film by a method similar to that for Sample 1B. Through the above process, Sample 2B was obtained.

Next, a method for fabricating Sample 3B is described. As in Sample 2B, a silicon oxide film, a first silicon oxynitride film, an aluminum oxide film, and a second silicon oxynitride film were formed over a substrate containing silicon. Next, heat treatment was performed at 400° C. in a nitrogen atmosphere for 4 hours. Through the above process, Sample 3B was obtained.

Next, a method for fabricating Sample 4B is described. As in Sample 1B, a silicon oxide film and a first silicon oxynitride film were formed over a substrate containing silicon. Next, a 10-nm-thick silicon nitride film was formed over the first silicon oxynitride film by a sputtering method. Next, a 100-nm-thick second silicon oxynitride film was formed over the silicon nitride film by a method similar to that for Sample 1B. Through the above process, Sample 4B was obtained.

Next, a method for fabricating Sample 5B is described. As in Sample 4B, a silicon oxide film, a first silicon oxynitride film, a silicon nitride film, and a second silicon oxynitride film were formed over a substrate containing silicon. Next, heat treatment was performed at 400° C. in a nitrogen atmosphere for 4 hours. Through the above process, Sample 5B was obtained.

Next, a method for fabricating Sample 6B is described. As in Sample 1B, a silicon oxide film and a first silicon oxynitride film were formed over a substrate containing silicon. Next, a 10-nm-thick silicon nitride film was formed over the first silicon oxynitride film by a CVD method. Next, a 100-nm-thick second silicon oxynitride film was formed over the silicon nitride film by a method similar to that for Sample 1B. Through the above process, Sample 6B was obtained.

Next, a method for fabricating Sample 7B is described. As in Sample 6B, a silicon oxide film, a first silicon oxynitride film, a silicon nitride film, and a second silicon oxynitride film were formed over a substrate containing silicon. Next, heat treatment was performed at 400° C. in a nitrogen atmosphere for 4 hours. Through the above process, Sample 7B was obtained.

Through the above processes, Sample 1B to Sample 7B were fabricated. Table 1 summarizes the processing conditions of the samples.

TABLE 1

| Sample No. | 1B | 2B | 3B | 4B | 5B | 6B | 7B |
|---|---|---|---|---|---|---|---|
| Heat treatment | No | No | Yes | No | Yes | No | Yes |
| Second silicon oxynitride film | | | | 100 nm | | | |
| Silicon nitride film (CVD method) | | | | | | 10 nm | |
| Silicon nitride film (sputtering method) | | | | 10 nm | | | |
| Aluminum oxide film | | 10 nm | | | | | |
| First silicon oxynitride film | | | | 100 nm | | | |
| Silicon oxide film | | | | 100 nm | | | |

The deuterium concentration in the second silicon oxynitride film in each of Sample 1B to Sample 7B fabricated above was evaluated with a SIMS analysis apparatus. Note that the analysis was performed on the surface of each sample. FIG. 22(A), FIG. 22(B), FIG. 23(A), and FIG. 23(B) show the SIMS analysis results. The dotted lines in FIG. 22(A), FIG. 22(B), FIG. 23(A), and FIG. 23(B) show a background level (BG) of hydrogen. In FIG. 22(A), FIG. 22(B), FIG. 23(A), and FIG. 23(B), the horizontal axis represents depth [nm] in the direction perpendicular to the film surface of the sample, and the vertical axis represents the deuterium concentration [atoms/$cm^3$] in the film. In FIG. 22(A), FIG. 22(B), FIG. 23(A), and FIG. 23(B), the deuterium concentration in the second silicon oxynitride film is quantified.

Figure 22A:
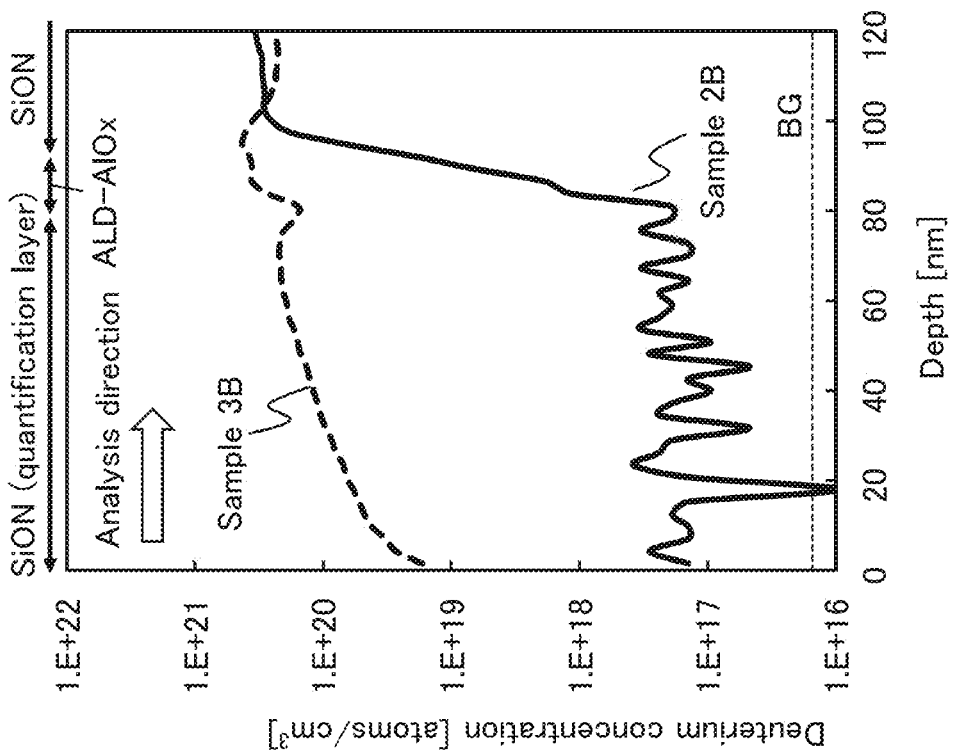
FIG. 22(A), (B) Diagrams showing SIMS analysis results in Example.

FIG. 22(A) shows the SIMS analysis results of Sample 1B, and shows a deuterium concentration profile in the depth direction of the second silicon oxynitride film over the first silicon oxynitride film.

FIG. 22(A) indicates that the deuterium concentration in the second silicon oxynitride film in Sample 1B becomes higher toward the interface between the second silicon oxynitride film and the first silicon oxynitride film. This reveals that deuterium contained in the first silicon oxynitride film is diffused to the second silicon oxynitride film by the temperature applied to the substrate during the formation of the second silicon oxynitride film.

Figure 22B:
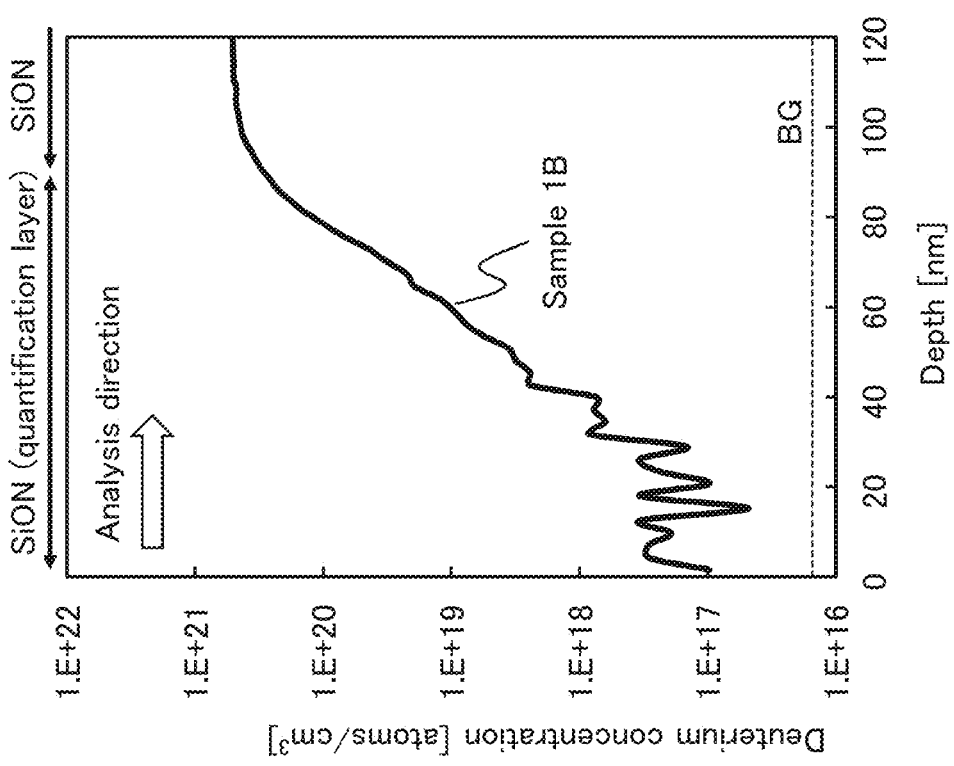

FIG. 22(B) shows the SIMS analysis results of Sample 2B and Sample 3B, and shows deuterium concentration profiles in the depth direction of the second silicon oxynitride film over the aluminum oxide film (ALD-AlOx). In FIG. 22(B), the solid line represents the deuterium concentration profile of Sample 2B, and the dashed line represents the deuterium concentration profile of Sample 3B.

FIG. 22(B) reveals that the deuterium concentration in the second silicon oxynitride film in Sample 2B is substantially the same in the depth direction of the film. The SIMS analysis results of Sample 1B and Sample 2B demonstrate that providing the aluminum oxide film between the first silicon oxynitride film and the second silicon oxynitride film inhibits diffusion of deuterium contained in the first silicon oxynitride film into the second silicon oxynitride film due to the temperature applied to the substrate during the formation of the second silicon oxynitride film.

Figure 23A:
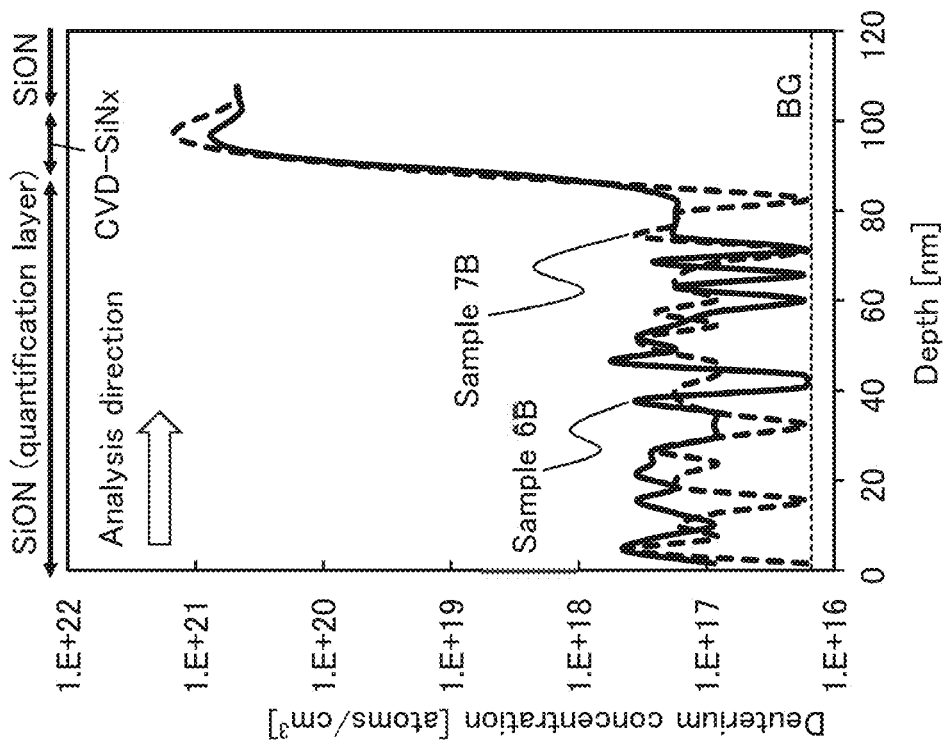
FIG. 23(A), (B) Diagrams showing SIMS analysis results in Example.

FIG. 23(A) shows the SIMS analysis results of Sample 4B and Sample 5B, and shows deuterium concentration profiles in the depth direction of the second silicon oxynitride film over the silicon nitride film (SP-SiNx) formed by a sputtering method. In FIG. 23(A), the solid line represents the deuterium concentration profile of Sample 4B, and the dashed line represents the deuterium concentration profile of Sample 5B.

FIG. 23(A) reveals that the deuterium concentration in the second silicon oxynitride film in Sample 5B is substantially the same as the deuterium concentration in the second silicon oxynitride film in Sample 4B. This indicates that providing the silicon nitride film formed by a sputtering method between the first silicon oxynitride film and the second silicon oxynitride film inhibits diffusion of deuterium contained in the first silicon oxynitride film into the second silicon oxynitride film even when heat treatment is performed. That is, it is found that the silicon nitride film formed by a sputtering method has a low hydrogen-transmitting property.

Figure 23B:
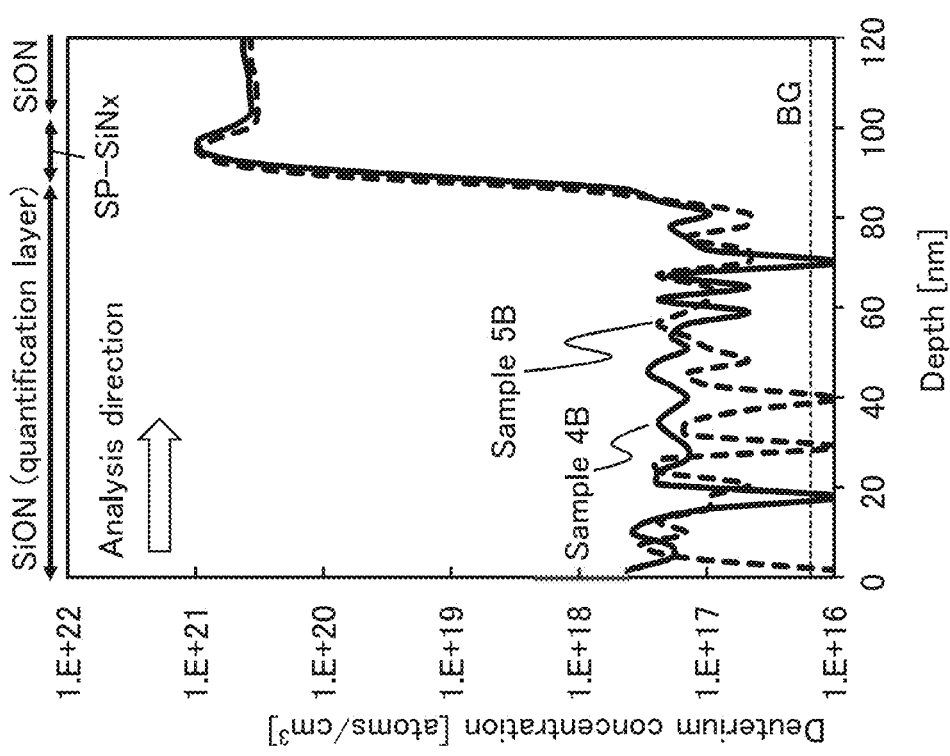

FIG. 23(B) shows the SIMS analysis results of Sample 6B and Sample 7B, and shows deuterium concentration profiles in the depth direction of the second silicon oxynitride film over the silicon nitride film (CVD-SiNx) formed by a CVD method. In FIG. 23(B), the solid line represents the deuterium concentration profile of Sample 6B, and the dashed line represents the deuterium concentration profile of Sample 7B.

FIG. 23(B) reveals that the deuterium concentration in the second silicon oxynitride film in Sample 7B is substantially the same as the deuterium concentration in the second silicon oxynitride film in Sample 6B. This indicates that providing the silicon nitride film formed by a CVD method between the first silicon oxynitride film and the second silicon oxynitride film inhibits diffusion of deuterium contained in the first silicon oxynitride film into the second silicon oxynitride film even when heat treatment is performed. That is, it is found that the silicon nitride film formed by a CVD method has a low hydrogen-transmitting property.

As shown in FIG. 22(A) and FIG. 22(B), the deuterium concentration in the second silicon oxynitride film in Sample 3B is higher than the deuterium concentration in the second silicon oxynitride film in Sample 1B. The SIMS analysis results of Sample 2B to Sample 7B demonstrate that the hydrogen-transmitting property of the silicon nitride film is lower than that of the aluminum oxide film.

At least part of the structure, the method, and the like described in this example can be implemented in appropriate combination with other embodiments and examples described in this specification.

Example 3

In this example, excess oxygen contained in insulating films was evaluated. Specifically, samples (Sample 1C to Sample 4C) in each of which an insulating film was formed were fabricated, and the amount of oxygen molecules released from each sample was calculated using TDS analysis.

First, a method for fabricating Sample 1C to Sample 4C is described.

A method for fabricating Sample 1C is described. A surface of a substrate containing silicon was subjected to heat treatment in a hydrogen chloride (HCl) atmosphere, and a 100-nm-thick silicon oxide film was formed over the substrate. Next, a 100-nm-thick silicon oxynitride film was formed over the silicon oxide film by a CVD method. Through the above process, Sample 1C was obtained.

Next, a method for fabricating Sample 2C is described. A surface of a substrate containing silicon was subjected to heat treatment in a hydrogen chloride (HCl) atmosphere, and a 100-nm-thick first silicon oxide film was formed over the substrate. Next, a 100-nm-thick second silicon oxide film was formed over the first silicon oxide film by a sputtering method. Through the above process, Sample 2C was obtained.

Next, a method for fabricating Sample 3C is described. As in Sample 1C, a silicon oxide film was formed over a substrate containing silicon. Next, a 5-nm-thick first aluminum oxide film was formed over the silicon oxide film by an ALD method. Next, a 60-nm-thick silicon oxynitride film was formed over the first aluminum oxide film by a CVD method. Next, a 40-nm-thick second aluminum oxide film was formed over the silicon oxynitride film by a sputtering method. Next, the second aluminum oxide film was removed by a wet etching method. Through the above process, Sample 3C was obtained.

Next, a method for fabricating Sample 4C is described. A first silicon oxide film was formed over a substrate containing silicon as in Sample 2C, and a first aluminum oxide film was formed over the first silicon oxide film by a method similar to that for Sample 3C. Next, a 60-nm-thick second silicon oxide film was formed over the first aluminum oxide film by a sputtering method. Next, by a method similar to that for Sample 3C, a second aluminum oxide film was formed over the second silicon oxide film and then the second aluminum oxide film was removed. Through the above process, Sample 4C was obtained.

Through the above processes, Sample 1C to Sample 4C were fabricated. Table 2 summarizes the processing conditions of the samples.

TABLE 2

| Sample No. | 1C | 2C | 3C | 4C |
|---|---|---|---|---|
| Second aluminum oxide film | | | formed to a thickness of 40 nm, and then removed | |
| Second silicon oxide film | | 100 nm | | 60 nm |
| Silicon oxynitride film | 100 nm | | 60 nm | |
| First aluminum oxide film | | | 5 nm | |
| (First) silicon oxide film | | | 100 nm | |

Sample 1C to Sample 4C fabricated above were subjected to TDS analysis. In the TDS analysis, the substrate temperature was increased from 50° C. to 600° C. at a rate of 30° C./min, and the desorption amount (also referred to as released amount) of a gas with a mass-to-charge ratio (m/z) of 32 was measured. Note that a gas with a mass-to-charge ratio (m/z) of 32 is mainly an oxygen molecule. FIG. 24(A), FIG. 24(B), FIG. 25(A), and FIG. 25(B) show the TDS analysis results.

Figure 24A:
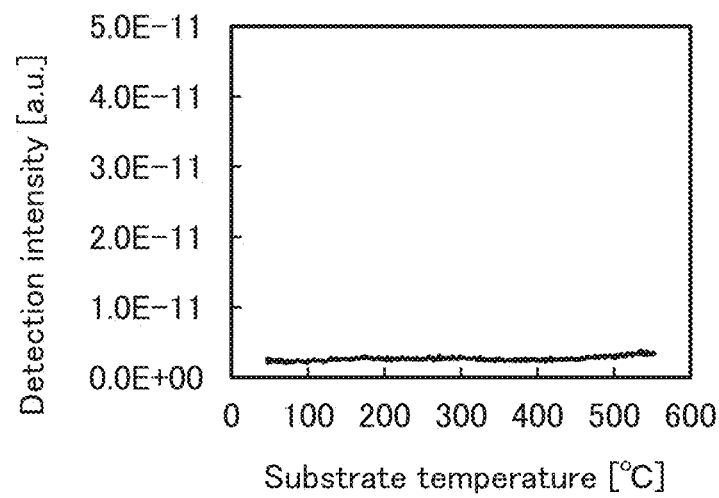
FIG. 24(A), (B) Diagrams showing TDS analysis results in Example.
Figure 24B:
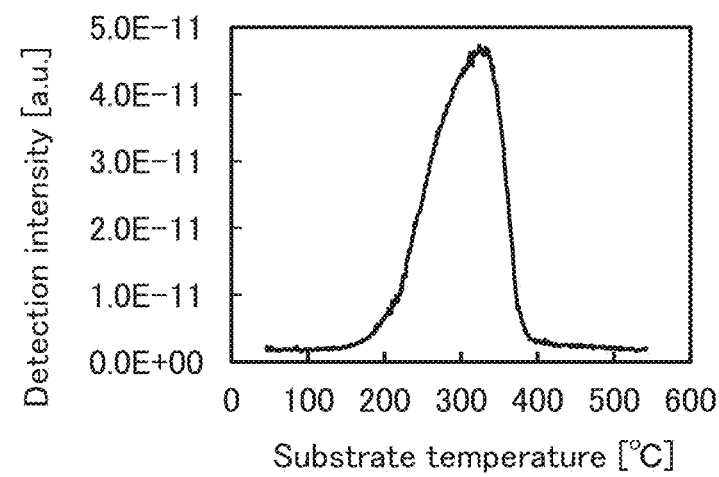

FIG. 24(A) shows a TDS spectrum of Sample 1C at m/z=32, and FIG. 24(B) shows a TDS spectrum of Sample 2C at m/z=32. In FIG. 24(A) and FIG. 24(B), the horizontal axis represents substrate temperature [° C.], and the vertical axis represents detection intensity [a.u.].

FIG. 24(A) indicates that a peak is not observed in Sample 1C in the measurement temperature range. FIG. 24(B) indicates that a peak is observed in Sample 2C in the measurement temperature range. Thus, part of oxygen contained in the second silicon oxide film is released as oxygen molecules by heating.

Note that the total amount of oxygen molecules released by heating corresponds to a value of the integral of a curve showing the TDS analysis results. The amount of released oxygen molecules in the substrate temperature range from 50° C. to 550° C. was $1.1 \times 10^{15}$ molecules/cm$^2$ in Sample 2C.

The above results demonstrate that the silicon oxide film formed by a sputtering method contains excess oxygen.

Figure 25A:
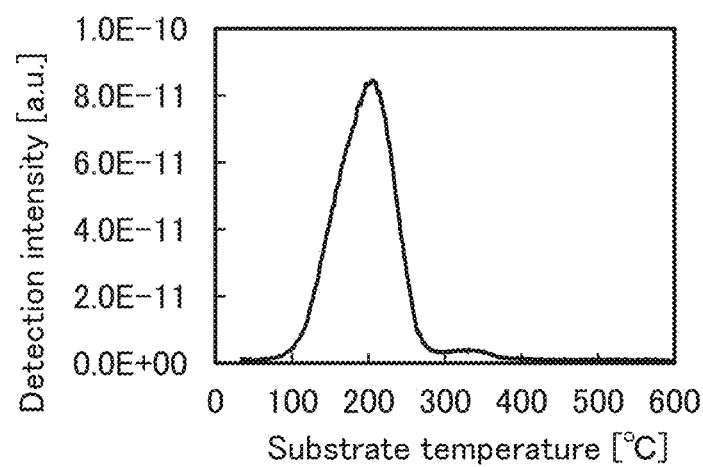
FIG. 25(A), (B) Diagrams showing TDS analysis results in Example.
Figure 25B:
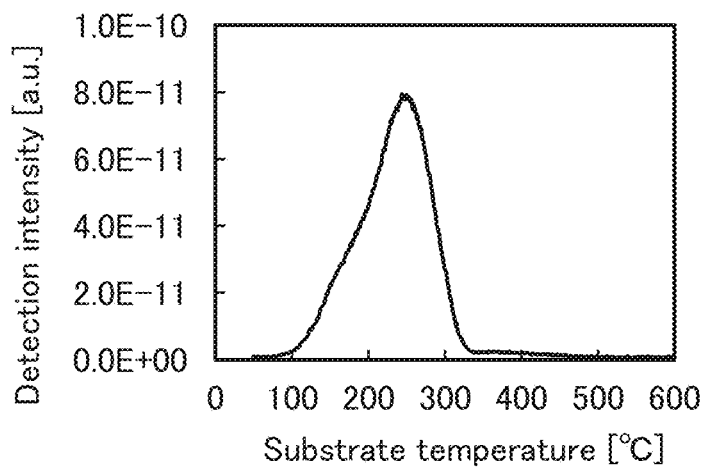

FIG. 25(A) shows a TDS spectrum of Sample 3C at m/z=32, and FIG. 25(B) shows a TDS spectrum of Sample 4C at m/z=32. In FIG. 25(A) and FIG. 25(B), the horizontal axis represents substrate temperature [° C.], and the vertical axis represents detection intensity [a.u.].

FIG. 25(A) and FIG. 25(B) indicate that peaks are observed in Sample 3C and Sample 4C in the measurement temperature range. Thus, part of oxygen contained in the silicon oxynitride film and the second silicon oxide film is released as oxygen molecules by heating.

The amount of released oxygen molecules in the substrate temperature range from 50° C. to 600° C. calculated by the above-described method was $2.3 \times 10^{15}$ molecules/cm$^2$ in Sample 3C and $2.7 \times 10^{15}$ molecules/cm$^2$ in Sample 4C.

The above results demonstrate that the formation of the aluminum oxide film over the silicon oxynitride film or the silicon oxide film by a sputtering method enables an excess-oxygen region to be formed in the silicon oxynitride film or the silicon oxide film.

At least part of the structure, the method, and the like described in this example can be implemented in appropriate combination with other embodiments and examples described in this specification.

Example 4

In this example, the transistors described in the above embodiment were fabricated, the data retention time and the operation frequency were estimated, and the reliability was evaluated. The data retention time and the operation frequency were estimated on the assumption of a DOSRAM in which a capacitor was provided in each transistor.

In this example, Sample D in which transistors having a structure similar to that of the transistor 200 illustrated in FIG. 2(A) to FIG. 2(C) were arranged at a density of 2.0/μm$^2$ was fabricated, and the electrical characteristics of Sample D were measured. From the electrical characteristics, the data retention time and the operation frequency were estimated and the reliability was evaluated.

First, the structure of Sample D is described. As illustrated in FIG. 2(A) to FIG. 2(C), Sample D includes the insulator 214 provided over the substrate (not illustrated), the insulator 216 provided over the insulator 214, the conductor 205 provided to be embedded in the insulator 216, the insulator 222 provided over the insulator 216 and the conductor 205, the insulator 224 provided over the insulator 222, the oxide 230a provided over the insulator 224, the oxide 230b provided over the oxide 230a, the conductor 242a and the conductor 242b provided over the oxide 230b to be apart from each other, the insulator 254 provided over the conductor 242a, the conductor 242b, and the insulator 224, the insulator 280 provided over the insulator 254, the oxide 230c provided over the oxide 230b, the insulator 250 provided over the oxide 230c, the conductor 260a and the conductor 260b provided over the insulator 250, and the insulator 274 provided over the insulator 280 and the conductor 260.

As the insulator 214, 40-nm-thick aluminum oxide was used. As the insulator 216, silicon oxynitride was used. A conductive film in which tantalum nitride, titanium nitride, tungsten, titanium nitride, and tungsten were stacked in this order was used as the conductor 205.

As the insulator 222, 20-nm-thick hafnium oxide formed by an ALD method was used. As the insulator 224, 30-nm-thick silicon oxynitride was used.

As the oxide 230a, 5-nm-thick In—Ga—Zn oxide formed by a DC sputtering method was used. In the formation of the oxide 230a, an oxide target with In:Ga:Zn=1:3:4 [atomic ratio] was used; an oxygen gas at 45 sccm was used as a deposition gas; the deposition pressure was 0.7 Pa; the deposition power was 500 W; the substrate temperature was 200° C.; and the distance between the target and the substrate was 60 mm.

As the oxide 230b, 15-nm-thick In—Ga—Zn oxide formed by a DC sputtering method was used. In the formation of the oxide 230b, an oxide target with In:Ga:Zn=4:2:4.1 [atomic ratio] was used; an oxygen gas at 45 sccm was used as a deposition gas; the deposition pressure was 0.7 Pa; the deposition power was 500 W; the substrate temperature was 200° C.; and the distance between the target and the substrate was 60 mm.

As each of the conductor 242a and the conductor 242b, 25-nm-thick tantalum nitride was used. As the insulator 254, a stacked film of 5-nm-thick aluminum oxide formed by a sputtering method and 3-nm-thick aluminum oxide formed thereover by an ALD method was used.

The insulator 280 was a stacked film of a first layer and a second layer over the first layer. As the first layer of the insulator 280, 60-nm-thick silicon oxide formed by an RF sputtering method was used. In the formation of the first layer of the insulator 280, a SiO$_2$ target was used; an oxygen gas at 50 sccm was used as a deposition gas; the deposition pressure was 0.7 Pa; the deposition power was 1500 W; the substrate temperature was 170° C.; and the distance between the target and the substrate was 60 mm. As the second layer of the insulator 280, silicon oxynitride formed by a PECVD method was used.

The oxide 230c was a stacked film of a first layer and a second layer over the first layer. As the first layer of the oxide 230c, 3-nm-thick In—Ga—Zn oxide formed by a DC sputtering method was used. In the formation of the first layer of the oxide 230c, an oxide target with In:Ga:Zn=4:2:4.1 [atomic ratio] was used; an oxygen gas at 45 sccm was used as a deposition gas; the deposition pressure was 0.7 Pa; the deposition power was 500 W; the substrate temperature was 200° C.; and the distance between the target and the substrate was 60 mm.

As the second layer of the oxide 230c, 3-nm-thick In—Ga—Zn oxide formed by a DC sputtering method was used. In the formation of the second layer of the oxide 230c, an oxide target with In:Ga:Zn=1:3:4 [atomic ratio] was used; an oxygen gas at 45 sccm was used as a deposition gas; the deposition pressure was 0.7 Pa; the deposition power was 500 W; the substrate temperature was 200° C.; and the distance between the target and the substrate was 60 mm.

As the insulator 250, 6-nm-thick silicon oxynitride was used. As the conductor 260a, 5-nm-thick titanium nitride was used. As the conductor 260b, tungsten was used.

As the insulator 274, 40-nm-thick aluminum oxide formed by an RF sputtering method was used. In the formation of the insulator 274, an $Al_2O_3$ target was used; an argon gas at 25 sccm and an oxygen gas at 25 sccm were used as deposition gases; the deposition pressure was 0.4 Pa; the deposition power was 2500 W; the substrate temperature was 250° C.; and the distance between the target and the substrate was 60 mm.

Sample D having the above-described structure was designed to have a channel length of 60 nm and a channel width of 60 nm. Like the transistor 200, Sample D includes the conductor 240, the insulator 241, the insulator 281, and the like in addition to the above structure. After the fabrication, Sample D was subjected to heat treatment at 400° C. for 4 hours in a nitrogen atmosphere.

Next, the data retention time and the operation frequency were estimated on the assumption of a DOSRAM in which a capacitor (a storage capacitance of 3.5 fF) was provided in each transistor of Sample D. As a memory cell of the DOSRAM, the circuit illustrated in FIG. 16(A) was assumed. Here, Sample D corresponds to the transistor M1 illustrated in FIG. 16(A).

A method for estimating the data retention time of the DOSRAM is described. Data retention of the DOSRAM is performed when charge supplied to the capacitor at the time of writing is retained. However, the charge supplied to the capacitor at the time of data writing fluctuates with fluctuation of a voltage applied to the capacitor, and when the fluctuation amount exceeds the allowable value, data cannot be read. The allowable amount of fluctuation of a voltage applied to the capacitor of the DOSRAM after data writing is hereinafter referred to as an allowable voltage fluctuation. That is, a data retention time is the time taken for the fluctuation amount of a voltage applied to the capacitor included in the DOSRAM to reach the allowable voltage fluctuation.

As described above, the charge released from the capacitor during the data retention period can be approximated when being released as the leakage current of the transistor of the DOSRAM. In that case, the amount of charge released from the capacitor is equal to the amount of charge that leaks from the transistor in the off state. Thus, the product of the cutoff current Icut of the transistor and the data retention time $t_R$ is equal to the product of the storage capacitance Cs and an allowable voltage fluctuation $\Delta V$ of the capacitor. Accordingly, the data retention time $t_R$ can be expressed by Formula (1).

[Formula 1]

$$t_R = \frac{C_S \times \Delta V}{I_{cut}} \quad (1)$$

Here, the cutoff current Icut of the transistor refers to a drain current $I_D$ at a top gate potential $V_G$ of the transistor of 0 V.

Assuming that $I_D$ monotonically decreases in accordance with the subthreshold swing value (Svalue) until the off-state current of the transistor reaches $V_G$=0 V, the cutoff current Icut of the transistor can be expressed by Formula (2) below using the shift voltage Vsh and the subthreshold swing value (Svalue).

[Formula 2]

$$I_{cut} = 1 \times 10^{\left(-12 - \frac{Vsh}{Svalue}\right)} \quad (2)$$

Here, the shift voltage Vsh is defined as, in the $I_D$-$V_G$ curve of the transistor, $V_G$ at which the tangent at a point where the slope of the curve is the steepest intersects the straight line of $I_D$=1 pA. The subthreshold swing value (Svalue) refers to the amount of change in the top gate potential in the subthreshold region by which drain current is changed by one digit at a constant drain voltage.

In this example, in order to estimate the data retention time, the $I_D$-$V_G$ measurement was performed on three elements in Sample D. The $I_D$-$V_G$ measurement was performed under conditions where a power supply voltage was 3.3 V, a drain potential VD of the transistor was +1.2 V, a source potential Vs was 0 V, and the top gate potential $V_G$ was swept from −1.0 V to +3.3 V. A bottom gate potential $V_{BG}$ was set to −10.6 V. Measurement temperatures were three levels of −40° C., 27° C., and 85° C. Specifically, the $I_D$-$V_G$ measurement of the transistor was performed in a state in which a 5-inch-square substrate where the transistor subjected to the measurement was formed was fixed on a thermochuck set at each of the above temperatures. Note that a bottom gate potential $V_{BG}$ of −10.6 V was estimated so that the retention time of the transistors of Sample D became longer than or equal to one hour in the measurement at 85° C. A semiconductor parameter analyzer manufactured by Keysight Technologies was used for the $I_D$-$V_G$ measurement.

A shift voltage Vsh and a subthreshold swing value (Svalue) of the transistor were calculated from the obtained $I_D$-$V_G$ curve. Furthermore, Icut was estimated from Vsh and Svalue, which were obtained from the $I_D$-$V_G$ curve, by extrapolation using Formula (2).

In this example, the storage capacitance Cs of the capacitor was 3.5 fF, and the allowable voltage fluctuation $\Delta V$ was 0.2 V. Thus, when the values of Icut, Cs, and $\Delta V$ are substituted into Formula (1), the retention time $t_R$ can be estimated.

Next, a method for estimating the DOSRAM operation frequency is described. The DOSRAM operation frequency is the inverse of a data write cycle time of the DOSRAM. The data write cycle time of the DOSRAM is a parameter set by a charging time of the capacitor included in the DOSRAM, for example. In this example, the time corresponding to 40% of the data write cycle time of the DOSRAM (the inverse of the DOSRAM operation frequency) is set as the charging time of the capacitor included in the DOSRAM.

As described above, the DOSRAM operation frequency depends on the charging time of the capacitor included in the DOSRAM. Therefore, for the estimation of the DOSRAM operation frequency, first, it is necessary to know the charging time of the capacitor included in the DOSRAM in advance. In this example, a state where a voltage of 0.52 V or higher (hereinafter, this voltage is sometimes referred to as a write judgement voltage $V_{CS}$) is applied to the capacitor (a storage capacitance of 3.5 fF) included in the DOSRAM is defined as a "charged state" of the capacitor. Accordingly, in this example, the time from when DOSRAM data write operation starts until when the voltage applied to the capacitor reaches a write judgement voltage $V_{CS}$=0.52 V corresponds to the charging time of the capacitor included in the DOSRAM.

Figure 26A:
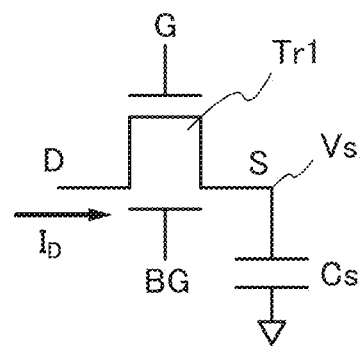
FIG. 26(A) to (C) Diagrams showing a method for calculating an operation frequency in Example.

The charging time of the capacitor included in the DOSRAM depends on the amount of $I_D$ of the transistor included in the DOSRAM at the time of DOSRAM data writing. Here, a charging model of the capacitor included in the DOSRAM is described with reference to FIG. 26(A). As in FIG. 16(A), the case where data is written to a capacitor Cs through a transistor Trl is assumed in FIG. 26(A). D represents a drain, G represents a gate, S represents a source, and BG represents a back gate. The potential of the source of the transistor Trl (a voltage applied to the capacitor Cs) is represented by Vs. When the transistor Trl is turned on, the current $I_D$ flows and the capacitor Cs is charged.

Figure 26B:
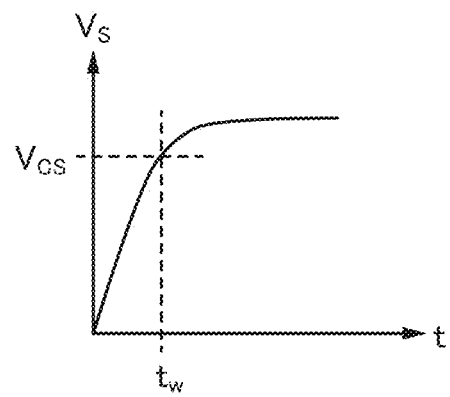

Charging is regarded as being completed when Vs reaches the write judgement voltage $V_{CS}$ after DOSRAM charging is started. The time from the start of charging to the completion of charging is referred to as a charging time tw (see FIG. 26(B)). When charge stored in a capacitor that is included in the DOSRAM and has a storage capacitance Cs [F] is Q [C], the charging time is tw [s], a potential applied to the capacitor by charging is $V_{cs}$ (=Vs) [V], and the drain current of the transistor included in the DOSRAM is $I_D$ [A], the relation of Formula (3) shown below is established between the parameters.

[Formula 3]

$$Q = \int_0^{tw} I_D dt = C_S \times V_{CS} \quad (3)$$

Figure 26C:
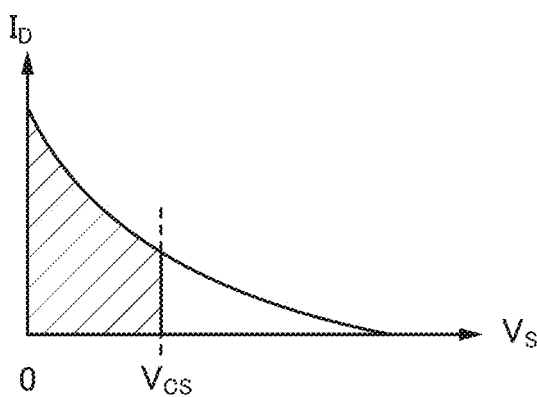

By modification of Formula (3), the charging time tw of the capacitor included in the DOSRAM can be represented by Formula (4) shown below (see FIG. 26(C)).

[Formula 4]

$$t_W = \int_0^{V_{CS}} \frac{C_S}{I_D} dV_S \quad (4)$$

The relation between an operating frequency f of the DOSRAM and the charging time tw can be represented by Formula (5).

[Formula 5]

$$f = \frac{A}{t_W} \quad (5)$$

In Formula (5), A is a coefficient. In the DOSRAM, the time required for writing within the time of one operation is assumed to be 40%; hence, in this example, the coefficient A is set to 0.4.

In this example, in order to estimate the operation frequency, the $I_D$-$V_S$ measurement was performed on three elements in Sample D. The $I_D$-$V_S$ measurement was performed under conditions where the power supply voltage was 3.3 V, the top gate potential $V_G$ of the transistor was +2.97 V, the drain potential Vd was +1.08 V, and the source potential Vs was swept from 0 V to +1.2 V. The bottom gate potential $V_{BG}$ was set to −10.6 V. The other conditions such as the measurement temperature were the same as those of the $I_D$-$V_G$ measurement. Note that a semiconductor parameter analyzer manufactured by Keysight Technologies was used for the $I_D$-$V_S$ measurement.

The charging time tw can be calculated, with the use of Formula (4), from the integral of the obtained $I_D$-$V_S$ curve up to a write judgement voltage $V_{CS}$ of +0.52 V and a storage capacitance $C_S$ of the capacitor of 3.5 fF.

When the coefficient A and the charging time tw are substituted into Formula (5), the operation frequency f can be estimated.

Figure 27:
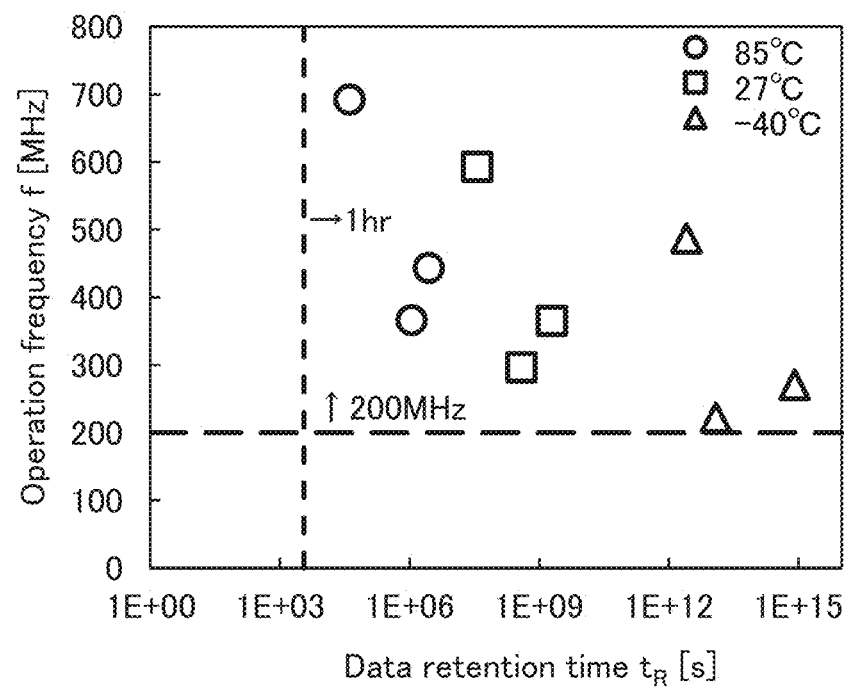
FIG. 27 A diagram showing calculation results of data retention time and an operation frequency in Example.

FIG. 27 shows the estimation results of the data retention time $t_R$ and the operation frequency f of the three elements in Sample D measured as described above at three levels of −40° C., 27° C., and 85° C. In FIG. 27, the horizontal axis represents the data retention time $t_R$ [s], and the vertical axis represents the operation frequency f [MHz].

FIG. 27 reveals that the data retention time of Sample D even in the measurement at 85° C. at which the data retention time becomes the shortest is longer than or equal to one hour. In addition, the operation frequency of Sample D even in the measurement at −40° C. at which the operation frequency becomes the lowest is higher than or equal to 200 MHz. As described here, the DOSRAM including the transistors of Sample D has excellent data retention characteristics and operation frequency characteristics.

Next, the reliability of Sample D was evaluated. The reliability was evaluated by a +GBT (Gate Bias Temperature) stress test. In the +GBT stress test, the conductor 242a functioning as the source electrode of the transistor, the conductor 242b functioning as the drain electrode, and the conductor 205 functioning as the second gate (bottom gate) electrode are set at the same potential, and a potential higher than the potentials of the conductor 242a, the conductor 242b, and the conductor 205 is applied to the conductor 260 functioning as the first gate (top gate) electrode for a certain time while the substrate is heated.

In the +GBT stress test of this example, stress was applied to Sample D under the conditions where set temperature was 150° C.; the drain potential VD, the source potential Vs, and the bottom gate potential $V_{BG}$ were 0 V; and the top gate potential $V_G$ was +2.75 V.

The $I_D$-$V_G$ measurement was performed at certain intervals in the +GBT stress test. The $I_D$-$V_G$ measurement was performed under the conditions where the drain potential $V_D$ of the transistor was +1.2 V; the source potential Vs was 0 V; the bottom gate potential $V_{BG}$ was 0 V; and the gate potential $V_G$ was swept from −3.3 V to +3.3 V. Note that a semiconductor parameter analyzer manufactured by Keysight Technologies was used for the $I_D$-$V_G$ measurement. In the +GBT stress test, ΔVsh representing the amount of change in the shift voltage Vsh from the start of the measurement was used as an index of the amount of change in the electrical characteristics of the transistor.

Figure 28:
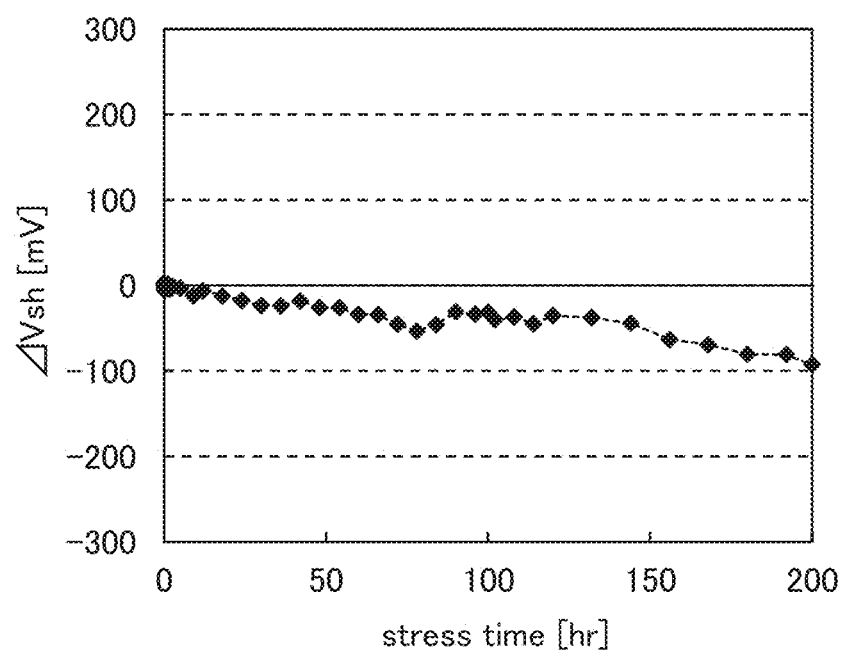
FIG. 28 A diagram showing stress time dependence of ΔVsh in Example.

FIG. 28 shows the +GBT stress test results of Sample D. In FIG. 28, the horizontal axis represents stress time [hr], and the vertical axis represents ΔVsh [mV].

FIG. 28 indicates that the absolute value of the amount of change in the shift voltage ΔVsh is less than or equal to 100 mV even when 200 hours have elapsed while the stress is being applied to Sample D. Note that the temperature acceleration of ΔVsh with respect to the stress time is confirmed in the +GBT stress test. Specifically, the stress time taken for ΔVsh to become a predetermined value at a set temperature of 150° C. is approximately ⅓ to ⅒ of the stress time taken for ΔVsh to become the predetermined value at a set temperature of 125° C. In other words, increasing the set temperature from 125° C. to 150° C. accelerates ΔVsh with respect to the stress time approximately 10 times to 13 times. Thus, in consideration of the temperature acceleration of ΔVsh with respect to the stress time, the absolute value of ΔVsh of Sample D is presumed to be 100 mV or less for 2000 hours to 2500 hours in the state where the set temperature is 125° C.

Next, Sample E having the same structure as Sample D was fabricated and then was subjected to heat treatment at 400° C. for 8 hours in a nitrogen atmosphere, and the reliability of Sample E was evaluated. The reliability was estimated by the +GBT stress test as in Sample D.

The +GBT stress test was performed on Sample E under a plurality of conditions. In the +GBT test under the condition where the top gate potential $V_G$ was +2.75 V, three conditions of 150° C., 175° C., and 197° C. were employed for the set temperatures. In the +GBT test under the condition where the top gate potential $V_G$ was +3.63 V, two conditions of 150° C. and 175° C. were employed for the set temperatures. In all of the conditions, the drain potential VD, the source potential Vs, and the bottom gate potential $V_{BG}$ were set to 0 V as in Sample D. In addition, in all of the conditions, the +GBT stress test was performed on two elements in Sample E.

The $I_D$-$V_G$ measurement was performed at certain intervals in the +GBT stress test by a method similar to that for the measurement of Sample D.

Figure 29:
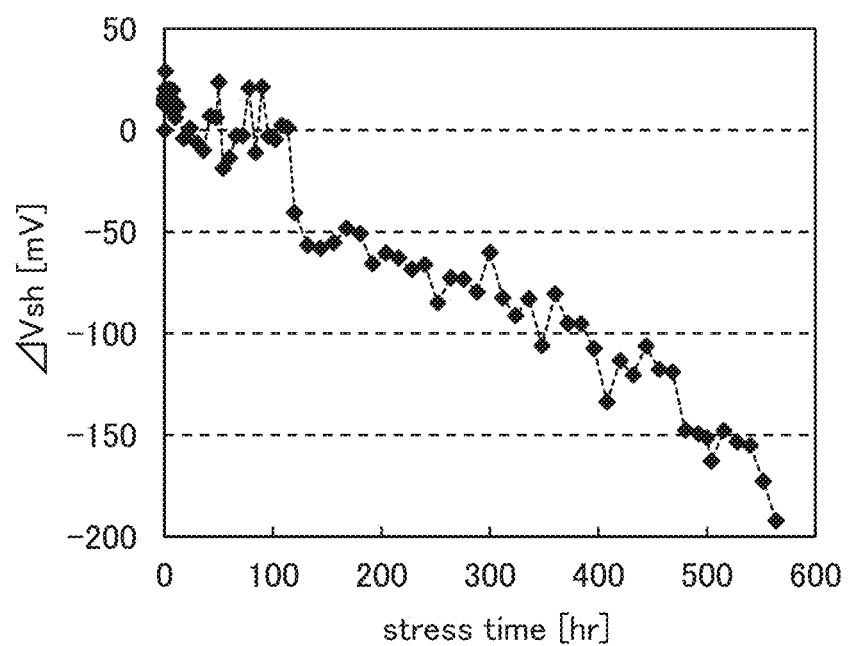
FIG. 29 A diagram showing stress time dependence of ΔVsh in Example.

FIG. 29 shows the results of the +GBT stress test performed on Sample E under the conditions where the top gate potential $V_G$ was +2.75 V and the set temperature was 150° C. In FIG. 29, the horizontal axis represents stress time [hr], and the vertical axis represents ΔVsh [mV].

FIG. 29 indicates that the absolute value of the amount of change in the shift voltage ΔVsh is less than or equal to 100 mV even when 336 hours have elapsed while the stress is being applied to Sample E.

The results of the +GBT stress test performed on Sample E under the other stress conditions can also be shown by the stress time—ΔVsh plot as shown in FIG. 29. The time taken for the absolute value of ΔVsh to reach 100 mV can be calculated from the stress time—ΔVsh plot.

Figure 30:
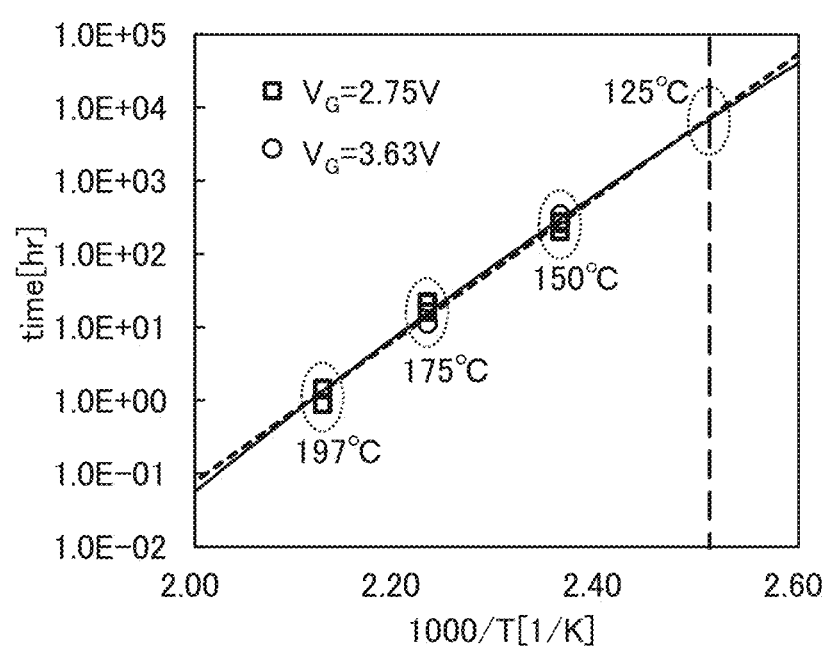
FIG. 30 Plots of calculation results of ΔVsh in Example.

FIG. 30 shows the results of plotting the time taken for the absolute value of ΔVsh to reach 100 mV under various kinds of stress conditions, which is calculated from the results of the +GBT stress test performed on Sample E. In FIG. 30, the horizontal axis represents 1000/T [1/K], and the vertical axis represents time [hr] taken for the absolute value of ΔVsh to reach 100 mV. Here, T represents the set temperature in the +GBT stress test performed on Sample E.

The plot of the condition where the top gate potential $V_G$ is +2.75 V and the plot of the condition where the top gate potential $V_G$ is +3.63 V can each be an approximate curve. In FIG. 30, the approximate curve of the condition where the top gate potential $V_G$ is +2.75 V is indicated by a dotted line, and the approximate curve of the condition where the top gate potential $V_G$ is +3.63 V is indicated by a solid line. As shown in FIG. 30, the approximate curves are substantially linear and the slopes of the approximate curves are almost constant in both conditions.

Thus, the time taken for the absolute value of ΔVsh to reach 100 mV in the +GBT stress test performed on Sample E under the condition where the set temperature is 125° C. can be calculated from both of the approximate curves. The time is 7377 hours under the condition where the top gate potential $V_G$ is +2.75 V, and 8331 hours under the condition where the top gate potential $V_G$ is +3.63 V.

The above results demonstrate that the DOSRAM including the transistor of one embodiment of the present invention has excellent data retention characteristics and operation frequency characteristics. Furthermore, it is indicated that the transistor of one embodiment of the present invention has high reliability.

At least part of the structure, the method, and the like described in this example can be implemented in appropriate combination with other embodiments and examples described in this specification.

Example 5

In this example, the transistors described in the above embodiment were fabricated, observation with a scanning transmission electron microscope (STEM) was performed, and measurement results of electrical characteristics are described.

In this example, Sample 1F to Sample 4F in each of which transistors having a structure similar to that of the transistor 200 illustrated in FIG. 2(A) to FIG. 2(C) were arranged at a density of 2.0/µm$^2$ were fabricated.

First, the structure of Sample 1F to Sample 4F is described. As illustrated in FIG. 2(A) to FIG. 2(C), Sample 1F to Sample 4F each include the insulator 214 provided over the substrate (not illustrated); the insulator 216 provided over the insulator 214; the conductor 205 provided to be embedded in the insulator 216; the insulator 222 provided over the insulator 216 and the conductor 205; the insulator 224 provided over the insulator 222; the oxide 230a provided over the insulator 224; the oxide 230b provided over the oxide 230a; the conductor 242a and the conductor 242b provided over the oxide 230b to be apart from each other; the insulator 254 provided over the conductor 242a, the conductor 242b, and the insulator 224; the insulator 280 provided over the insulator 254; the oxide 230c provided over the oxide 230b; the insulator 250 provided over the oxide 230c; the conductor 260a and the conductor 260b provided over the insulator 250; and the insulator 274 provided over the insulator 280 and the conductor 260.

The insulator 214 had a stacked-layer structure of silicon nitride and aluminum oxide formed thereover. The silicon nitride was formed to a thickness of 20 nm by an RF sputtering method. The aluminum oxide was formed to a thickness of 40 nm by an RF sputtering method.

As the insulator 216, silicon oxynitride was used. A conductive film in which tantalum nitride, titanium nitride, tungsten, titanium nitride, and tungsten were stacked in this order was used as the conductor 205.

As the insulator 222, 20-nm-thick hafnium oxide formed by an ALD method was used. As the insulator 224, 28-nm-thick silicon oxynitride was used.

As the oxide 230a, 5-nm-thick In—Ga—Zn oxide formed by a DC sputtering method was used. In the formation of the oxide 230a, an oxide target with In:Ga:Zn=1:3:4 [atomic ratio] was used; an oxygen gas at 45 sccm was used as a deposition gas; the deposition pressure was 0.7 Pa; the deposition power was 500 W; the substrate temperature was 200° C.; and the distance between the target and the substrate was 60 mm.

As the oxide 230b, 15-nm-thick In—Ga—Zn oxide formed by a DC sputtering method was used. In the formation of the oxide 230b, an oxide target with In:Ga:Zn=4:2:4.1 [atomic ratio] was used; an oxygen gas at 45 sccm was used as a deposition gas; the deposition pressure was 0.7 Pa; the deposition power was 500 W; the substrate temperature was 200° C.; and the distance between the target and the substrate was 60 mm.

As each of the conductor 242a and the conductor 242b, 25-nm-thick tantalum nitride was used. As the insulator 254, a stacked film of 5-nm-thick aluminum oxide formed by a sputtering method and 3-nm-thick aluminum oxide formed thereover by an ALD method was used.

The insulator 280 was a stacked film of a first layer and a second layer over the first layer. As the first layer of the insulator 280, 60-nm-thick silicon oxide formed by an RF sputtering method was used. In the formation of the first layer of the insulator 280, a SiO₂ target was used; an oxygen gas at 50 sccm was used as a deposition gas; the deposition pressure was 0.7 Pa; the deposition power was 1500 W; the substrate temperature was 170° C.; and the distance between the target and the substrate was 60 mm. As the second layer of the insulator 280, silicon oxynitride formed by a PECVD method was used.

Figure 7A:
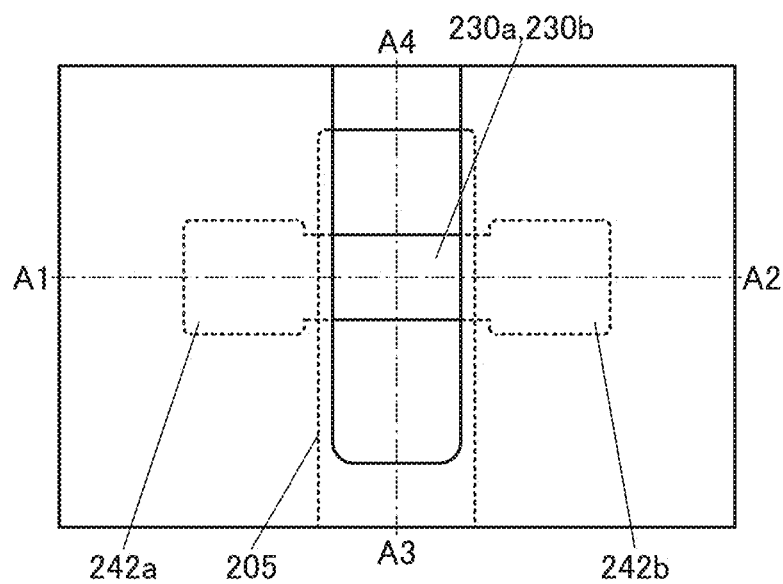
FIG. 7(A) A top view illustrating a method for manufacturing a semiconductor device of one embodiment of the present invention. (B), (C) Cross-sectional views illustrating a method for manufacturing a semiconductor device of one embodiment of the present invention.
Figure 7C:
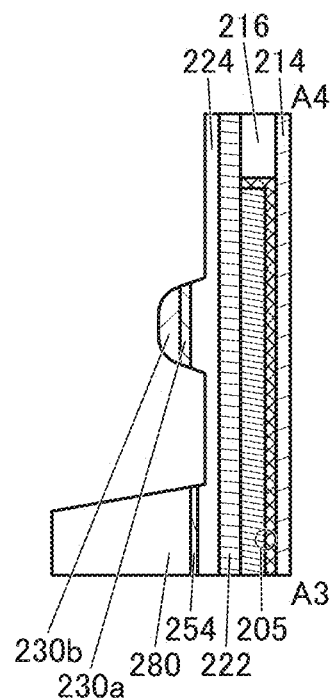
Figure 7B:
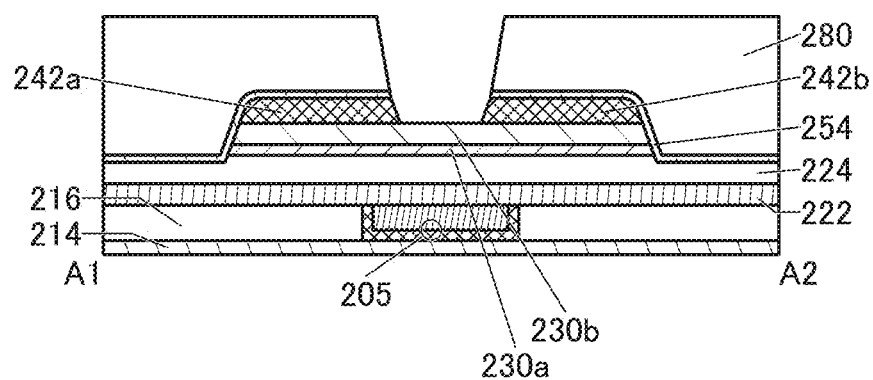
Figure 8A:
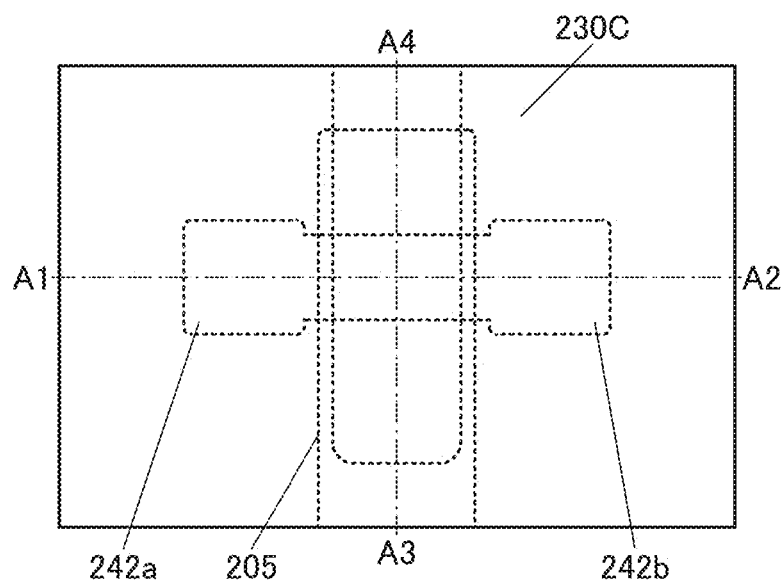
FIG. 8(A) A top view illustrating a method for manufacturing a semiconductor device of one embodiment of the present invention. (B), (C) Cross-sectional views illustrating a method for manufacturing a semiconductor device of one embodiment of the present invention.
Figure 8C:
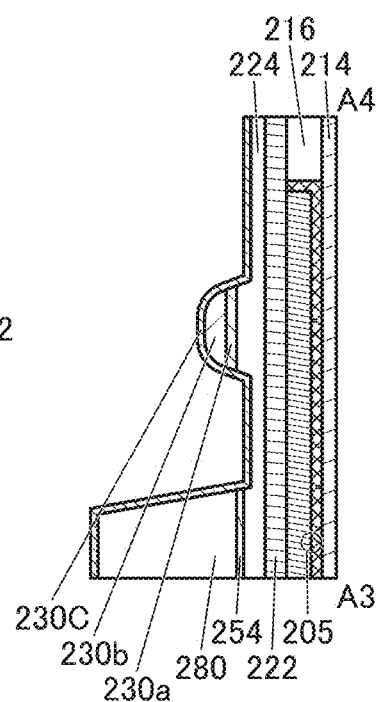
Figure 8B:
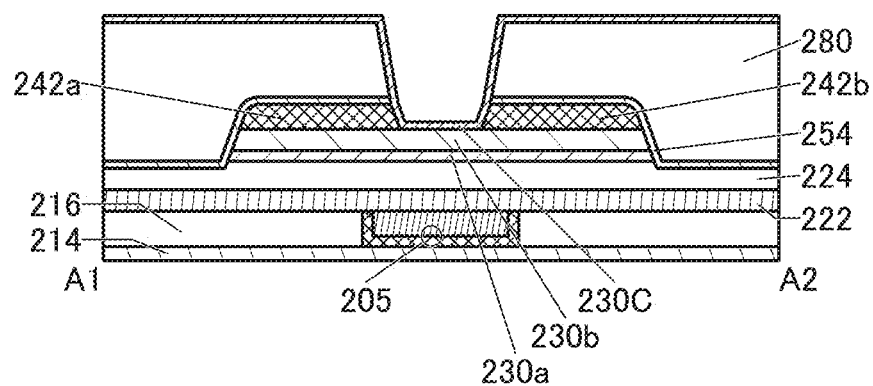
Figure 9A:
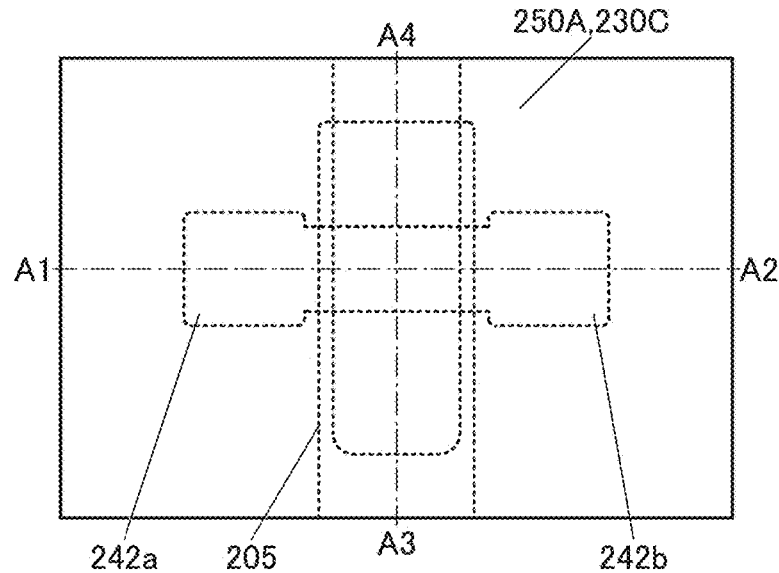
FIG. 9(A) A top view illustrating a method for manufacturing a semiconductor device of one embodiment of the present invention. (B), (C) Cross-sectional views illustrating a method for manufacturing a semiconductor device of one embodiment of the present invention.
Figure 9C:
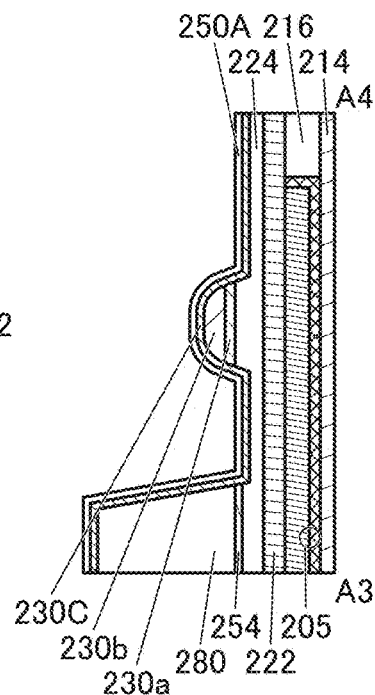
Figure 9B:
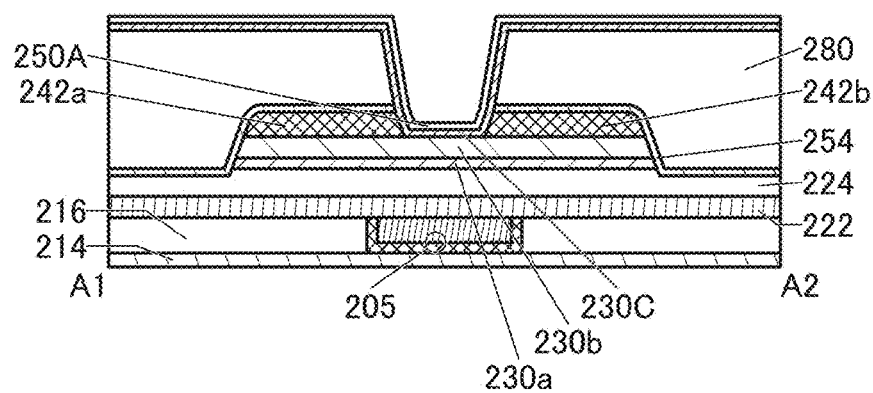
Figure 10A:
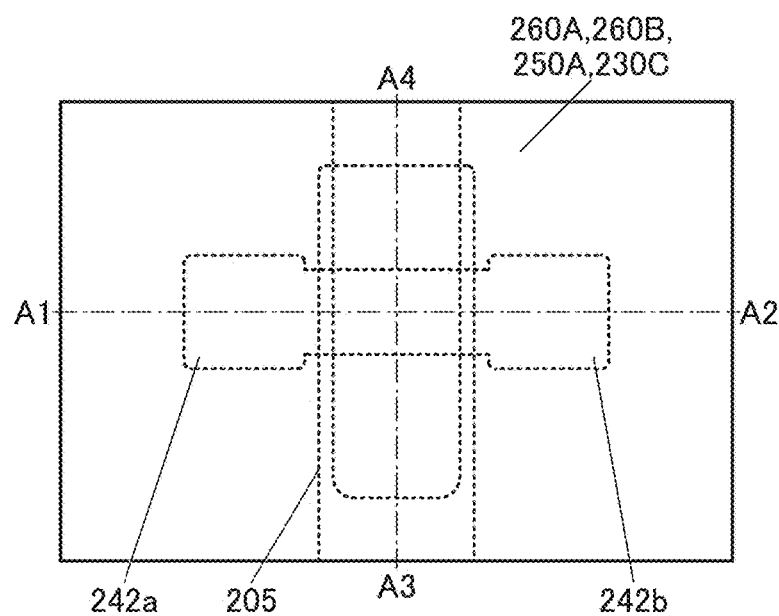
FIG. 10(A) A top view illustrating a method for manufacturing a semiconductor device of one embodiment of the present invention. (B), (C) Cross-sectional views illustrating a method for manufacturing a semiconductor device of one embodiment of the present invention.
Figure 10C:
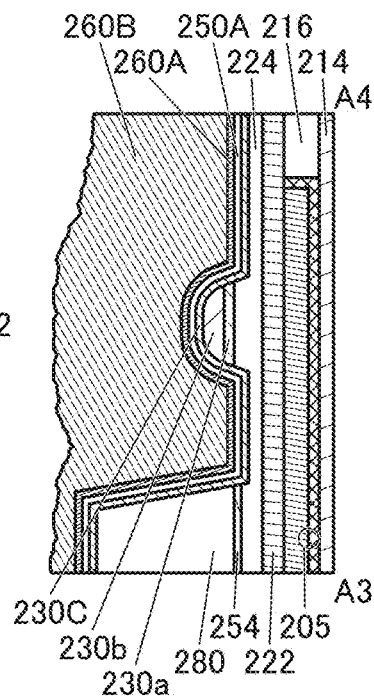
Figure 10B:
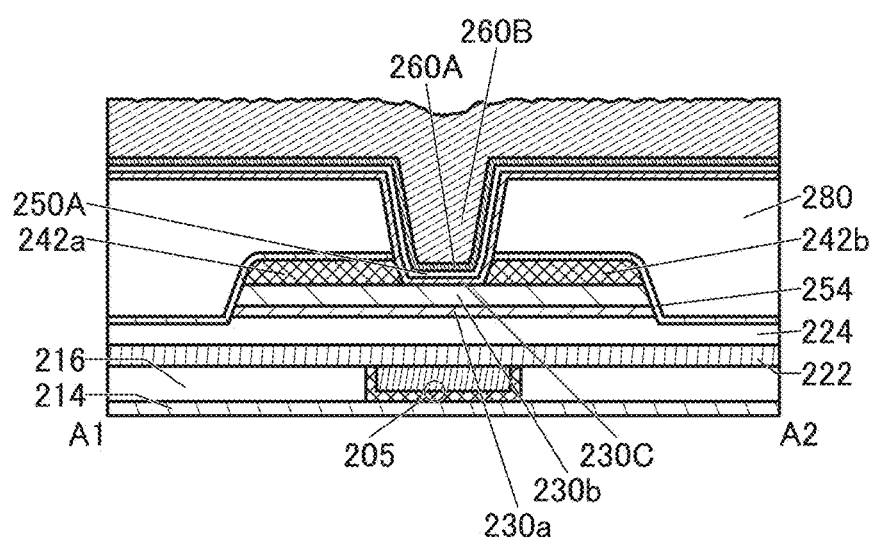

Also in the fabrication process of Sample 1F to Sample 4F, the openings reaching the oxide 230b were formed in the insulator 280 and the insulator 254, and channel etching was performed to form the conductor 242a and the conductor 242b as illustrated in FIG. 7(A) to FIG. 7(C). After the channel etching, Sample 2F to Sample 4F were subjected to heat treatment for one hour in a nitrogen atmosphere and successively heat treatment for one hour in an oxygen atmosphere. The heat treatment temperature was 300° C. for Sample 2F, 350° C. for Sample 3F, and 400° C. for Sample 4F.

The oxide 230c was a stacked film of a first layer and a second layer over the first layer. As the first layer of the oxide 230c, 3-nm-thick In—Ga—Zn oxide formed by a DC sputtering method was used. In the formation of the first layer of the oxide 230c, an oxide target with In:Ga:Zn=4:2:4.1 [atomic ratio] was used; an oxygen gas at 45 sccm was used as a deposition gas; the deposition pressure was 0.7 Pa; the deposition power was 500 W; the substrate temperature was 200° C.; and the distance between the target and the substrate was 60 mm.

As the second layer of the oxide 230c, 3-nm-thick In—Ga—Zn oxide formed by a DC sputtering method was used. In the formation of the second layer of the oxide 230c, an oxide target with In:Ga:Zn=1:3:4 [atomic ratio] was used; an oxygen gas at 45 sccm was used as a deposition gas; the deposition pressure was 0.7 Pa; the deposition power was 500 W; the substrate temperature was 200° C.; and the distance between the target and the substrate was 60 mm.

As the insulator 250, 6-nm-thick silicon oxynitride was used. As the conductor 260a, 5-nm-thick titanium nitride was used. As the conductor 260b, tungsten was used.

The insulator 274 was a stacked film of a first layer and a second layer over the first layer. As the first layer of the insulator 274, 40-nm-thick aluminum oxide formed by an RF sputtering method was used. In the formation of the first layer of the insulator 274, an Al₂O₃ target was used; an argon gas at 25 sccm and an oxygen gas at 25 sccm were used as deposition gases; the deposition pressure was 0.4 Pa; the deposition power was 2500 W; the substrate temperature was 250° C.; and the distance between the target and the substrate was 60 mm. As the second layer of the insulator 274, 20-nm-thick silicon nitride formed by an RF sputtering method was used.

Sample 1F to Sample 4F having the above-described structures were designed to have a channel length of 60 nm and a channel width of 60 nm. Like the transistor 200, Sample 1F to Sample 4F include the conductor 240, the insulator 241, the insulator 281, and the like in addition to the above structures. After the fabrication, Sample 1F to Sample 4F were subjected to heat treatment at 400° C. for 4 hours in a nitrogen atmosphere.

Cross-sectional STEM images of Sample 1F to Sample 4F fabricated above were taken by HD-2700 manufactured by Hitachi High Technologies Corporation at an accelerating voltage of 200 kV, and an analysis by energy dispersive X-ray spectroscopy (EDX) was performed. FIG. 31(A), FIG. 31(B), FIG. 32(A), FIG. 32(B), FIG. 33(A) to FIG. 33(D), and FIG. 34(A) to FIG. 34(D) show the taken cross-sectional STEM images and EDX analysis mapping images.

Figure 31A:
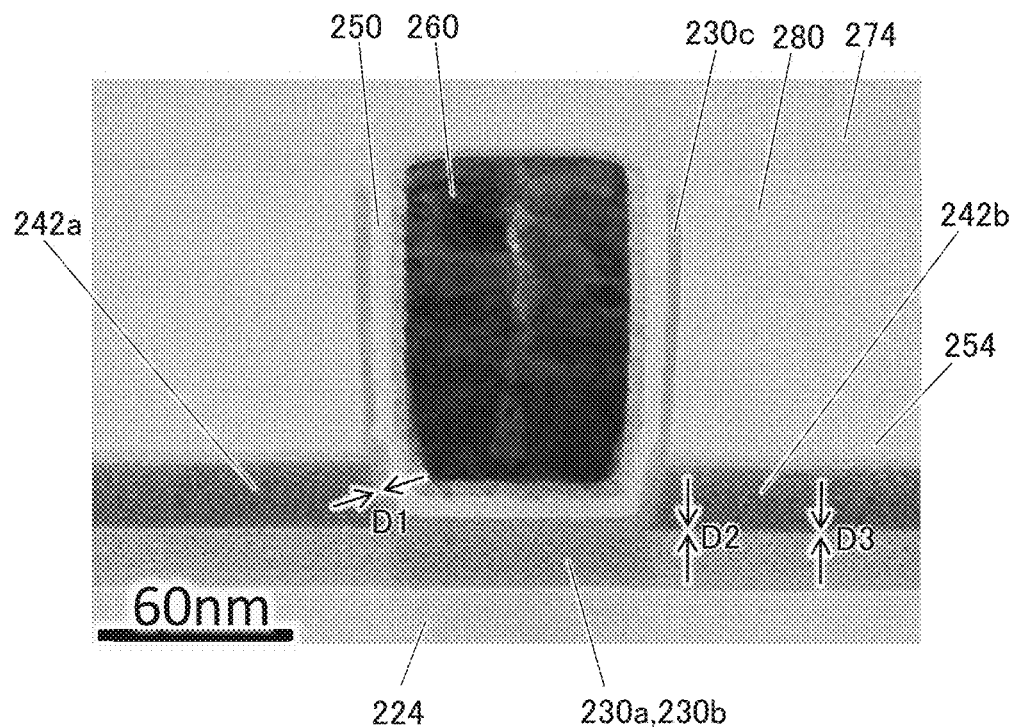
FIG. 31(A), (B) Cross-sectional STEM images in Example.
Figure 31B:
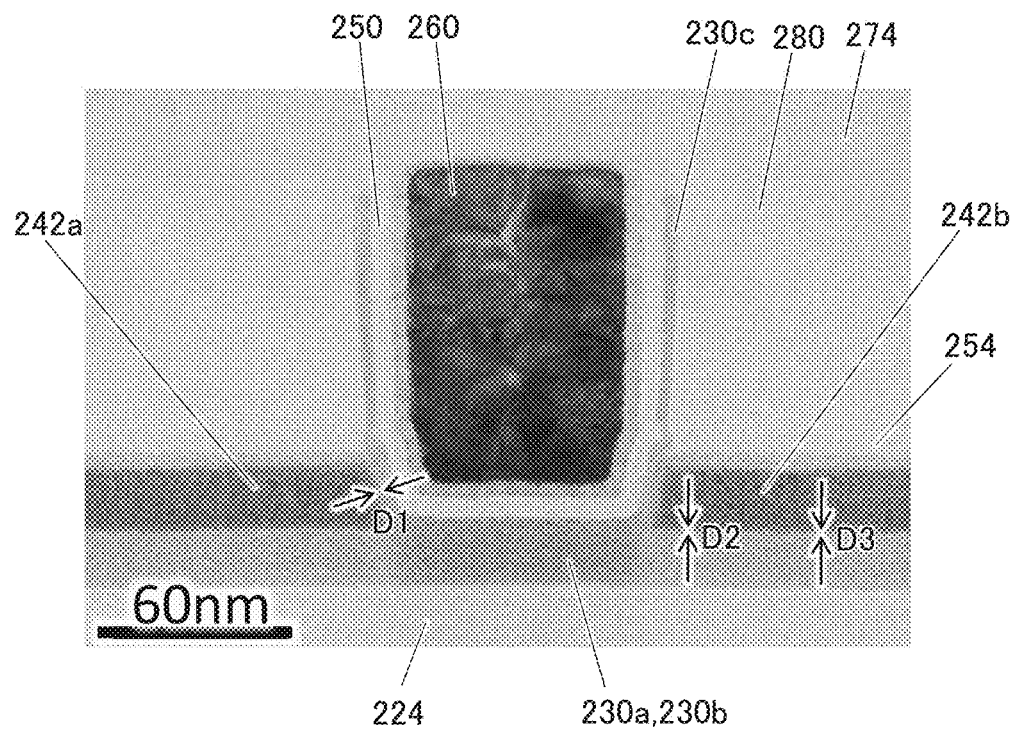
Figure 32A:
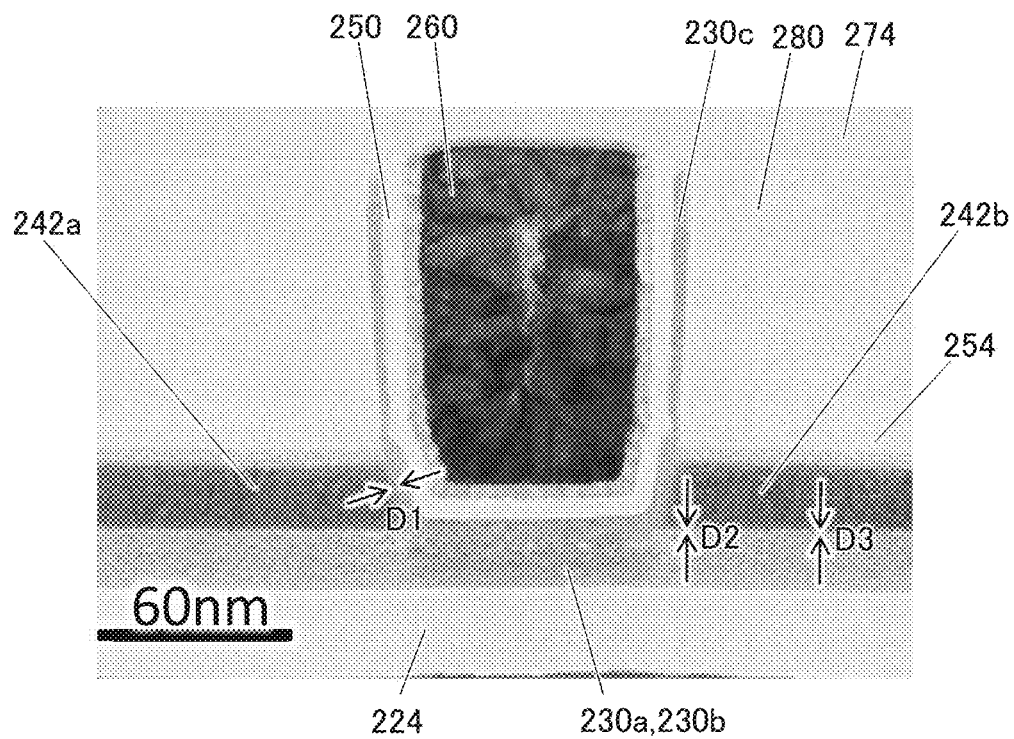
FIG. 32(A), (B) Cross-sectional STEM images in Example.
Figure 32B:
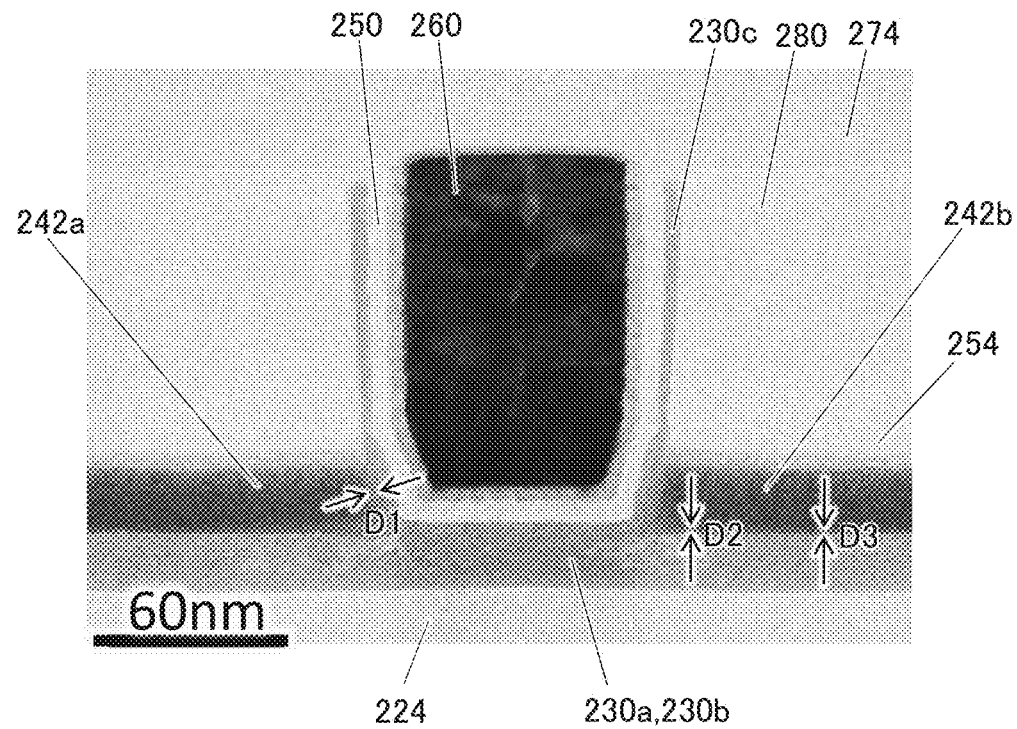
Figure 33A:
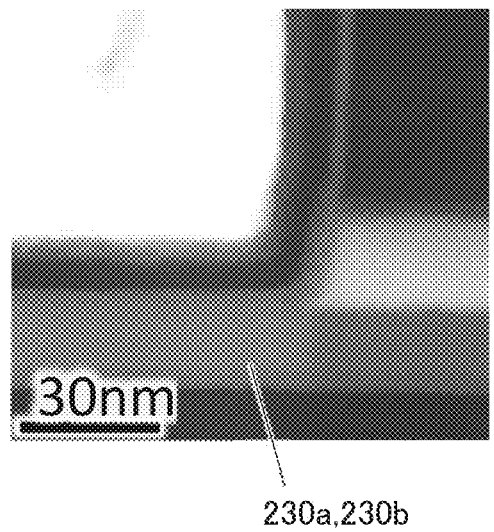
FIG. 33(A), (C) Cross-sectional STEM images in Example. (B), (D) EDX maps in Example.
Figure 33B:
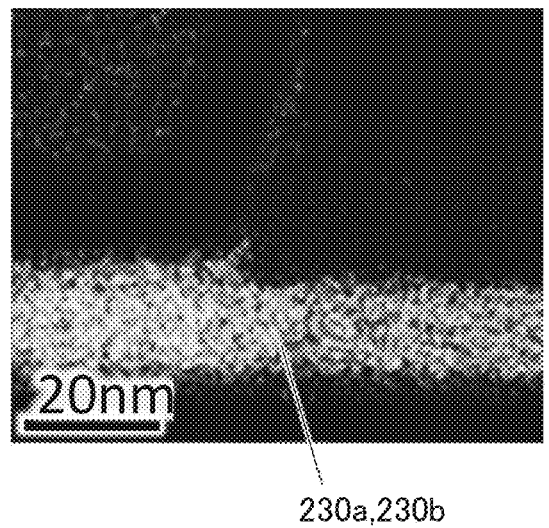
Figure 33C:
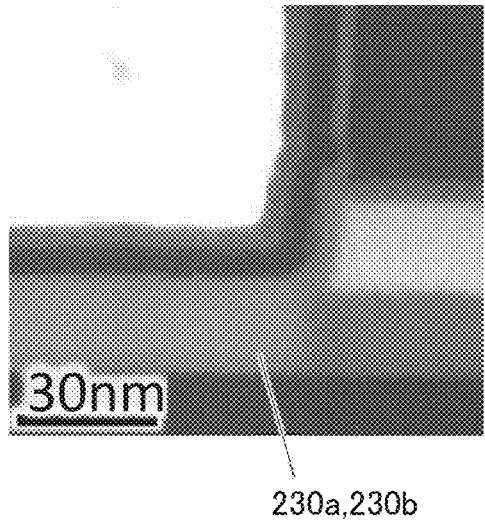
Figure 33D:
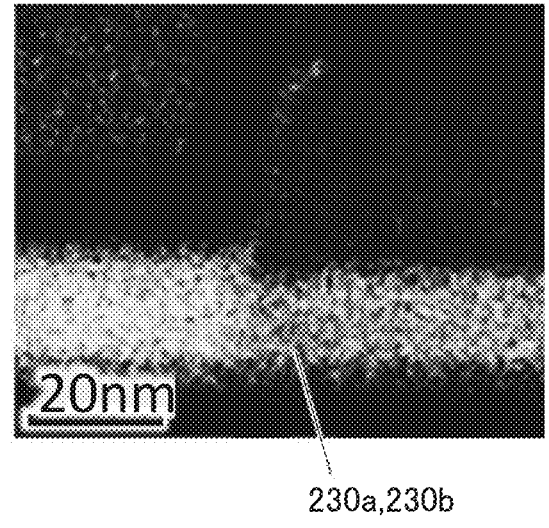
Figure 34A:
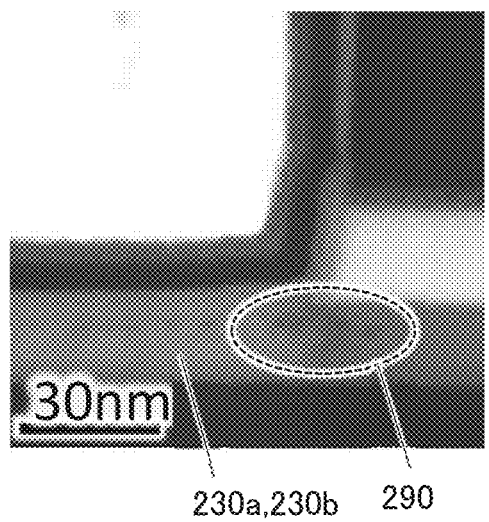
FIG. 34(A), (C) Cross-sectional STEM images in Example. (B), (D) EDX maps in Example.
Figure 34B:
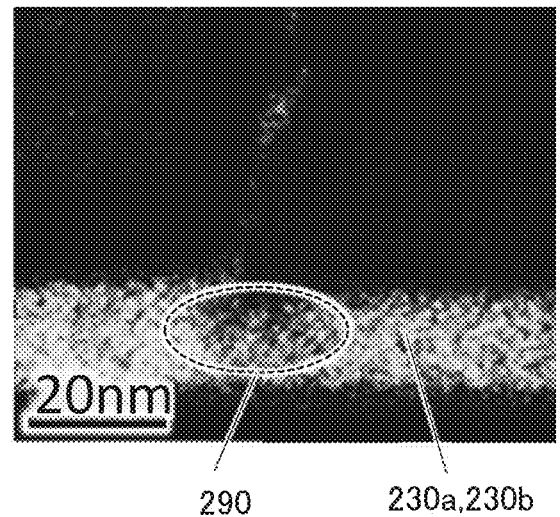
Figure 34C:
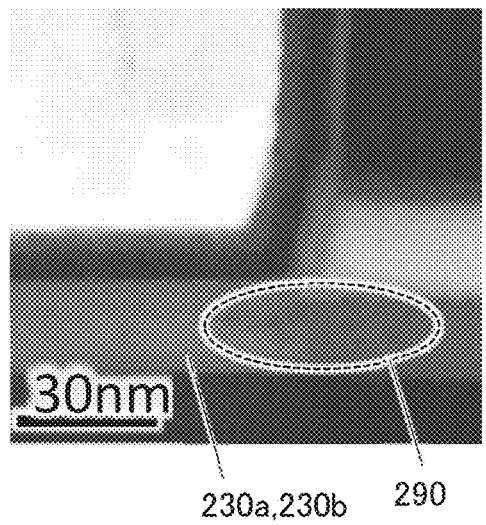
Figure 34D:
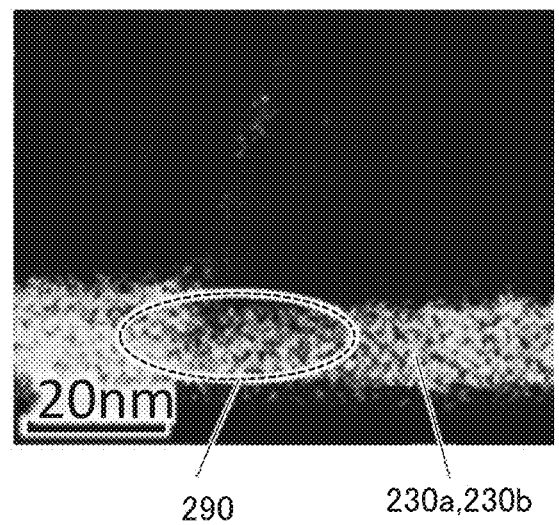
Figure 35A:
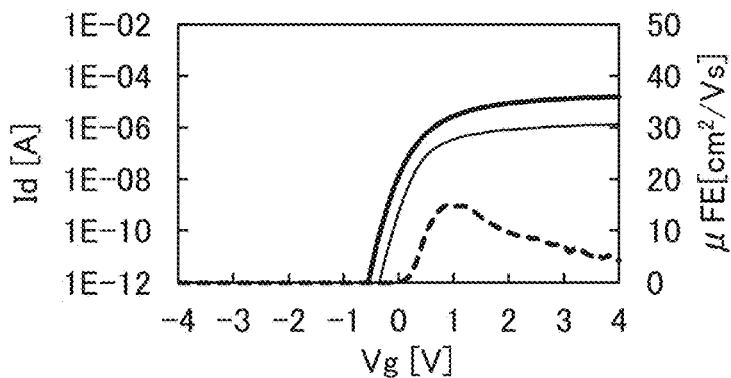
FIG. 35(A) to (D) Diagrams showing electrical characteristics in Example.
Figure 35B:
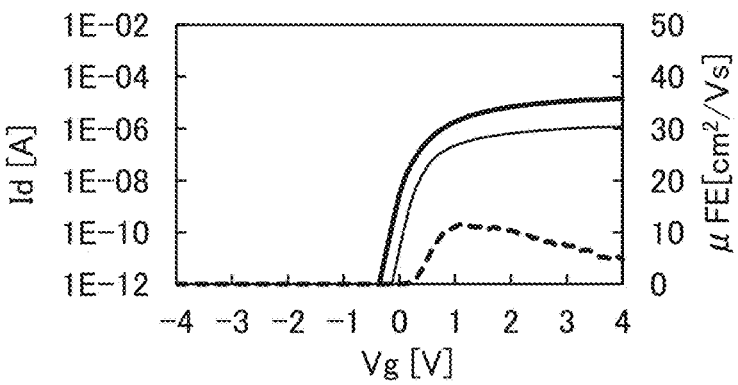
Figure 35C:
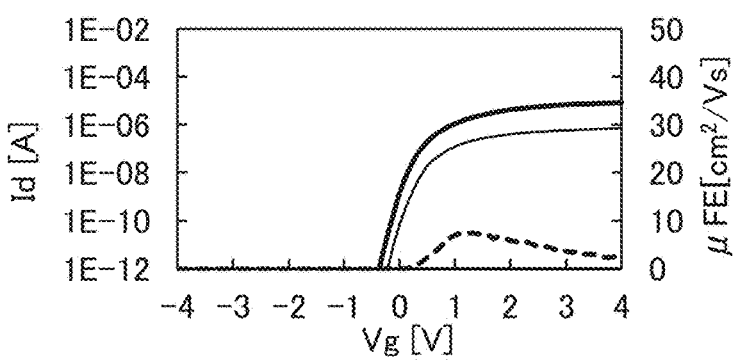
Figure 35D:
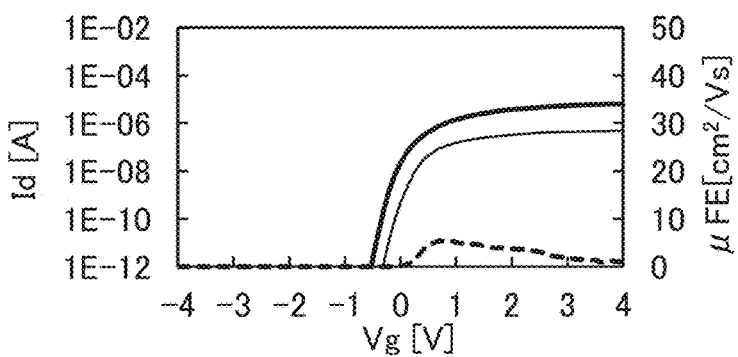

FIGS. 31(A) and 31(B) and FIGS. 32(A) and 32(B) show phase contrast images (TE images) in the channel length direction. FIGS. 33(A) and 33(C) and FIGS. 34(A) and 34(C) show Z contrast images (ZC images) in the channel length direction. FIGS. 33(B) and 33(D) and FIGS. 34(B) and 34(D) show mapping images along the In-L line in the EDX analysis that correspond to the ZC images. FIG. 31(A) and FIGS. 33(A) and 33(B) show the images of Sample 1F. FIG. 31(B) and FIGS. 33(C) and 33(D) show the images of Sample 2F. FIG. 32(A) and FIGS. 34(A) and 34(B) show the images of Sample 3F. FIG. 32(B) and FIGS. 34(C) and 34(D) show the images of Sample 4F.

As shown in FIGS. 31(A) and 31(B) and FIGS. 32(A) and 32(B), in each of Sample 1F to Sample 4F, an oxide film is formed on the side surface of the conductor 242a or the conductor 242b or at the interface between the oxide 230b and the conductor 242a or the conductor 242b. The thickness D1 to the thickness D3 of the oxide film in each of Sample 1F to Sample 4F illustrated in FIGS. 31(A) and 31(B) and FIGS. 32(A) and 32(B) were measured. Here, the thickness D1 is the thickness of the oxide film on the side surface of the conductor 242a on the channel side. The thickness D2 is the thickness of the oxide film at the interface between the conductor 242b and the oxide 230b at the point where the distance from the end portion of the conductor 242b is 10 nm. The thickness D3 is the thickness of the oxide film at the interface between the conductor 242b and the oxide 230b at the point where the distance from the end portion of the conductor 242b is 50 nm. Table 3 shows the measurement results of the thickness D1 to the thickness D3.

TABLE 3

| Sample | Thickness D1 | Thickness D2 | Thickness D3 | In vacancy in region 290 | Field-effect mobility |
|---|---|---|---|---|---|
| 1F | 1.9 nm | 2.0 nm | 1.6 nm | No | 15.0 cm²/Vs |
| 2F | 1.9 nm | 2.2 nm | 1.6 nm | No | 11.6 cm²/Vs |
| 3F | 2.5 nm | 2.6 nm | 2.0 nm | Yes | 7.5 cm²/Vs |
| 4F | 3.6 nm | 4.3 nm | 2.0 nm | Yes | 5.4 cm²/Vs |

Table 3 shows that as the temperature of the heat treatment performed on the samples after the channel etching is higher, the thickness D1 to the thickness D3 tend to become larger. In particular, this tendency is noticeable in the thickness D1 and the thickness D2 that are close to the channel formation region. By contrast, the thickness D1 and the thickness D2 of Sample 1F and Sample 2F are less than 2.5 nm. Moreover, the thickness D1 and the thickness D2 of Sample 1F are less than 2.1 nm.

As shown in FIGS. 33(A) and 33(C) and FIGS. 34(A) and 34(C), no noticeable anomaly is observed in Sample 1F and Sample 2F, whereas a region darker than the periphery is observed in a region 290 of the oxide 230b in the vicinity of the end portion of the conductor 242b in each of Sample 3F and Sample 4F. An atom having a larger atomic number is observed brighter in a Z contrast image. It is thus suggested that indium atoms having the largest atomic number among the atoms contained in the oxide 230b are deficient in the region 290 in each of Sample 3F and Sample 4F.

Furthermore, as shown in FIGS. 33(B) and 33(D) and FIGS. 34(B) and 34(D), no noticeable anomaly is observed in Sample 1F and Sample 2F, whereas the number of bright spots indicating indium atoms is reduced in the region 290 in each of Sample 3F and Sample 4F. It is thus presumed that the indium atoms are deficient in the region 290 in each of Sample 3F and Sample 4F subjected to the heat treatment at high temperatures after the channel etching.

Next, the Id-Vg characteristics (drain current-gate voltage characteristics) of Sample 1F to Sample 4F were measured using a semiconductor parameter analyzer manufactured by Keysight Technologies. The Id-Vg characteristics were measured under the conditions where the drain voltage (Vd) was 0.1 V or 1.2 V; the back gate voltage (Vbg) was 0 V; and the gate voltage was swept from −4.0 V to 4.0 V in increments of 0.1 V.

The measurement results of the Id-Vg characteristics of Sample 1F, Sample 2F, Sample 3F, and Sample 4F are shown in FIG. 35(A), FIG. 35(B), FIG. 35(C), and FIG. 35(D), respectively. In each graph, the horizontal axis represents gate voltage Vg [V], the first vertical axis represents drain current Id [A], and the second vertical axis represents field-effect mobility $\mu_{FE}$ [cm$^2$/Vs] at Vd of 1.2 V. The drain current at Vd of 0.1 V is shown by a thin solid line, the drain current at Vd of 1.2 V is shown by a thick solid line, and the field-effect mobility at Vd of 1.2 V is shown by a thick dotted line.

Table 3 shown above presents the field-effect mobility of Sample 1F to Sample 4F. As shown in Table 3, Sample 1F and Sample 2F, in each of which the thickness D1 to the thickness D3 are small and indium atoms in the region 290 are not deficient, have excellent electrical characteristics; the field-effect mobility is higher than or equal to 10 cm$^2$/Vs. As described here, the thickness D1 to the thickness D3 are preferably less than or equal to 2.5 nm, further preferably less than or equal to 2.1 nm. It is preferable that a region where indium atoms are deficient not be formed in the region 290. With such a structure, unnecessary electric resistance is not formed between the source electrode and the drain electrode; thus, the on-state current and field-effect mobility of the transistor 200 can be made favorable.

At least part of the structure, the method, and the like described in this example can be implemented in appropriate combination with other embodiments and examples described in this specification.

REFERENCE NUMERALS

10: insulator, 10*a*: insulator, 10*b*: insulator, 20: insulator, 20*a*: insulator, 20*b*: insulator, 30: oxide, 40: conductor, 42: conductor, 100: capacitor, 110: conductor, 112: conductor, 120: conductor, 130: insulator, 140: insulator, 150: insulator, 200: transistor, 200A: transistor, 205: conductor, 210: insulator, 212: insulator, 214: insulator, 216: insulator, 218: conductor, 222: insulator, 224: insulator, 230: oxide, 230*a*: oxide, 230A: oxide film, 230*b*: oxide, 230B: oxide film, 230*c*: oxide, 230*c*1: oxide, 230*c*2: oxide, 230C: oxide film, 240: conductor, 240*a*: conductor, 240*b*: conductor, 241: insulator, 241*a*: insulator, 241*b*: insulator, 242: conductor, 242*a*: conductor, 242A: conductive film, 242*b*: conductor, 242B: conductive layer, 250: insulator, 250A: insulating film, 254: insulator, 254A: insulating film, 260: conductor, 260*a*: conductor, 260A: conductive film, 260*b*: conductor, 260B: conductive film, 274: insulator, 280: insulator, 280*a*: insulator, 280*b*: insulator, 281: insulator, 290: region, 300: transistor, 311: substrate, 313: semiconductor region, 314*a*: low-resistance region, 314*b*: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 400: transistor, 405: conductor, 430*c*: oxide, 431*a*: oxide, 431*b*: oxide, 432*a*: oxide, 432*b*: oxide, 440: conductor, 440*a*: conductor, 440*b*: conductor, 442: conductor, 442*a*: conductor, 442*b*: conductor, 450: insulator, 460: conductor, 460*a*: conductor, 460*b*: conductor, 1001: wiring, 1002: wiring, 1003: wiring, 1004: wiring, 1005: wiring, 1006: wiring, 1007: wiring, 1008: wiring, 1009: wiring, 1010: wiring, 1100: USB memory, 1101: housing, 1102: cap, 1103: USB connector, 1104: substrate, 1105: memory chip, 1106: controller chip, 1110: SD card, 1111: housing, 1112: connector, 1113: substrate, 1114: memory chip, 1115: controller chip, 1150: SSD, 1151: housing, 1152: connector, 1153: substrate, 1154: memory chip, 1155: memory chip, 1156: controller chip, 1200: chip, 1201: PCB, 1202: bump, 1203: motherboard, 1204: GPU module, 1211: CPU, 1212: GPU, 1213: analog arithmetic unit, 1214: memory controller, 1215: interface, 1216: network circuit, 1221: DRAM, 1222: flash memory, 1400: memory device, 1411: peripheral circuit, 1420: row circuit, 1430: column circuit, 1440: output circuit, 1460: control logic circuit, 1470: memory cell array, 1471: memory cell, 1472: memory cell, 1473: memory cell, 1474: memory cell, 1475: memory cell, 1476: memory cell, 1477: memory cell, 1478: memory cell, 5100: information terminal, 5101: housing, 5102: display portion, 5200: notebook information terminal, 5201: main body, 5202: display portion, 5203: keyboard, 5300: portable game machine, 5301: housing, 5302: housing, 5303: housing, 5304: display portion, 5305: connection portion, 5306: operation key, 5400: stationary game machine, 5402: controller, 5500: supercomputer, 5501: rack, 5502: computer, 5504: substrate, 5701: display panel, 5702: display panel, 5703: display panel, 5704: display panel, 5800: electric refrigerator-freezer, 5801: housing, 5802: refrigerator door, 5803: freezer door

The invention claimed is:

1. A semiconductor device comprising:
   a first insulator;
   a second insulator;
   a third insulator between the first insulator and the second insulator; and
   a transistor comprising a gate electrode,
   wherein the transistor comprises an oxide in a channel formation region,
   wherein the oxide is surrounded by the first insulator,
   wherein the first insulator is surrounded by the second insulator,
   wherein a hydrogen concentration in the first insulator is lower than a hydrogen concentration in the second insulator, and
   wherein the third insulator is in contact with a top surface of the gate electrode.

2. The semiconductor device according to claim 1,
   wherein the hydrogen concentration in the first insulator is lower than $1.0 \times 10^{20}$ atoms/cm$^3$, and
   wherein the hydrogen concentration in the second insulator is lower than $5.0 \times 10^{20}$ atoms/cm$^3$.

3. The semiconductor device according to claim 1,
   wherein a nitrogen concentration in the first insulator is lower than a nitrogen concentration in the second insulator.

4. The semiconductor device according to claim 1,
   wherein the amount of oxygen that is released from the first insulator by heating and is converted into oxygen molecules is greater than or equal to $2.0 \times 10^{14}$ molecules/cm$^2$.

5. The semiconductor device according to claim 1,
   wherein the first insulator comprises oxygen and silicon, and
   wherein the second insulator comprises nitrogen and silicon.

6. The semiconductor device according to claim 1,
wherein the oxide comprises indium, an element M (M is aluminum, gallium, yttrium, or tin), and zinc.

7. The semiconductor device according to claim 1,
wherein the gate electrode is not covered with the first insulator in a channel width direction.

8. A semiconductor device comprising a first insulator to a fourth insulator and a transistor,
wherein the first insulator and the transistor are over the second insulator,
wherein the transistor comprises:
  a fifth insulator;
  a sixth insulator over the fifth insulator;
  a first oxide over the sixth insulator;
  a second oxide over the first oxide;
  a first conductor and a second conductor over the second oxide;
  a seventh insulator over the second oxide; and
  a third conductor over the seventh insulator, the third conductor overlapping with the second oxide,
wherein the third insulator is over the first insulator, the first conductor, and the second conductor,
wherein the fourth insulator is in contact with top surfaces of the third insulator, the seventh insulator, and the third conductor,
wherein a hydrogen concentration in the third insulator is lower than $1.0 \times 10^{20}$ atoms/cm$^3$, and
wherein the third insulator comprises oxygen and silicon.

9. The semiconductor device according to claim 8,
wherein a composition of the first insulator is substantially the same as a composition of the third insulator, and
wherein a composition of the second insulator is substantially the same as a composition of the fourth insulator.

10. The semiconductor device according to claim 8,
wherein the fourth insulator comprises oxygen and aluminum.

11. The semiconductor device according to claim 8,
wherein the fourth insulator comprises nitrogen and silicon.

12. The semiconductor device according to claim 8,
wherein the fourth insulator has a stacked-layer structure,
wherein a first layer of the fourth insulator that is in contact with a top surface of the third insulator comprises oxygen and aluminum, and
wherein a second layer over the first layer comprises nitrogen and silicon.

13. The semiconductor device according to claim 8,
wherein the second insulator comprises nitrogen and silicon.

14. The semiconductor device according to claim 8,
wherein the second oxide comprises indium, an element M (M is aluminum, gallium, yttrium, or tin), and zinc.

15. The semiconductor device according to claim 8,
wherein a composition of the sixth insulator is substantially the same as a composition of the third insulator.

16. The semiconductor device according to claim 8,
wherein the amount of oxygen that is released from the third insulator by heating and is converted into oxygen molecules is greater than or equal to $2.0 \times 10^{14}$ molecules/cm$^2$.

17. The semiconductor device according to claim 8, further comprising a third oxide over the second oxide,
wherein the fourth insulator is in contact with a top surface of the third oxide.

* * * * *